US009256485B1

(12) United States Patent
Moore et al.

(10) Patent No.: US 9,256,485 B1
(45) Date of Patent: Feb. 9, 2016

(54) SYSTEM AND METHOD FOR GENERATING MESSAGE SEQUENCE DIAGRAMS FROM GRAPHICAL PROGRAMS

(71) Applicant: The MathWorks, Inc., Natick, MA (US)

(72) Inventors: Alan J. Moore, Devon (GB); Ebrahim Mehran Mestchian, Newton, MA (US); Pieter J. Mosterman, Framingham, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 14/150,282

(22) Filed: Jan. 8, 2014

Related U.S. Application Data

(63) Continuation-in-part of application No. 13/117,859, filed on May 27, 2011.

(60) Provisional application No. 61/349,401, filed on May 28, 2010, provisional application No. 61/830,839, filed on Jun. 4, 2013.

(51) Int. Cl.
*G06F 9/54* (2006.01)
*G06F 17/50* (2006.01)
*G01R 31/3183* (2006.01)

(52) U.S. Cl.
CPC ............ *G06F 9/546* (2013.01); *G06F 17/5031* (2013.01); *G01R 31/318357* (2013.01); *G06F 17/5009* (2013.01)

(58) Field of Classification Search
CPC . G06F 9/546; G06F 17/5031; G06F 17/5009; G01R 31/318357
See application file for complete search history.

(56) References Cited

U.S. PATENT DOCUMENTS

| 5,317,746 | A | 5/1994 | Watanabe |
|---|---|---|---|
| 6,519,639 | B1 | 2/2003 | Glasser et al. |
| 7,313,449 | B1 | 12/2007 | Ciolfi et al. |
| 7,941,299 | B1 | 5/2011 | Aldrich et al. |
| 8,689,236 | B2 | 4/2014 | Simsek et al. |
| 2002/0013889 | A1 | 1/2002 | Schuster et al. |

(Continued)

FOREIGN PATENT DOCUMENTS

GB             0521624.4           5/2007

OTHER PUBLICATIONS

Bagrodia, Rajive I., et al., "A Message-Based Approach to Discrete-Event Simulation," IEEE, IEEE Transactions on Software Engineering, vol. SE-13, No. 6, Jun. 1987, pp. 654-665.

(Continued)

*Primary Examiner* — H S Sough
*Assistant Examiner* — Syed Roni
(74) *Attorney, Agent, or Firm* — Cesari and McKenna LLP; Michael R. Reinemann

(57) ABSTRACT

A system and method automatically generating one or more message sequence diagrams based on an analysis of the execution behavior of a model, such as a computer-generated, executable graphical model. A model analyzer examines execution instructions generated for the model. A filtering unit identifies execution instructions that concern designated elements of the model. An auto diagram builder generates one or more message sequence diagrams. The diagrams may include display features that represent activities involving the designated model elements. The diagrams may show the relative execution time order of the activities.

30 Claims, 20 Drawing Sheets

(56) References Cited

U.S. PATENT DOCUMENTS

| | | | |
|---|---|---|---|
| 2004/0230979 | A1 | 11/2004 | Beecroft et al. |
| 2005/0216248 | A1* | 9/2005 | Ciolfi et al. ............ 703/22 |
| 2007/0288885 | A1 | 12/2007 | Brunel et al. |
| 2008/0098349 | A1 | 4/2008 | Lin et al. |
| 2009/0044171 | A1 | 2/2009 | Avadhanula |
| 2009/0132936 | A1 | 5/2009 | Anderson et al. |
| 2009/0164558 | A1 | 6/2009 | Hofmann |
| 2009/0177779 | A1 | 7/2009 | DeVal et al. |
| 2009/0204949 | A1* | 8/2009 | Howland et al. ............ 717/128 |
| 2009/0292518 | A1* | 11/2009 | Shachar et al. ............ 703/13 |
| 2010/0049821 | A1 | 2/2010 | Oved |
| 2010/0070753 | A1 | 3/2010 | Kido et al. |
| 2011/0296436 | A1 | 12/2011 | Moore et al. |

OTHER PUBLICATIONS

Bringmann, Eckard, Automated Model-Based Testing of Control Software with TPT, 2008, pp. 1-19.

Bringmann, Eckard, "Model-Based Testing of Automotive Systems," International Conference on Software Testing, Verification and Validation (ICST), 2008, pp. 1-9.

Cleaveland, Rance, et al., "AN Instrumentation-Based Approach to Controller Model Validation," Model-Driven Development of Reliable Automotive Services. Second Automotive Software Workshop, ASWSD 2006, Revised Selected Papers Springer-Verlag Berlin, 2008, pp. 1-14.

Heverhagen, Torsten, et al., "A Profile for Integrating Function Blocks into the Unifiled Modeling Language," http://www-verimag.imag.fr/EVENTS/2003/SVERTS/PAPERS-WEB/08-Heverhagen-FunctionBlockAdapters.pdf, Oct. 20, 2003, pp. 1-19.

Hoffmann, Ph.D., Hans-Peter, "SysML-Based Systems Engineering Using a Model-Driven Development Approach," Telelogic, an IBM Company, Version 1, Jul. 2008, pp. 1-16.

Hooman, Jozef, et al., "Coupling Simulink and UML Models," http://www.mbsd.cs.ru.nl/publications/papers/hooman/FORMSO4.pdf, 2004, pp. 1-8.

Krahl, David, et al., "A Message-Based Discrete Event Simulation Architecture," IEEE, Proceedings of the 1997 Winter Simulation Conference, Winter 1997, pp. 1361-1367.

Krahl, David, "Extendsim 7," IEEE, Proceedings of the 2008 Winter Simulation Conference, Winter 2008, pp. 215-221.

McQuillan, John M., et al., "Some Considerations for a High Performance Message-Based Interprocess Communication System," Bolt Beranek and Newman, Inc., Jul. 1975, pp. 77-86.

"Notification of Transmittal of the International Search Report and the Written Opinion of the International Searching Authority, or the Declaration," International Filing Date: May 27, 2011, International Application No. PCT/US2011/000964, Applicant: The MathWorks, Inc., Date of Mailing: Aug. 25, 2011, pp. 1-12.

Notification of Transmittal of the International Search Report and the Written Opinion of the International Searching Authority, or the Declaration, International Filing Date: May 27, 2011, International Application No. PCT/US2011/000967, Applicant: The MathWorks, Inc., Date of Mailing: Aug. 26, 2011, pp. 1-12.

"Real-Time Workshop: For Use with Simulink-Getting Started," Version 6, The MathWorks, Inc., Jun. 2004, pp. i-iv, 1-1 to 1-20 and 2-1 to 2-30.

"Simulink, Model-based and System-based Design", The MathWorks, 2004, pp. 1-488.

"Simulink® Verification and Validation 2: User's Guide," The MathWorks, Inc., Sep. 2007, pp. i-xii, 1-1 to 1-6, 2-1 to 2-58, 3-1 to 3-32, 4-1 to 4-28, 5-1 to 5-66, 6-1 to 6-30, 7-1 to 7-4, 8-1 to 8-56, 9-1 to 9-4, 10-1 to 10-42, A-1 to A-4, and Index-1 to Index-4.

Traub, Matthias, et al., "Generating Hardware Descriptions from Automotive Function Models for an FPGA-Based Body Controller: A Case Study," http://www.mathworks.com/automotive/macde2008/proceedings/day2/04_daimler_generting_hw_descriptions_with_hdl_coder_papers.pdf, 2008, pp. 1-8.

U.S. Appl. No. 13/117,859, filed May 27, 2011 by Alan J. Moore et al. For a Message-Based Model Verification, pp. 1-62.

"Public Health Information Network Messaging System (PHINMS),"Technical Guide Version 2.8.01, U.S. Department of Health & Human Services, Feb. 2, 2009, pp. 1-50.

"Simulink® 7: User's Guide," The MathWorks, Inc., Sep. 2009, pp. i-xlvi, 1-1 to 1-46, 2-1 to 2-44, 3-1 to 3-34, 4-1 to 4-138, 5-1 to 5-30, 6-1 to 6-84, 7-1 to 7-60, 8-1 to 8-26, 9-1 to 9-60, 10-1 to 10-88, 11-1 to 11-30, 12-1 to 12-66, 13-1 to 13-58, 14-1 to 14-28, 15-1 to 15-36, 16-1 to 16-28, 17-1 to 17-46, 18-1 to 18-16, 19-1 to 19-68, 20-1 to 20-32, 21-1 to 21-32, 22-1 to 22-16, 23-1 to 23-10, 24-1 to 24-24, 25-1 to 25-12, 26-1 to 26-42, 27-1 to 27-36, 28-1 to 28-26, 29-1 to 29-46, 30-1 to 30-160, 31-1 to 31-32, Glossary-1 to Glossary-2, A-1 to A-4, Index-1 to Index-22.

"Creating and Managing Timing Diagrams", IBM, retrieved from www.ibm.com on Mar. 29, 2013, 5 pages.

"Creating Communication Diagrams", IBM, retrieved from www.ibm.com on Mar. 29. 2013, 12 pages.

"Creating Sequence Diagrams", IBM, retrieved from www.ibm.com on Mar. 29. 2013, 24 pages.

"UML Sequence Diagrams", uml-diagrams.org, retrieved from http://www.uml-diagrams.org/sequence-diagrams.html on Mar. 29, 2013, 18 pages.

U.S. Appl. No. 13/117,531, filed May 27, 2011 by Hidayet Tunc Simsek et al. for Message-Based Modeling, pp. 1-62.

U.S. Appl. No. 14/163,147, filed Jan. 24, 2014 by Hidayet T. Simsek et al. for Message-Based Modeling, pp. 1-64.

Ciancarini, Paolo, "Exercises on Basic UML Behaviors," Nov. 2013, pp. 1-38.

Dumond, Yves, et al., "Relationship Between Sequence and Statechart Diagrams," 2000, pp. 1-6.

Gronmo, Roy, et al., "From UML 2 Sequence Diagrams to State Machines by Graph Transformation," Journal of Object Technology, AITO-Association Internationale pour les Technologies Objets, JOT, vol. 10, Jun. 2011, pp. 1-22.

Harel, David, et al., "Synthesis Revisited: Generating Statechart Models from Scenario-Based Requirements," Formal Methods in Software and Systems Modeling, LNCS, vol. 3393, Springer-Verlag Berlin, Heidelberg, Jan. 13, 2005, pp. 1-18.

Latronico, Beth, et al., "Representing Embedded System Sequence Diagrams as a Formal Language," Electrical & Computer Engineering, Carnegie Mellon University, UML, Oct. 2001, pp. 1-23.

Whittle, Jon, et al., "Generating Statechart Designs From Scenarios," Jun. 2000, pp. 1-10.

\* cited by examiner

SYSTEM AND METHOD FOR GENERATING MESSAGE SEQUENCE DIAGRAMS FROM GRAPHICAL PROGRAMS

CROSS-REFERENCE TO RELATED APPLICATIONS

This application claims the benefit of U.S. Provisional Application Ser. No. 61/830,839, filed Jun. 4, 2013, which application is hereby incorporated by reference in its entirety. This application is a continuation-in-part of commonly assigned copending U.S. patent application Ser. No. 13/117,859, which was filed on May 27, 2011, by Alan J. Moore and E. Mehran Mestchian for Message-Based Model Verification, which claims the benefit of U.S. Provisional Application Ser. No. 61/349,401, filed May 28, 2010, which applications are hereby incorporated by reference in their entireties.

BRIEF DESCRIPTION OF THE DRAWINGS

The description below refers to the accompanying drawings, of which.

DETAILED DESCRIPTION OF ILLUSTRATIVE EMBODIMENTS

Background

Figure 1:
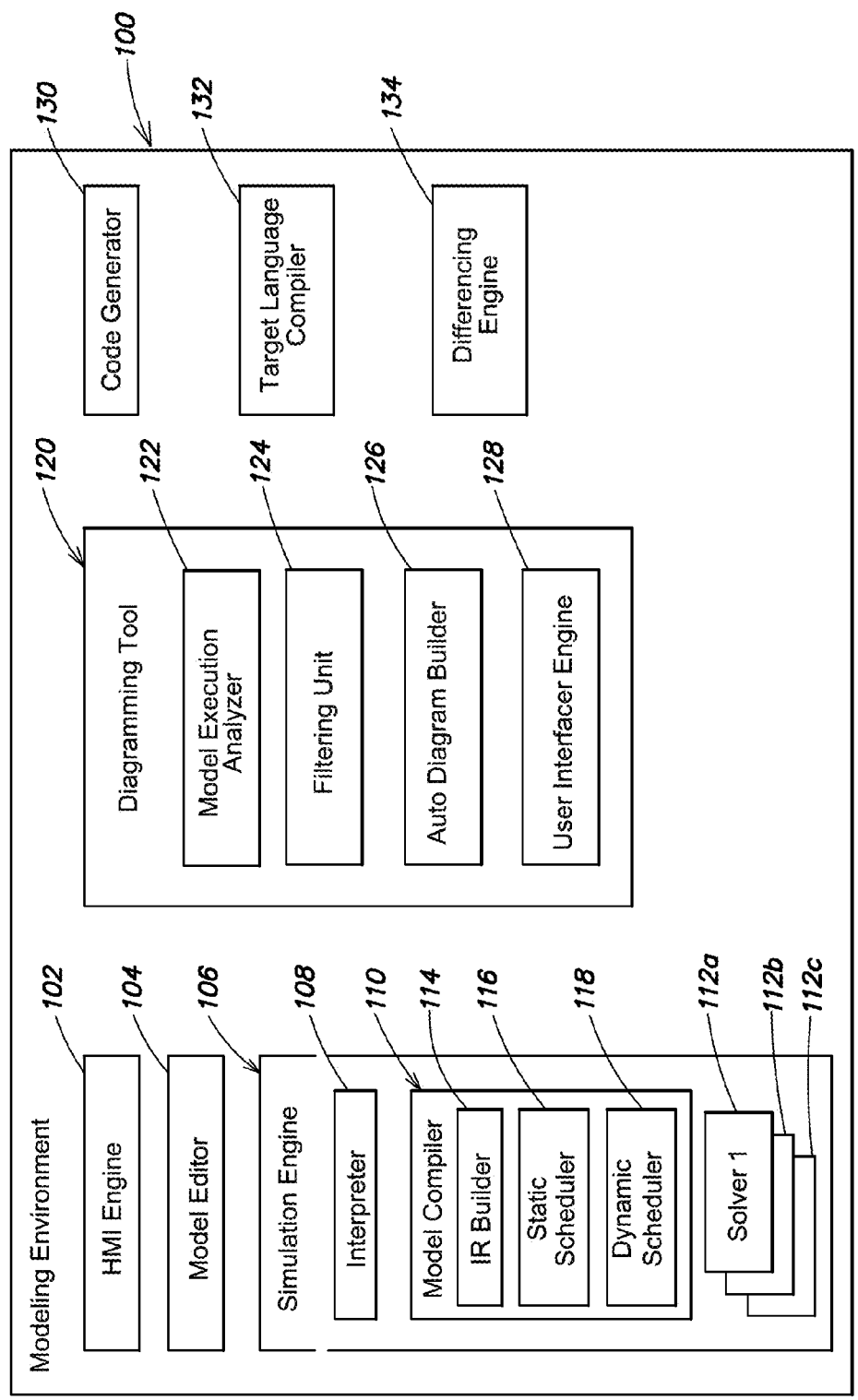
FIG. 1 is a partial, functional block diagram of a modeling environment in accordance with an embodiment of the invention.

The Unified Modeling Language (UML) is a standard visual modeling language used to specify and/or document new or existing business processes or software systems. The UML standard defines many different types of diagrams including Class Diagrams, Object Diagrams, State Machine Diagrams, and Interaction Diagrams. Examples of Interaction Diagrams include Sequence Diagrams, Communication Diagrams, and Timing Diagrams, which provide different views of the interaction among objects or entities of a process or system. A Sequence Diagram typically illustrates message interchange between objects or entities of a business process or software system. A Timing Diagram typically illustrates the timing or duration of messages or conditions in the system or process. A developer or other user may create UML diagrams using a variety of existing software tools, such as the Systems Modeling Language (SysML) from the Object Management Group (OMG) and IBM Rational Rose from IBM, among others.

Tools, such as modeling environments, also exist for creating computer-generated models, such as graphical behavioral models, that represent dynamic systems. A model may include a plurality of graphical objects, such as blocks or icons. A model may be executed to simulate the operation or behavior of the system being modeled. For example, the model may be executed by evaluating the model at a plurality of simulation (or execution) time steps beginning at a start time and ending at a stop time. In a single-rate model, all of the objects execute during each time step, except for objects configured for conditional execution where the condition is not met. In a multi-rate model, objects execute at different rates relative to each other and thus in a given time step only a portion of the blocks may execute. Some of the graphical objects of the model may generate and/or process signals. A signal may refer to a time varying quantity having one or more values typically at all points in time during model execution. Other objects of the model may generate and/or process messages that may have payloads that include one or more values. Payloads may be fixed and may persist for a determined time interval during a simulation time. A message may be generated at a particular point in time during model execution, e.g., by a source message-based block, and may only exist for a limited time interval, during which the message may be read by another message-based block, such as an intermediary block or a sink block.

To execute a model, a scheduling order may be created that specifies an order of execution of at least some of the objects or components that make up a model. In addition, one or more execution tasks may be implemented or defined, and the objects of the model may be assigned to the one or more tasks for execution. Priorities may be assigned to the tasks, and a higher priority task may preempt and/or block execution of a lower priority task.

Overview

The present invention relates to systems and methods for automatically generating one or more message sequence diagrams based on an analysis of the execution instructions generated for a model, such as a computer-generated, executable graphical model. In an embodiment, a system may include a modeling environment having a human machine interface (HMI) engine, a model editor and a simulation engine. The simulation engine may include one or more schedulers, such as a static scheduler, which may apply a scheduling algorithm, such as the Rate Monotonic Scheduling (RMS) algorithm, and a dynamic scheduler that may use an event calendar to establish a schedule. The simulation engine also may include one or more solvers. The modeling environment may support the creation of a model having dynamic, i.e., time-based, objects and message-based objects, among other objects. The modeling environment also may include or be in communication with a diagramming tool. The diagramming tool may include a plurality of components. Specifically, the diagramming tool may include a model analyzer, a filtering unit, an auto diagram builder, and a user interface (UI) engine.

The model analyzer may be configured to examine execution instructions generated for a model created in the modeling environment, and determine when particular execution activities, such as the occurrence of events, the execution of blocks, the generation and consumption of messages, the changes in signal values, occur during execution of the model. The auto diagram builder may be configured to receive information concerning the model's execution behavior, and to automatically generate one or more message sequence diagrams for the model. The filtering unit may receive inputs, such as user inputs, specifying selected model elements, such as objects, signals, messages, queues, communication elements, etc., to be included in the message sequence diagrams. For example, a user may designate one or more signals, message-based blocks and messages to be included in the message sequence diagram generated by the auto diagram builder. The diagramming tool may be configured to provide the message sequence diagram to an output device, such as a display or a printer. A user may review the message sequence diagram to observe and thus better understand the execution behavior of the model.

The message sequence diagram may be dynamically generated and updated during execution of the model. Alternatively, information needed to generate the message sequence diagram may be logged or otherwise saved during model execution, and the message sequence diagram may be generated following model execution, for example in a post-mortem analysis.

Message Sequence Diagramming

A first message sequence diagram created by the auto diagram builder may include a plurality of visual elements including lifelines and message arrows. The lifelines, which may be vertically oriented on the first message sequence diagram, may represent selected message-based objects of the model, such as message source and/or message sink objects. The arrows, which may extend between the lifelines, may represent selected messages, such as synchronous and asynchronous messages, that are sent and received by the objects illustrated by the lifelines. As the model executes, the first message sequence diagram may scroll, e.g., upward, and the temporal relationship among events or other interactions or activities may be shown on a dynamic, e.g., scrolling, diagram.

The auto diagram builder may include execution timing information on the message sequence diagram. For example, the auto diagram builder may include a plurality of epoch elements in the diagram where each epoch element represents an execution time increment or instant defined during execution of the model. For example, a model may execute over a simulation time that starts at a simulation start time and ends at a simulation end time. States and outputs defined by model objects and other values may be computed at successive points in time between the start and end times. These points in time may be referred to as simulation steps or time steps, and their size may be fixed or variable as determined by a particular solver used by the simulation engine. In an embodiment, the epochs may correspond to the simulation steps determined by the simulation engine. In another embodiment, epochs may correspond to time periods specified by a user, and may be hierarchically organized, e.g., into major and minor epochs, and the periods and organization of epochs may be changed during execution of visualization. In a state-based modeling environment, such as the Stateflow system, when a state diagram executes, it may respond to an event that may occur in its context. An event may be a sample time hit. In response to this event, one or more transitions may be possible. In a normal step, which may also be referred to as a micro step, only one such transition may be executed. In a superstep, which may also be referred to as a macro step, multiple such transitions may be executed. A superstep may complete when the state diagram, which may be referred to as a state chart, reaches a new stable configuration, e.g., no more transitions from active states exist. Also, during execution of a state chart, new events may be generated locally instead of in the state chart context. The corresponding chart activity may take place in a local step. In an embodiment, epochs may correspond to one or more of these various steps, e.g., micro step, superstep, and local step. The type of step to which an epoch corresponds may be user-specified. Additionally, or alternatively, the multiple types of epochs may be indicated, e.g., explicitly, in a message sequence diagram. The epoch elements may be illustrated by horizontally arranged bands or regions overlaid on the first message sequence diagram. The first message sequence diagram may thus illustrate the particular time instants in which selected messages are sent and received by selected message-based objects of the model.

A second message sequence diagram created by the auto diagram builder may include one or more of the visual elements of the first message sequence diagram. In addition, the second message sequence diagram may include one or more signal trace elements. A signal trace element may include a trace representing the value of a selected signal of the model. The trace may illustrate how the signal's value changes during execution of the model. The signal trace element, like the lifelines, may be vertically oriented within the second message sequence diagram, and may extend across the horizontally arranged bands representing the epoch elements. In another embodiment, a signal trace canvas may be provided alongside a message canvas, and the signal trace canvas may be configured to show data events of several signals in one 'lifeline'. The second message sequence diagram may thus provide the user with a visual indication of the value of the selected signal at the time particular messages are exchanged by the message-based blocks.

Several different modes may be used to display the value of the signal in the signal trace element. In a first mode, to the extent an object represented in the message sequence diagram observes the value of the signal, the value of the signal, as presented in the signal trace element, may be discretized at each epoch element. That is, the actual change in value of the signal may be represented in the diagram in temporal relationship with other events, e.g., the change in value may be ordered relative to other events, such as message send and receive activities. For each epoch element, the value presented for the signal may be the observed value. In a second mode, the signal value may not be discretized at each epoch element, and the signal's actual value may be presented by the signal trace element. In an embodiment, separate signal trace elements for both modes may be included in the message sequence diagram. The mode may be determined by a user-settable option.

A third message sequence diagram created by the auto diagram builder may include one or more of the visual elements of the first or second message sequence diagrams. In addition, the third message sequence diagram may include one or more repeating pattern elements. In particular, the model analyzer may be configured to identify a series of sequential epochs during which the message-based objects represented by the lifelines exchange similar messages. Rather than include multiple epoch elements illustrating similar message exchanges repeatedly, the diagramming engine may replace these epoch elements with a repeating pattern element. The repeating pattern element may illustrate, in just a single element, the message exchange that repeatedly occurs during a series of epochs. The repeating pattern element also may include an indication of the particular epochs covered by the repeating pattern element. By reviewing the third message sequence diagram, a user may identify unexpected behavior in the model. For example, the third message sequence diagram may show one or more messages outside of a repeating pattern when the designer expected all of the messages to fall within a repeating pattern.

The simulation engine may implement or define a single task or multiple tasks or processes for executing various portions of the model. A task may be scheduled, and a task may have an execution list that includes a set of blocks. The model compiler may assign priorities to the tasks, and may assign graphical objects or other model elements, such as blocks, to a particular task for execution. For example, an object associated with a higher sample rate than another object or task may be assigned to a task having a higher priority than another task to which objects having a lower sample rate are assigned. A higher priority task may preempt execution of a lower priority task. In addition, the simulation engine may implement a blocking (or non-blocking) execution paradigm. Blocking refers to the process of placing a task on hold because the task is waiting for something, e.g., input data, a resource, a reply to a function call, etc. The assignment of priorities and the use of blocking or non-blocking schemes may depend on the scheduling algorithm being used by the simulation engine. Other scheduling algorithms, besides RMS, include Earliest Deadline First, Static Cyclic Scheduling, and Deadline Monotonic Scheduling.

The simulation engine may be configured to simulate a multitask environment. In addition, the simulation engine may be configured to simulate the contention for access to shared resources, such a processor resource, a memory resource, etc., by objects of the model or by tasks.

A fourth message sequence diagram may include visual elements of the first, second or third message sequence diagram. In addition, the fourth message sequence diagram may include a task execution element for one or more message-based objects represented by the lifelines. The task execution element may provide an indication of the particular task executing the respective object. For example, the task execution element may include a graphical affordance, such as a vertically extending bar portion that is color-coded or otherwise marked to indicate the task executing the respective object. For example, a first color or fill pattern may represent a first task, a second color or fill pattern may represent a second task, and so on. The bar elements associated with different objects may be arranged on the diagram to provide a visual indication of when a given task is executing a first object as opposed to a second object. The task execution element also may include a header or other graphical affordance containing the name of the event whose occurrence triggered the current execution of the task. The task execution elements may thus illustrate which task is executing at a given execution time instant, and which object or other element a given task is executing.

To execute message-based blocks, the simulation engine may allocate queues, such as input and/or output queues, for the message-based blocks, and the queues may be used to temporarily store the values of messages received and/or to be sent by the message-based blocks.

The model analyzer may detect the allocation of such queues, and the auto diagram builder may include queue elements in a fifth message sequence diagram. A queue element may include a vertically arranged queue lifeline that is disposed adjacent to the lifeline for the respective message-based block. To the extent messages are sent from an output queue of a source block and received in an input queue of a sink block, message arrows of the message sequence diagram may extend between the respective queue lifelines. In an embodiment, a graphical affordance, such as a queue depth bar, may be provided on at least some of the queue lifelines that indicates the number of messages in the queue represented by the respective queue lifeline. For example, a queue depth bar may have a width that indicates the number of messages in the respective queue. The queue depth bar may be widened when an additional message is added to the queue, and narrowed when a message is removed from the queue.

The queue depth bar also may be configured to indicate if the depth of the queue has been exceeded. For example, a queue may have a depth of five, if a sixth message is sent to in the queue, the color of the queue depth bar may be changed by the auto diagram builder, e.g., from green to red, or some other indication may be provided.

Interactive Diagrams

In an embodiment, a user may modify a message sequence diagram. For example, the user may change the execution of a selected task from a first epoch to a second epoch, e.g., by dragging and dropping the task execution bar from a first epoch element to a second epoch element. The user also may change when a selected message is sent and/or received by editing the corresponding arrow, again using drag and drop techniques. Other changes may be made to a message sequence diagram. The user-initiated changes may be captured by the UI engine of the diagramming tool. The diagramming tool may notify the simulation engine of the changes detected in the message sequence diagram. The simulation engine, including the model compiler and the schedulers, may generate new execution instructions for the model that conform to the user-modified message sequence diagram. For example, the schedulers may reschedule the execution order of one or more objects of the model in order to comply with the changes made to the message sequence diagram.

Modeling Environment

FIG. 1 is a partial, functional block diagram of a modeling environment 100 in accordance with an embodiment of the invention. The modeling environment 100 may include a plurality of modules or components. For example, the modeling environment 100 may include a human-machine interface (HMI) engine 102, a model editor 104, and a simulation engine 106. The simulation engine 106 may include an interpreter 108, a model compiler 110, and one or more solvers, such as solvers 112*a-c*. The model compiler 110 may include one or more Intermediate Representation (IR) builders, such as IR builder 114, and one or more schedulers, such as a static scheduler 116 and a dynamic scheduler 118. The HMI engine 102 may be configured to create and present one or more User Interfaces (UIs), such as Graphical User Interfaces (GUIs) and/or Command Line Interfaces (CLIs), on one or more display devices of a computer processing device. The one or more GUIs and/or CLIs may be operated by users to perform various modeling tasks, such as opening, creating and saving models, such as computer-generated, executable graphical models. The GUIs and/or CLIs may also be used to enter commands, set values for parameters and properties, run models, enter commands, change model settings, etc. The model editor 104 may be configured to perform selected operations, such as open, create, edit, and save, in response to the user inputs. The simulation engine 106 may be configured to generate execution instructions for a model, and execute, e.g., compile and run or interpret, the model, using one or more of the solvers 112*a-c*. Exemplary solvers include one or more fixed-step continuous solvers, which may utilize integration techniques based on Euler's Method or Heun's Method, and one or more variable-step solvers, which may be based on the Runge-Kutta and Dormand-Prince pair. A non-exhaustive description of suitable solvers may be found in the *Simulink 7 User's Guide* from The MathWorks, Inc. (September 2013 ed.), which is hereby incorporated by reference in its entirety.

The modeling environment 100 may further include a diagramming tool 120. The diagramming tool 120 may include a model execution analyzer 122, a filtering unit 124, an automatic (auto) diagram builder 126, and a user interface (UI) engine 128. As described herein, the model execution analyzer 122 may be configured to examine the execution instructions generated by the simulation engine 106 for a specified model. The filtering unit 124 may be configured to search the execution instructions for particular elements of the model. The auto diagram builder 126 may be configured to generate one or more message sequence diagrams utilizing the information obtained by the model execution analyzer 122, as filtered by the filtering unit 124. The UI engine 128 may be configured to generate one or more user interfaces that include the one or more message sequence diagrams and to receive edits thereto.

The modeling environment 100 may include other components, such as a code generator 130, a target language compiler 132, and a differencing engine 134. The code generator 130 may be configured to generate computer programming code, such as source and/or object code, from a model. The target language compiler 132 may be configured to compile source code, such as source code generated by the code generator 130, into an executable form, such as one or more object code files or binaries, for execution by target platform or target hardware, such as a central processing unit (CPU), an embedded processor, a microprocessor, a microcontroller, a Field Programmable Gate Array (FPGA), an Application Specific Integrated Circuit (ASIC), a Graphics Processing Unit (GPU), etc., of a data processing device. The differencing engine 134 may be configured to analyze two models, identify the differences between them, and generate a report that sets forth the identified differences.

Suitable code generators for use with the present invention include, but are not limited to, the Simulink Coder, the Embedded Coder, and the Simulink HDL Coder products from The MathWorks, Inc. of Natick, Mass., and the TargetLink product from dSpace GmbH of Paderborn Germany. Suitable target language compilers include C and C++ language compilers. Nonetheless, other code generation systems and other compilers may be used. Suitable differencing engines include the version compare utility in the Simulink Report Generator tool and the SimDiff tool from Ensoft Corp. of Ames, Iowa.

In an embodiment, the diagramming tool 120 may be implemented through one or more software modules or libraries containing program instructions pertaining to the methods described herein. The software modules may be stored in one or more memories, such as a main memory, a persistent memory and/or on computer readable media, of a workstation or other data processing machine or device, and executed by one or more processing elements. Other computer readable media may also be used to store and execute these program instructions, such as non-transitory computer readable media, such as optical, magnetic, or magneto-optical media. In another embodiment, the diagramming tool 120 may comprise registers and combinational logic implemented in hardware and configured and arranged to produce sequential logic circuits. In alternative embodiments, various combinations of software and hardware, including firmware, may be utilized to implement the described methods.

In other embodiments, the diagramming tool 120, or one or more components thereof, may be separate from the modeling environment 100. In such cases, the diagramming tool 120 may be in communication with the modeling environment 100, e.g., through local procedure calls (LPCs), remote procedure calls (RPCs), or one or more Application Programming Interfaces (APIs).

In an embodiment, the modeling environment 100 is a high-level modeling environment. Suitable high-level modeling environments include the MATLAB® and Simulink® technical computing environments from The MathWorks, Inc., as well as the Simscape physical modeling system and the Stateflow charting tool also from The MathWorks, Inc., the MapleSim physical modeling and simulation tool from Waterloo Maple Inc. of Waterloo, Ontario, Canada, the LabVIEW programming system and the NI MatrixX model-based design product both from National Instruments Corp. of Austin, Tex., the Visual Engineering Environment (VEE) product from Agilent Technologies, Inc. of Santa Clara, Calif., the System Studio model-based signal processing algorithm design and analysis tool from Synopsys, Inc. of Mountain View, Calif., the SPW signal processing algorithm tool from Synopsis, a Unified Modeling Language (UML) system, a Systems Modeling Language (SysML) system, the System Generator system from Xilinx, Inc. of San Jose, Calif., and the graphical modeling systems described in U.S. Pat. No. 7,324,931 for Conversion of Model Components Into References and U.S. Pat. No. 7,991,598 for Method and System for Modeling a Mechanical System, which are hereby incorporated by reference in their entireties, among others. Models created in the high-level modeling environment may contain less implementation detail, and thus operate at a higher level than certain programming languages, such as the C, C++, C#, and SystemC programming languages.

Those skilled in the art will understand that the MATLAB® technical computing environment is a math-oriented, textual programming environment for digital signal processing (DSP) design, among other uses. The Simulink® technical computing environment is a model-based design environment for modeling and simulating dynamic and other systems, among other uses. The MATLAB® and Simulink® tools provide a number of high-level features that facilitate algorithm development and exploration, and support model-based design. Exemplary high-level features include dynamic typing, array-based operations, data type inferencing, sample time inferencing, and execution order inferencing, among others.

In another embodiment, a lower level programming language, such as the C, C++, and C# programming languages, among others, may be used to create one or more models.

Models constructed by the modeling environment 100 may include textual models, graphical models, and combinations of graphical and textual models. A given model may simulate, e.g., approximate the operation of, a system. Exemplary systems include physical systems, such as weather systems, financial markets, plants, controllers, etc. A model may be executed in order to simulate the system being modeled, and the execution of a model may be referred to as simulating the model.

Figure 2:
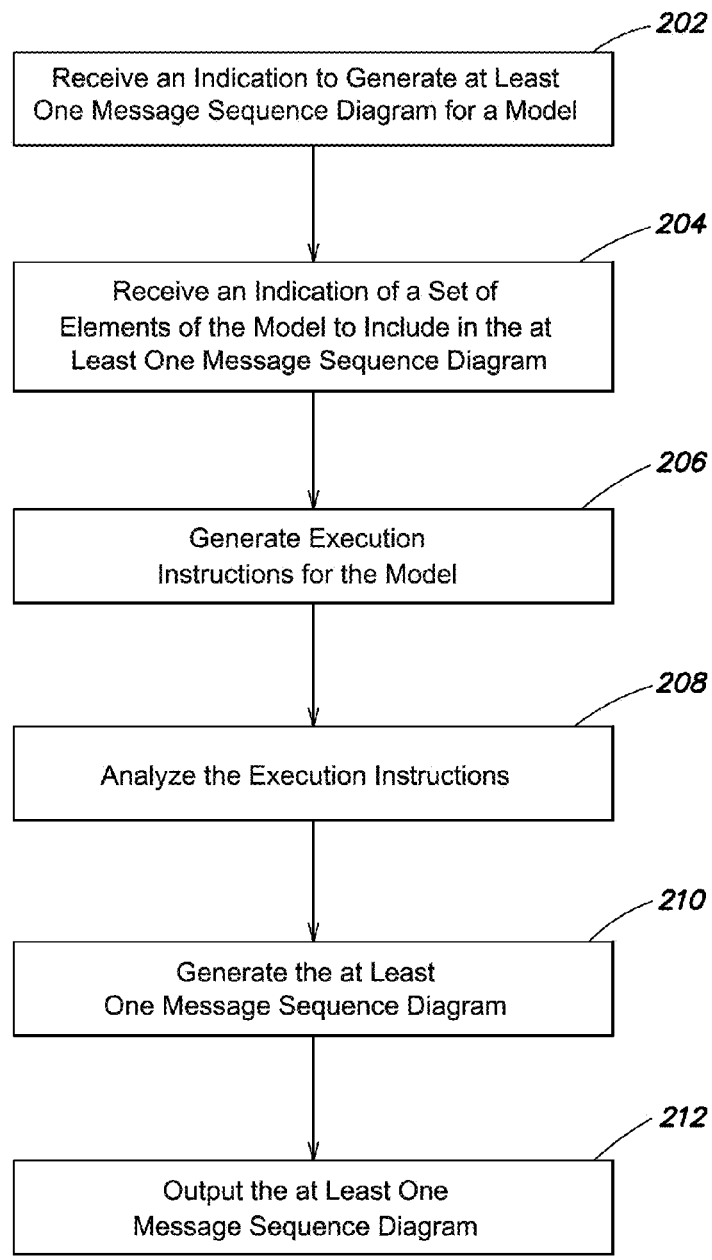
FIG. 2 is a flow diagram of a method in accordance with an embodiment of the invention.

FIG. 2 is a flow diagram of a method in accordance with an embodiment of the present invention.

The diagramming tool 120 may receive an indication, such as a command, to generate one or more message sequence diagrams for a model, as indicated at block 202. The diagramming tool 120 also may receive an indication of one or more model elements to be included in the one or more message sequence diagrams to be generated, as indicated at block 204. In an embodiment, the HMI engine 102 may be configured to present one or more model editor windows on a display. The model editor windows may include a plurality of graphical elements, such as menu bars, tool bars, and a canvas for displaying a graphical model. A user may select one or more elements of a model presented on the model canvas. Alternatively or additionally, a parameter or property may be defined for at least some of the graphical objects used in models. The setting of the parameter may determine whether the respective object is to be included in a message sequence diagram. To set the parameter, the user may select the respective object, and the UI engine 128 may present a dialog or pane through which the value of the parameter may be set by the user.

The simulation engine 106 may generate execution instructions for the model, as indicated at block 206. The generation of execution instructions, and the simulation of a model may involve several phases, such as a compilation phase, a link phase, and a simulation phase. Model execution typically involves processing input data and generating output data. In an embodiment, execution of the model may be carried out over a time span, e.g., a simulation time, which may be user specified or machine specified. The simulation time is a logical execution time, and may begin at a simulation start time and end at a simulation end time. At successive points in time between the simulation start and end times, which points in time may be called simulation time steps, states, inputs and outputs of objects of the model may be computed. The size of the time steps may be fixed or may vary, and are determined by the particular solver 112 used in the execution of the model. Execution instructions may be generated for the entire simulation time.

Model Compilation Phase

A compile stage may mark the start of execution of the model, and may involve preparing data structures and evaluating parameters, configuring and propagating block characteristics, determining block connectivity, and performing block reduction and block insertion. The preparation of data structures and the evaluation of parameters may result in the creation and initialization of one or more data structures for use in the compile stage. For the blocks of the model, a method may force the block to evaluate all of its parameters. This method may be called for the blocks in the model. If there are any unresolved parameters, execution and/or compilation errors may be thrown. During the configuration and propagation of block and port/signal characteristics, the compiled attributes (such as data dimensions, data types, complexity, sample modes, and sample time) of each block and/or port/signal may be setup on the basis of the corresponding behaviors and the attributes of blocks and/or port/signal that are connected to the given block, which connections may be graphically represented on the model through lines, arrows or other connectors. The attribute setup may be performed through a process during which block behaviors "ripple through" the model from one block to the next following signal, state, physical, message or other connectivity.

This process is referred to as inferencing, an implementation of which is propagation. In the case of a block that has explicitly specified its block (or port) behaviors, propagation helps ensure that the attributes of the block are compatible with the attributes of the blocks connected to it. If not, an error may be issued. Secondly, in many cases, blocks are implemented to be compatible with a wide range of attributes. Such blocks may adapt their behavior in accordance with the attributes of the blocks connected to them. This is similar to the concept of polymorphism in object-oriented programming languages. The exact implementation of the block may be chosen on the basis of the model in which the block finds itself. Included within this step may be other aspects such as validating that all rate-transitions yield deterministic results, and that the appropriate rate transition blocks and/or delay blocks are being used. The compilation step also may determine actual block connectivity. For example, virtual blocks may play no semantic role in the execution of a model. In this step, the virtual blocks may be optimized away, e.g., removed, and the remaining non-virtual blocks may be reconnected to each other appropriately. This compiled version of the design model with actual block connections may be used from this point forward in the execution process. The way in which blocks are interconnected in the model does not necessarily define the order in which the equations (methods) corresponding to the individual blocks will be solved (executed). These equations may include outputs equations, derivatives equations and update equations.

Block sample times may also be determined during the compilation stage. A block's sample time may be set explicitly, e.g., by setting a SampleTime parameter of the block, or it may be determined in an implicit manner based on the block's type or its context within the model. The SampleTime parameter may be a vector $[T_s, T_o]$ where $T_s$ is the sampling period and $T_o$ is the initial time offset.

The selected solver 112 may determine the size of the simulation time steps for the simulation of the model, and these simulation time steps are selected to correspond with the sample times of the blocks of the model. When a simulation time step matches the sample time for a block, a sample time hit occurs, and the block is scheduled for execution during that simulation step.

The schedulers 116, 118 may generate execution lists for the blocks of the model. In particular, the schedulers 116, 118 may generate a block sorted order list and a method execution list. The schedulers 116, 118 may utilize one or more algorithms for generating the block sorted order and method execution lists. For example, the static scheduler 116 may use the Rate Monotonic Scheduling (RMS), Earliest Deadline First Scheduling, Static Cyclic Scheduling, or Deadline Monotonic Scheduling. The dynamic scheduler 118 may use an event calendar to schedule future events, such as timeouts and alarms.

Link Phase

In the link stage, memory may be allocated and initialized for storing run-time information for blocks of the model.

Code Generation and Model Execution Phase

Following the model compilation and link stages, code may or may not be generated for the model. If code is generated, the model may be executed through an accelerated execution mode in which the model, or portions of it, is translated into either software modules or hardware descriptions, which is broadly referred to herein as code. If this stage is performed, then the stages that follow use the generated code during the execution of the design model. If code is not generated, the model may execute in an interpretive mode in which the compiled and linked version of the model may be directly utilized to execute the model over the simulation time. The model may not be executed when code is generated for the model. Instead of executing the model within the modeling environment 100, the generated code may be compiled and deployed on a target device, such as a controller, test hardware, etc.

Generated code may be stored in memory, e.g., persistent memory, such as a hard drive or flash memory. The HMI engine 102 may provide or support a Code Generation button in a GUI that may be selected by the user, or the HMI engine 102 may receive a code generation command entered by the user, e.g., in the GUI or the CLI. The code generation command also may be invoked programmatically, for example, when a particular event occurs. In response to the code generation command being activated, the code generator 130 may generate code for the model.

In an embodiment, the generated code may be textual code, such as textual source code, that may be compiled and executed on a target machine or device. The generated code may conform to one or more programming languages, such as Ada, Basic, C, C++, C#, SystemC, FORTRAN, VHDL, Verilog, embedded MATLAB, a vendor or target specific HDL code, such as Xilinx FPGA libraries, assembly code, etc. For example, one or more code generation files, such as header, main, make, and other source files may be generated for the design model. The target language compiler 132 may compile the generated code for execution by target hardware, such as a microprocessor, a Digital Signal Processor (DSP), a Field Programmable Gate Array (FPGA), etc.

The model execution analyzer 122 may analyze the execution instructions generated for identified model, as indicated at block 208. For example, the model execution analyzer 122 may access the execution instructions generated by the simulation engine 106 to determine the execution order of one or more objects of the model, the identity of tasks executing particular objects of the model, the priority of particular tasks and/or objects of the model, the existence of queues, e.g., for buffering messages, and the logical execution times at which messages are generated, added to queues, removed from queues, and consumed. The model execution analyzer 122 may obtain further information regarding the execution of the model.

The auto diagram builder 126 may generate one or more message sequence diagrams as indicated at block 210, and the one or more message sequence diagrams may be presented, e.g., on a display, as indicated at block 212. In an embodiment, the one or more message sequence diagrams may be presented as the model is executed. In another embodiment, the one or more message sequence diagrams may be generated for viewing after model execution.

Sample Model

Figure 3:
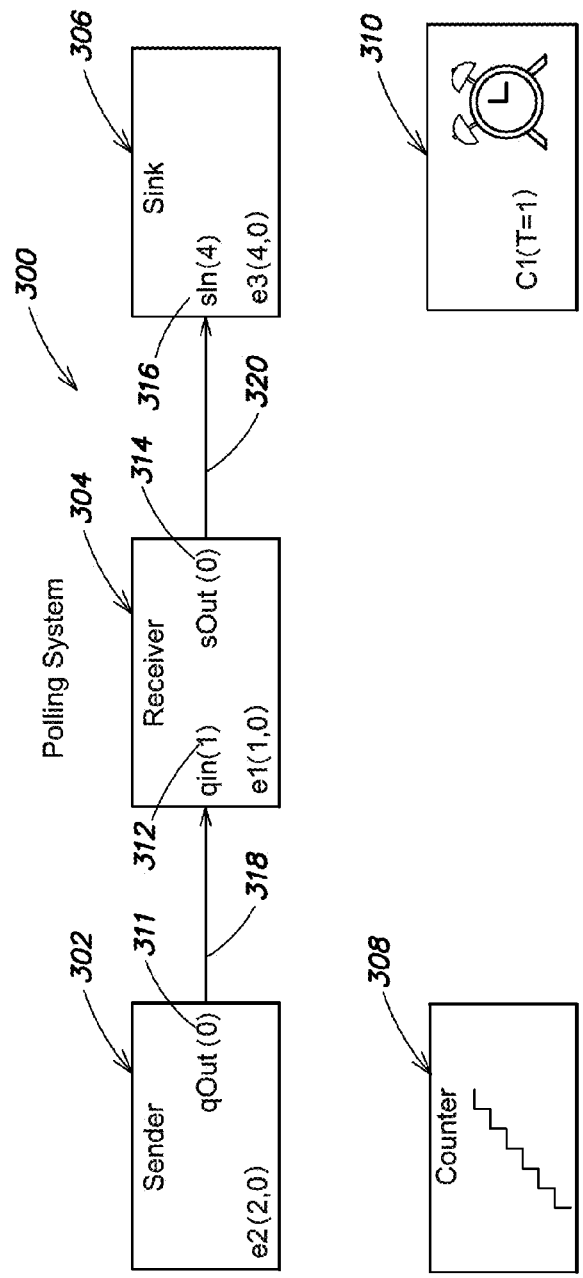
FIG. 3 is a schematic illustration of at least a portion of a graphical program in accordance with an embodiment of the invention.

FIG. 3 is a schematic illustration of at least a portion of a graphical model 300, which may implement a polling system. The model 300 includes a plurality of graphical objects, such as blocks, connections, etc. Specifically, the model 300 includes a sender block 302, receiver block 304, a sink block 306 and a counter or data store memory block 308. The model 300 also may include a clock 310, and the clock 310 may be configured with a period (T) equal to one second. The sender block 302 may include an output queue (qOut) 311 of size '0'. The receiver block 304 may include an input queue (qIn) 312 of size '1', and an output queue (sOut) 314 of size '0'. The sink block 306 may include an input queue (sIn) 316 of size '4'. The sender, receiver and sink blocks 302, 304, 306 may be message-based blocks, and may each be configured to execute in response to specified triggering events. In particular, the triggering events for the sender, receiver and sink blocks 302, 304, 306 blocks, which may be identified as e2, e1 and e3, respectively, may be periodic events corresponding to sample times. For example, event e1 may be specified as a sampling period of '1' and an offset of '0'. Event e2 may be specified as a sampling period of '2' and an offset of '0'. Event e3 may be specified as a sampling period of '4' and an offset of '0'.

Furthermore, the sender block 302 may be configured such that, when event e2 occurs, the sender block 302 places the current value of the counter block 308 on its output queue (qOut) 311, generates a message having the current value of the counter block 308 as its payload, and increments the counter block 308. Messages generated by the sender block 302 are received at the input queue (qIn) 312 of the receiver block 304, as indicated by a first arrow 318. The receiver block 304 may be configured such that, when event e1 occurs, the receiver block 304 determines whether there is a message on its input queue (qIn) 312. If so, the receiver block 304 retrieves the message, places the value of the message at its output queue (qOut) 314, and generates a message with the value. If there is no message on the receiver block's input queue (qIn) 312, the receiver block 304 generates a message with a payload of '−1'. Messages generated by the receiver block 304 are received at the input queue (sIn) 316 of the sink block 306, as indicated by a second arrow 320. The sink block 306 may be configured such that, when event e3 occurs, the sink block 306 retrieves the messages on its input queue (sIn) 316, and displays the message values, e.g., on a console.

A user may be interested in observing the execution of the model 300. The user may enter a command to generate one or more message sequence diagrams for the model 300. The user may designate that information concerning the sender, receiver and sink blocks 302, 304, 306 is to be included in the one or more message sequence diagrams.

The model execution analyzer 122 may examine the execution instructions, including the execution schedules, generated for the model 300 by the simulation engine 106. If the model 300 has not yet been executed, the diagramming tool 120 may direct the simulation engine 106 to execute the model, thereby generating execution instructions. The filtering unit 124 may direct the model execution analyzer 122 to search the execution instructions for the occurrence of elements of the model, such as blocks, queues, connections, etc., that were identified as being of interest to the user, e.g., the sender, receiver and sink blocks 302, 304, 306. The filtering unit 124 also may direct the model execution analyzer 122 to examine one or more logical execution time periods that are of interest to the user.

The model compiler 110 may establish a single task, e.g., the 'PollingSystemPeriodic' task, to execute the functions defined by all three blocks 302, 304, and 306. In addition, the static scheduler 116 may be used and may schedule the order of the events e1, e2, and e3, such that event e2 is processed before event e1, which is processed before event e3.

Message Sequence Diagrams

Figure 4:
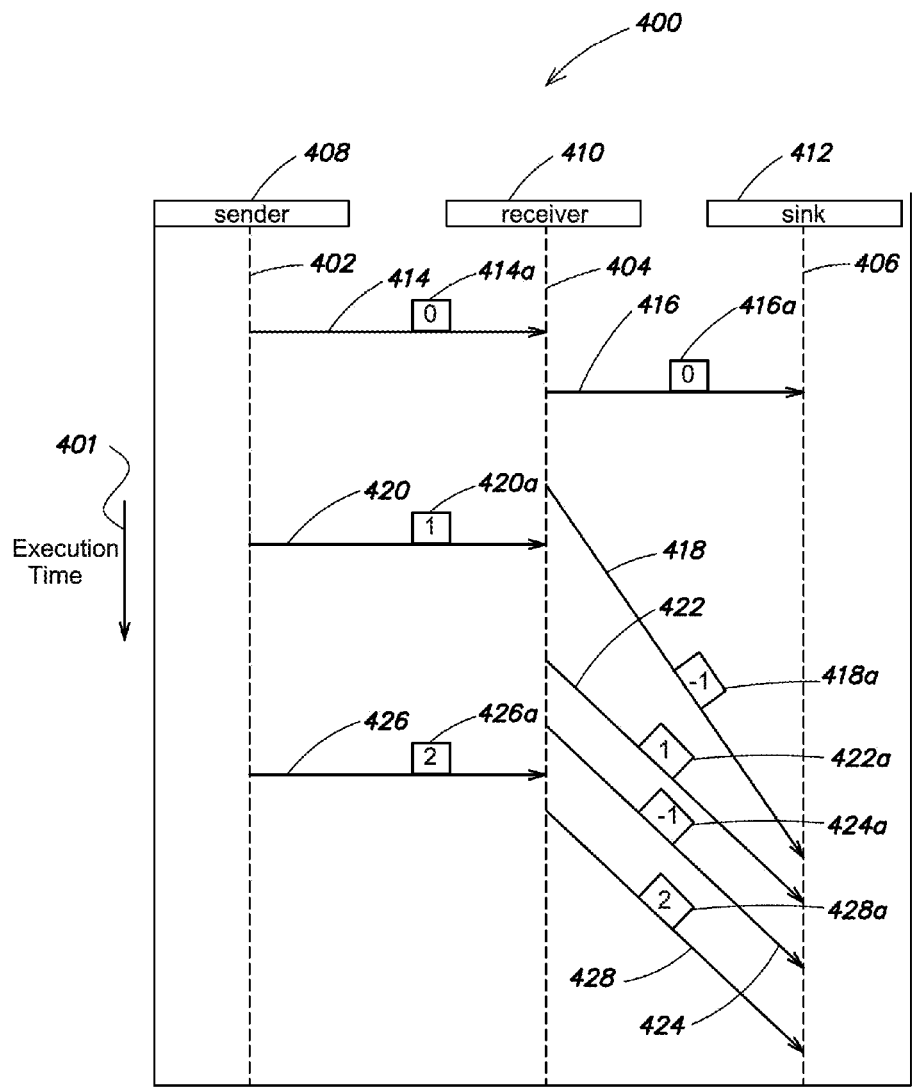
FIG. 4 is a highly schematic illustration of a message sequence diagram in accordance with an embodiment of the invention.

FIG. 4 is a highly schematic illustration of a first message sequence diagram 400 that may be created by the auto diagram builder 126 to illustrate the interaction among the sender, receiver and sink blocks 302, 304, 306 of the model 300. The first message sequence diagram 400 may illustrate interactions among the selected entities of the model 300, e.g., the sender, receiver and sink blocks, 302, 304, 306. The interactions, moreover, may be shown in time-wise relationship, as illustrated by the execution time arrow 401. In an embodiment, the auto diagram builder 126 may scroll the first message sequence diagram, e.g., upward, opposite the execution time arrow 401, to provide a new area at the bottom of the diagram 400 in which to display additional interactions. That is, the first diagram 400 may be a dynamic diagram.

The auto diagram builder 126 may be configured to utilize a plurality of different graphical affordances in the first diagram 400 to illustrate the interactions among the selected entities of the model 300. For example, the auto diagram builder 126 may include a first type of graphical affordance to represent the selected entities, i.e., the sender, receiver and sink blocks 302, 304, 306. The first type of graphical affordance may be a lifeline. In particular, the auto diagram builder 126 may include a first lifeline 402 for the sender block 302, a second lifeline 404 for the receiver block 304, and a third lifeline 406 for the sink block 306. The lifelines 402, 404, 406 may be dashed lines that are parallel to each other, and may extend vertically in the diagram 400. The lifelines 402, 404, 406 may include headers, such as headers 408, 410, 412, that contain information identifying the respective entities, such as their names, e.g., 'sender', 'receiver', and 'sink'.

The auto diagram builder 126 may use a second type of graphical affordance to represent interactions between the entities. For example, the auto diagram builder may represent the occurrence of message send and receive interactions among the entities, during execution of the model 300, using one or more symbols or other graphical images, such as connectors, and more particularly solid line arrows, where the arrows extend between the lifelines 402, 404, 406, thereby visually linking the lifelines. An arrow may identify the lifelines of the sending and receiving blocks. For example, the tail of an arrow may be located on the lifeline of the entity sending the message, while the head of the arrow may be located on the lifeline of the entity receiving the message. As mentioned, the auto diagram builder 126 may arrange the arrows on the diagram 400 in an order that illustrates the execution order of the interactions, as determined by the simulation engine 106. For example, the auto diagram builder 126 may place the arrow for a first interaction above a second arrow for a second interaction where the first interaction occurs before the second interaction.

As mentioned, the schedulers 116, 118 of the model compiler 110 generate an execution schedule for the model 300 over the simulation time. The message-based blocks 302, 304, 306 are configured to execute at particular sample times. Accordingly, the blocks 302, 304, 306 may be message-based blocks that may be scheduled for execution at each simulation time step that corresponds to a sample time hit for a respective one of the blocks 302, 304, 306.

All three blocks 302, 304, 306 may be scheduled for execution in a first simulation time step, which may correspond to sample time 0. The sender block 302 reads the value of the counter block 308, e.g., 0, and generates a first message with this value as its payload. The message is received at the receiver block 304, which generates a second message with this value as its payload. The second message is received at the sink block 306, which displays the value from the message, e.g., 0, on the console.

On the first diagram 400, a first arrow 414 extending from the sender's lifeline 402 to the receiver's lifeline 404 represents the first message. A second arrow 416 extending from the receiver's lifeline 404 to the sinks' lifeline 406 represents the second message. In an embodiment, the auto diagram builder 126 may provide information concerning the payload of messages illustrated in the first diagram 400. For example, the auto diagram builder 126 may include a payload data box adjacent to, e.g., above, the arrow, and may present the value of the message's payload in the data box. A first data box 414a may be associated with the first arrow 414, indicating that the payload of the first message is 0. A second data box 416a may be associated with the second arrow 416, indicating that the payload of the second message is also 0. Execution of the sink block 306 does not involve the generation or sending of any messages. Accordingly, no arrows are shown from the sink's lifeline 406.

As mentioned, the receiver block 304 executes at each sample time, e.g., sample times 0, 1, 2, 3, etc.; the sender block 302 executes at every other sample time, e.g., sample times 0, 2, 4, 6, etc.; and the sink block 306 executes every fourth sample time, e.g., sample times 0, 4, 8, 12, etc. Accordingly, at the simulation time step for sample time 1, only the receiver block 304 is scheduled for execution. The receiver block 306 again generates a message. However, because there is no new data on the receivers input queue (qIn) 312, the receiver block 304 transmits a message whose payload is −1. This message is represented on the diagram 400 as a third arrow 418 having third data box 418a.

In an embodiment, the auto diagram builder 126 positions the arrows representing messages to indicate when, during execution of the model 300, the message is both sent and received. The first and second messages are both sent and received during the first simulation step, which corresponds to sample time 0, because all three blocks 302, 304, 306 execute at this sample time. Accordingly, the auto diagram builder 126 may draw the first and second arrows 414, 416 horizontally on the diagram 400.

However, while the third message as represented by the third arrow 418 is sent by the receiver block 304 during the simulation time corresponding to sample time 1, this third message is not received by the sink block 306 until the simulation time corresponding to sample time 4, which is the next time after sample time 0 that the sink block 306 is scheduled to execute. Accordingly, while the tail of the third arrow 418 is placed on the receiver's lifeline 404 at a location indicating that it is the next message to be sent after the second message, the head of the third arrow 418 is placed on the sink's lifeline 406 at a much lower point, e.g., a point representing the simulation time step for sample time 4. The slope of an arrow in the first diagram 400 may thus represent a delay between a logical execution time at which a message is sent and a logical execution time at which the message is received.

At the simulation time for sample time 2, both the sender block 302 and the receiver block 304 are scheduled for execution. The sender block 302 again reads the value of the counter block 308, which is now 1, and generates a message with that value as its payload. This message is illustrated in the diagram 400 by a fourth arrow 420 with a data box 420a illustrating that the payload of this message is 1. The receiver block 304 receives the message, and generates its own message with the value from the received message, e.g., 1. The message generated by the receiver block 304 is illustrated in the diagram 400 by a fifth arrow 422 with a data box 422a. Because the message represented by the fifth arrow 422 is not received by the sink block 306 until the sink block next executes, the fifth arrow 422 like the third arrow 418 is also sloped indicating the time delay.

At the simulation time for sample time 3, only the receiver block 302 is scheduled for execution. The receiver block 304 generates a message but, because no new data was received by the receiver block 304, the receiver block 304 uses the value of −1 for the payload of this message. This message is illustrated in the diagram by a sixth arrow 424 with a data box 424a. The sixth arrow 424 is also displayed in a sloping manner indicating that it is not received by the sink block 306 until a later logical execution time.

At the simulation time for sample time 4, all three blocks 302, 304, 306 are once again scheduled for execution. The sender block 302 reads the value of the counter block 308, i.e., 2, and generates a message with this value as its payload. This message is represented in the diagram 400 by a seventh arrow 426 with a data box 426a. The receiver block 304 receives the message from the sender block 302, and generates its own message using the value from the received message, i.e., 2. The message generated by the receiver block 304 is illustrated by an eighth arrow 428 with a data box 428a.

Even though the eighth arrow 428 represents a message that is sent and received during the same simulation time step, e.g., sample time 4, the eighth arrow is sloped indicating that the sink block 306 receives the message at a logical time that is after it was sent by the receiver block 304. This is due to the fact that, after the receiver block 304 sends this message it is not processed by the sink block 306 until after the sink block 306 has processed the other messages represented by arrows 418, 422 and 424.

Logical Execution Time Regions

Figure 5:
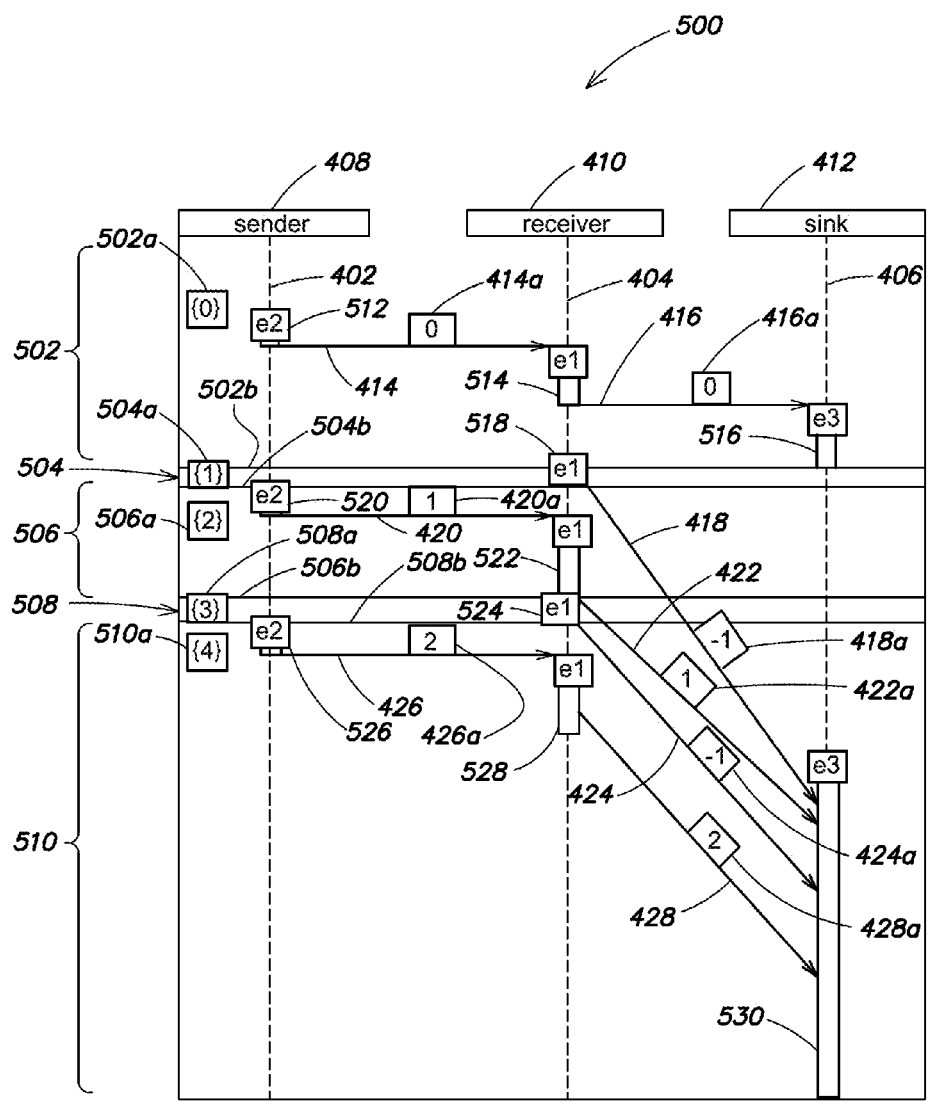
FIG. 5 is a highly schematic illustration of a message sequence diagram in accordance with an embodiment of the invention.

FIG. 5 is a highly schematic illustration of a second message sequence diagram 500 that may be generated by the auto diagram builder 126 to illustrate the interaction among the sender, receiver and sink blocks 302, 304, 306 of the model 300. Like the first message sequence diagram 400, the second diagram 500 may include the lifelines 402, 404, 406 with the headers 408, 410, 412. The second diagram 500 also may include the arrows 414-428 and the data boxes 414a-428a.

The auto diagram builder 126 may also be configured to utilize one or more graphical affordances to represent logical execution time of the program 300 on a message sequence diagram. For example, the auto diagram builder 126 may be configured to include a plurality of horizontal regions on a message sequence diagram, where each region corresponds to a particular logical execution time instant. The horizontal regions may be referred to as epochs. In an embodiment, an epoch may correspond to a simulation time step during which an activity involving at least one of the selected entities occurs. The auto diagram builder 126 may include boundaries such as lines separating adjacent epochs and may include information regarding the logical execution time instant of the epochs.

Included in the second diagram 500 is a first epoch 502 for the simulation time step corresponding to sample time 0. The first epoch 502 may include a data box 502a that contains information regarding the particular logical execution time instant of the first epoch, e.g., the simulation time step that corresponds to sample time 0. A boundary line 502b may mark the end of the first epoch 502 and the start of a second epoch 504. The second epoch 504 may include a data box 504a that contains information regarding its logical execution time instant, e.g., the simulation time step that corresponds to sample time 1, and a boundary 504b that separates the second epoch 504 from a third epoch 506. The third epoch 506 includes a data box 506a that contains information regarding its logical execution time instant, e.g., the simulation time step that corresponds to sample time 2, and a boundary line 506b that separates the third epoch 506 from a fourth epoch 508. The fourth epoch 508 includes a data box 508a that contains information regarding its logical execution time instant, e.g., the simulation time step that corresponds to sample time 3, and a boundary line 508b that separates the fourth epoch 508 from a fifth epoch 510. The fifth epoch 510 includes a data box 510a that contains information regarding its logical execution time instant, e.g., the simulation time step that corresponds to sample time 4.

In addition to illustrating epochs on a message sequence diagram, the auto diagram builder 126 may also be configured to include one or more graphical affordances that represent the task used to execute the blocks 302, 304, 306. For example, the auto diagram builder 126 may overlay a task activation bar onto a lifeline to indicate when a task is executing the block represented by that lifeline.

As mentioned, the model compiler 110 may be directed to implement or define a single task to execute the sender, receiver and sink blocks 302, 304, 304. The model compiler 110 may define a task called 'PollingSystemPeriodic'.

During the first epoch 502, a first task activation bar 512 may indicate that the task, i.e., the 'PollingSystemPeriodic' task, first executes the sender block 302. The length of the task activation bar 512 may provide an indication of the length of the physical execution time that the task spends executing the sender block 304. Upon completion of the sender block 302, the task switches to executing the receiver block 304, as indicated by a second task activation bar 514. Upon completion of execution of the receiver block 304, the task executes the sink block 306, as indicated by a third task activation bar 516. A task activation bar may include a header portion, and information identifying the event that triggered execution of a block by the task, such as the event's name, may be included in the header portion. For example, the event that triggers execution of the sender block 302 is called e2; the event that triggers execution of the receiver block 304 is e1; and the event that triggers execution of the sink block 306 is e3.

As the 'PollingSystemPeriodic' task can only execute one of the blocks at any given point in time, there is no overlap among the task activation bars 504-508.

During the second epoch 504, which corresponds to the simulation time step for sample time 1, the task only executes the receiver block 304, as indicated by fourth task activation bar 518. During the third epoch 506, which corresponds to the simulation time step for sample time 2, the task executes the sender block 302 and the receiver block 304, as indicated by fifth and sixth task activation bars 520, 522. During the fourth epoch 508, which corresponds to the simulation time step for sample time 3, the task only executes the receiver block 304, as indicated by seventh task activation bar 524. During the fifth epoch 510, which corresponds to the simulation time step for sample time 4, the task executes all three blocks, as indicated by eighth, ninth, and tenth task activation bars 526, 528, 530.

The message sequence diagram 500 provides the user with an indication of which activities occur in a given logical execution time instant, i.e., an epoch, and the relative order of those activities in that time instant. For example, with reference to the first epoch 502, it can be observed that the task executes the sender block 302 before executing the receiver block 304, and that the task executes the receiver block 304 before executing the sink block 306. The diagram 500 also provides the user with an indication of the length of logical execution time taken by a task to execute a given entity. For example, with reference to the fifth epoch 510, it can be observed that the task requires more logical execution time to execute the sink block 306 than to execute the sender or receiver blocks 302, 304. The diagram 500 also provides an indication of the event that triggers the execution of a block of interest.

Queue Depth

With reference to FIG. 3, the receiver block 304 has an input queue (qIn) 312, and the sink block 306 has an input queue (sIn) 316. Suppose the user is interested in seeing the interaction among the sender, receiver and sink blocks 302, 306, 308 including the input queues (qIn) and (sIn) 312, 316. In this case, the user may designate the input queues (qIn) and (sIn) 312, 316 as additional entities to be included in a message sequence diagram, and the model execution analyzer 122 may examine the execution instructions to determine what interactions occur with these queues as well as the blocks 302, 304, 306, and when those interactions occur.

Figure 6:
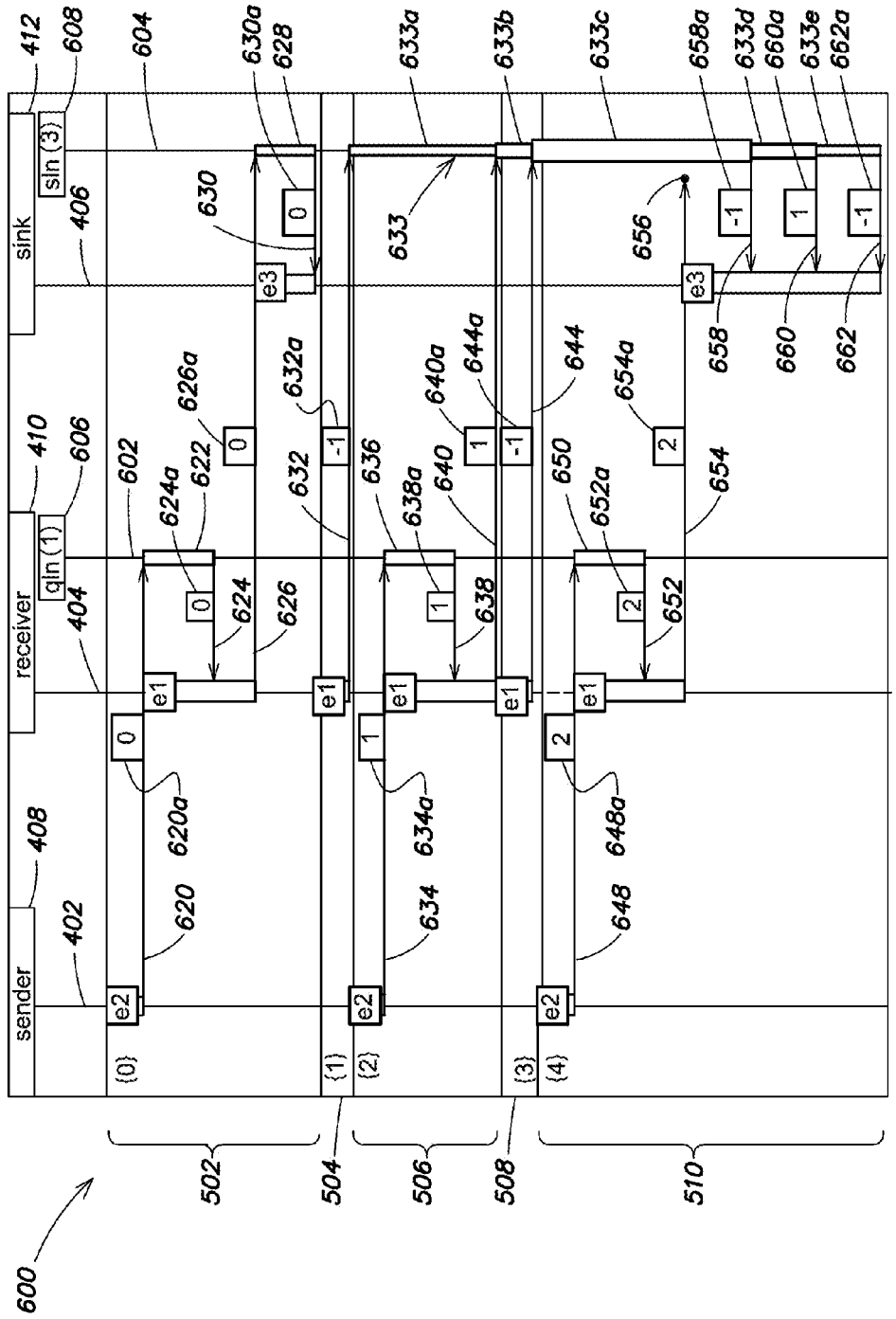
FIG. 6 is a highly schematic illustration of a message sequence diagram in accordance with an embodiment of the invention.

FIG. 6 is a highly schematic illustration of a third message sequence diagram 600 that may be generated by the auto diagram builder 126 to illustrate the interaction among the sender, receiver and sink blocks 302, 304, 306 and the input queues (qIn) and (sIn) 312, 316. Like the first and second message sequence diagrams 400, 500, the third diagram 600 may include the lifelines 402, 404, 406 with the headers 408, 410, 412. The third diagram 600 further includes fourth and fifth lifelines 602, 604 for the new entities included in the diagram 600, i.e., the input queues (qIn) and (sIn) 312, 316. The new lifelines 602, 604 also may include headers 606, 608 that identify the elements, e.g., qIn and sIn. Information regarding the sizes of the queues may also be included in the headers 606, 608. For example, suppose that the size of the receiver's input queue (qIn) is 1, but that the size of the sink's input queue (sIn) was changed in this example from four to three, as shown in the header 608. Because the input queue (qIn) 312 is part of the receiver block 304, the auto diagram builder may place its lifeline 602 below the receiver's header 410 and adjacent to the receiver's lifeline 404. Because the input queue (sIn) 316 is part of the sink block 306, the auto diagram builder 126 may place its lifeline 604 below the sink's header 412 and adjacent to the sink's lifeline 604.

During the first epoch 502, which corresponds to sample time 0, the sender block 302 reads the value of the counter and sends a message to the receiver block 304 with the counter value, 0. While this message is received by the receiver block 304, more specifically, it is received by the receiver block's input queue (qIn) 312. Since the receiver block's input queue (qIn) 312 is now represented in the third diagram 600, this message is represented by a first arrow 620 having a data box 620a that extends from the sender's lifeline 402 to the lifeline 602 for the receiver's input queue (qIn) 312. As noted, the tail of an arrow may be located at the lifeline of the message sender, and the head of the arrow may be located at the receiver's lifeline. The auto diagram builder 126 may be configured to provide a graphical affordance that illustrates how long a message sits in a queue. For example, the auto diagram builder 126 may provide a queue depth bar on the lifeline of a queue that indicates how long a message sits in the queue. A first queue depth bar 622 indicates how long the first message from the sender block 302 sits in the receiver's input queue (qIn) 312. The auto diagram builder 126 also may include a graphical affordance that indicates when a message is removed from a queue, e.g., when the message is consumed. The graphical affordance may be a solid line arrow. The act of retrieving the message by the receiver block 302 from its input queue (qIn) 312 is illustrated by a second arrow 624, which may include a data box 624a that indicates the value, e.g., 0, of the message retrieved from the queue.

A third arrow 626 with a data box 626a indicates the message sent by the receiver block 304 and received by the input queue (sIn) 316 of the sink block 306. A second queue depth bar 628 indicates how long this message sits in the sink block's input queue (sIn) 316, and a fourth arrow 630 with a data box 630a indicates when the message is retrieved by the queue (sIn) by the sink block 306.

During the second epoch 504, which corresponds to sample time 1, a fifth arrow 632 with a data box 632a indicates the message sent from the receiver block 304 to the input queue (sIn) 316 of the sink block 306. A second queue depth bar 633 may indicate the depth of the sink block's input queue (sIn) 316.

During the third epoch 506, which corresponds to sample time 2, a sixth arrow 634 with a data box 634a indicates the message sent from the sender block 302 to the receiver block's input queue (qIn) 312. A third queue depth bar 636 indicates how long this message sits in the receiver block's input queue (qIn) 312. A seventh arrow 638 with a data box 638a indicates that the receiver block 304 retrieves the message from its input queue, qIn, 312, and an eighth arrow 640 with a data box 640a indicates the message sent from the receiver block to the sink block's input queue (sIn) 316.

The auto diagram builder 126 may be configured to use one or more graphical affordances to indicate how many messages are sitting in a queue. For example, the auto diagram builder may alter the width of a queue depth bar to indicate how many messages are waiting in a queue. That is, a first width may indicate a single message is in the queue, a second width may indicate two messages are in the queue, a third width may indicate three messages are in the queue, etc. When the third message is received at the sink's input queue (sIn) 316, as indicated by the eighth arrow 640, it now represents the second message in the sink's input queue (sIn) 316. Accordingly, the auto diagram builder 126 may increase the width of the queue depth bar 633. For example, a first portion 633a of the queue depth bar 633 may be used to indicate a single message in the queue, e.g., during the third epoch 506, and a second portion 633b that is wider than the first portion 633a may be used to indicate two messages are in the queue at the start of the fourth epoch 508.

During the fourth epoch 508, which corresponds to sample time 3, another message is sent from the receiver block 304 to the sink's input queue (sIn) 316, as indicated by a ninth arrow 644 with a data box 644a. The auto diagram builder 126 may also create a third portion 633c of the queue depth bar 633 that is even wider than the second portion 633b to indicate there are now three messages are in the sink's input queue (sIn) 316.

During the fifth epoch 510, which corresponds to sample time 4, the sender block 302 sends a message to the receiver's input queue (qIn) 312, as indicated by a tenth arrow 648 with a data box 648a. The message sits in the receiver's input queue (qIn) 312, as indicated by the queue depth bar 650. The message is retrieved by the receiver block 304, as indicated by an eleventh arrow 652 with a data box 652a. The receiver block 304 sends a message to the sink's input queue (sIn) 316, as indicated by a twelfth arrow 654 with a data box 654a. However, with this example, the sink's queue size is only three, and the sink's queue already has three messages. The auto diagram builder 126 may be configured to use one or more graphical affordances to indicate the occurrence of a lost message or a message that cannot be delivered. For example, the auto diagram builder 126 may illustrate a lost or undeliverable message by shortening the twelfth arrow 654 so that it does not reach the intended lifeline 604. In addition, the auto diagram builder 126 may connect the head of the arrow to a dot, such as dot 656, providing an additional visual cue that the message could not be delivered, e.g., because the sink's input queue (sIn) 316 is full.

The retrieving of messages by the sink block 306 from its input queue (sIn) 316 may be illustrated by thirteenth, fourteenth and fifteenth arrows 658, 660, 662 with data boxes 658a, 660a, 662a. When a message is retrieved from the sink's input queue (sIn) 316, the auto diagram builder 126 may indicate this on the diagram by decreasing the width of the queue depth bar 633, as illustrated at fourth and fifth portions 633d, 633e.

It should be understood that the model execution analyzer 122 may determine that the message represented by the twelfth arrow 654 is not delivered by examining the execution instructions generated for the model 300 by the model compiler 110.

Signal Trace

As described above with reference to FIG. 3, the sender block 302 is configured to read the current value of the counter block 308, generate a message with that value as it payload, and cause the counter block 308 to increment its value. Suppose a user is interested in observing the counter value generated by the counter block 308 during model execution. In this case the user may designate the counter signal generated by the counter block 308 as well as the sender, receiver and sink blocks 302, 304, 306 for presentation in a message sequence diagram. The counter block 308 may be a signal-based block. That is, the counter block 308 may generate a counter signal that, in an embodiment, may have a value at all times, during execution of the model 300.

Figure 7:
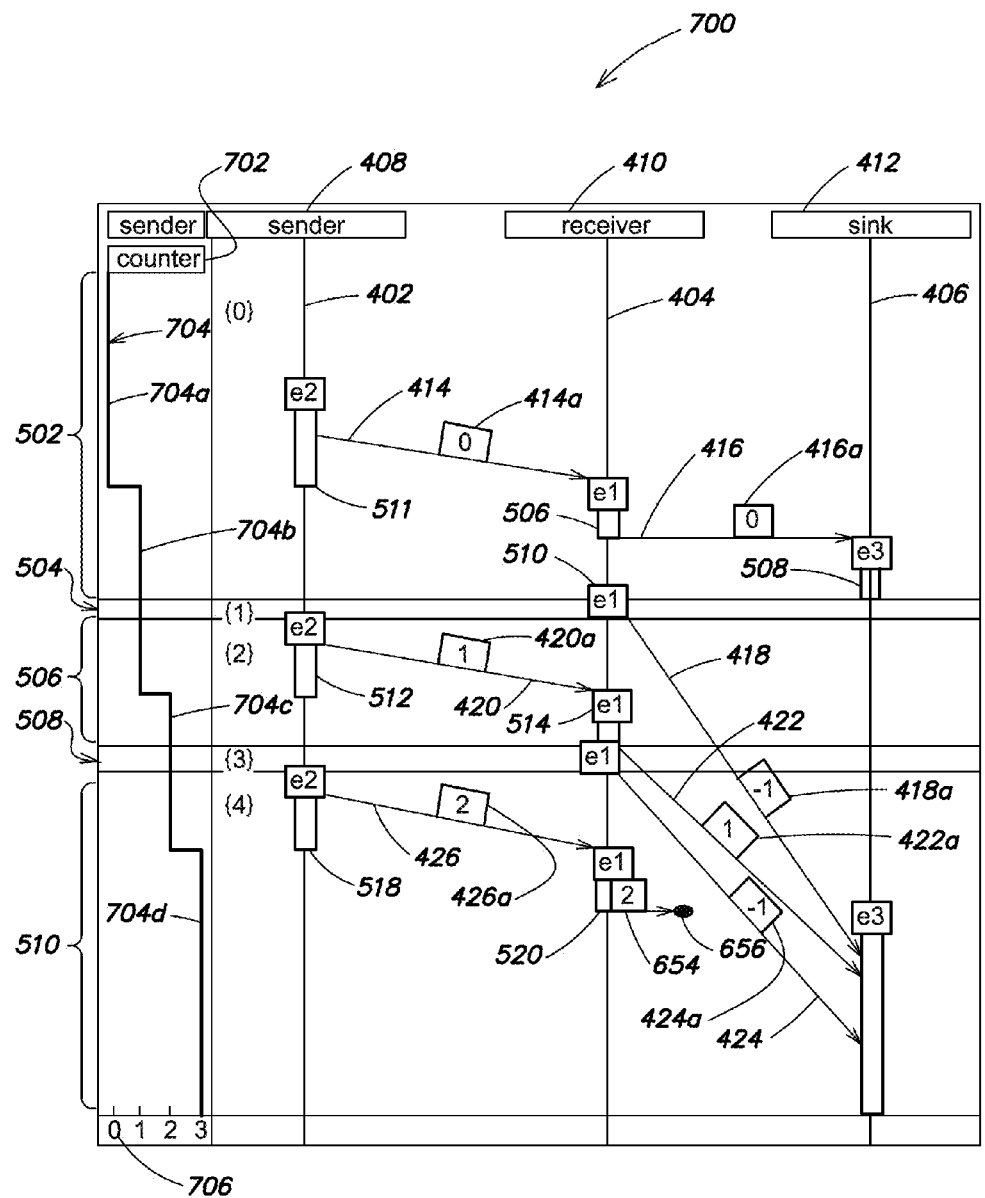
FIG. 7 is a highly schematic illustration of a message sequence diagram in accordance with an embodiment of the invention.

FIG. 7 is a highly schematic illustration of a fourth message sequence diagram 700 that may be created by the auto diagram builder 126 to illustrate the interaction among the sender, receiver, and sink blocks 302, 304, 306, and the value of the counter signal. The auto diagram builder may be configured to include a signal trace element 702 to represent the value of the counter signal of the counter block 308. In an embodiment, the signal trace element 702, like the lifelines 402, 404, 406, may be vertically oriented within the fourth message sequence diagram 700, and may extend across the horizontally arranged bands representing the epoch elements 502, 504, 506, 508, 510. The auto diagram builder 126 may include a trace 704 within the signal trace element 702, where the trace 704 represents the value of the respective signal. The auto diagram builder 126 also may include one or more graphical affordances that indicate the value of the counter signal. In an embodiment, the graphical affordances may be a scale element 706 included in the trace element 702, e.g., at the bottom.

With reference to the first epoch 502, the sender block 302 reads the value of the counter signal, 0, and generates a message with this value. The message is represented by the first arrow 414. After generating the message, the sender block 302 causes the counter block 308 to increment the counter signal, e.g., from 0 to 1. As illustrated in the fourth message sequence diagram 700, at the completion of the task executing the sender block 302, as indicated by the task activation bar 504, the value of the counter signal as represented by the trace 704 moves from 0 to 1, as shown by trace portions 704a and 704b. Because the task executing the sender and receiver blocks 302, 304 does not commence execution of the receiver block 304 until after the sender block causes the counter signal to increment from 0 to 1, the first arrow 414 leading to the receiver block's lifeline 404 is sloped.

As shown, the value of the counter signal remains at 1 until the third epoch 506, which is the next simulation step at which the sender block 302 is executed. Again, the sender block 302 reads the current value of the counter signal, which is now 1, generates a message with this value, as indicated by the fourth arrow 420, and causes the counter block 308 to increment the counter signal. The change in value of the counter signal, e.g., from 1 to 2, is represented by trace portions 704b and 704c.

The value of the counter signal remains unchanged until the fifth epoch 510, which is the next simulation step at which the sender block 302 is executed. Once again, the sender block 302 reads the current value of the counter signal, which is now 2, generates a message with this value, as indicated by the seventh arrow 426, and causes the counter block 308 to increment the counter signal. The change in value of the counter signal, e.g., from 2 to 3, is represented by trace portions 704c and 704d.

By reviewing the fourth message sequence diagram 700, the user can observe the value of the counter signal in relation to the interactions among the sender, receiver and sink blocks 302, 304, 306.

As with the third message sequence diagram 700, the final message generated by the receiver block 304 is not delivered to the sink's the input queue (sIn) 316 because the queue is full, as represented by the eighth arrow 654, which terminates in the dot element 656.

Multi-Tasking

In an embodiment, the model compiler 110 may be configured to implement a plurality of tasks for executing the sender, receiver and sink blocks 302, 304, 306, rather than just a single task as previously described. In addition, the model compiler 110 may map the execution of the sender block 302 to a first task, which may be called 'Task-e2', the receiver block 304 to a second task, which may be called 'Task_e1', and the sink block 306 to a third task, which may be called 'Task_e3'.

The auto diagram builder, moreover, may be further configured to provide information on a message sequence diagram that shows which task is executing a selected block or other selected element of the model 300.

Figure 8:
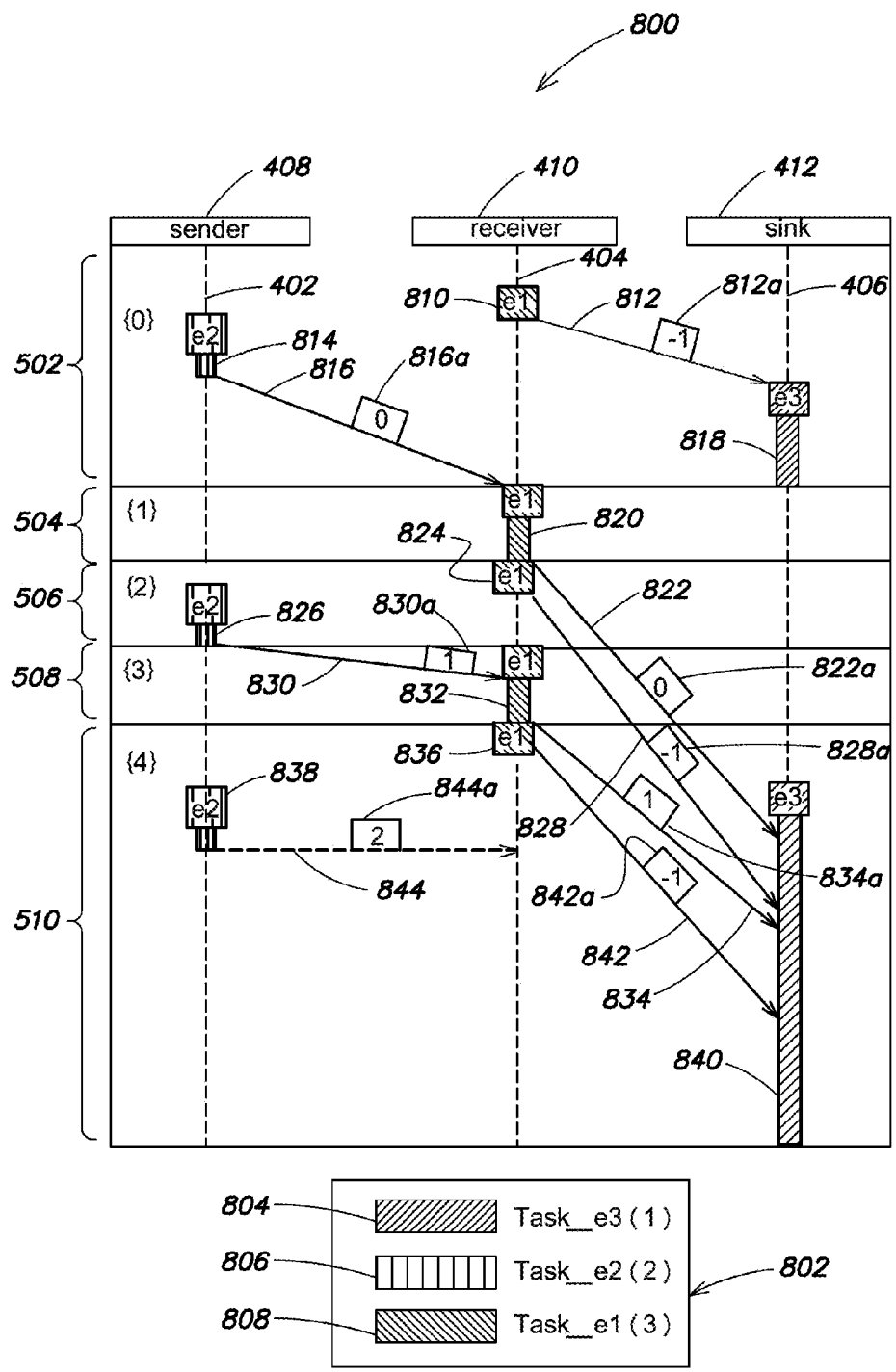
FIG. 8 is a highly schematic illustration of a message sequence diagram in accordance with an embodiment of the invention.

FIG. 8 is a schematic illustration of a fifth message sequence diagram 800 that may be created by the auto diagram builder 126 to illustrate the interaction among the sender, receiver, and sink blocks 302, 304, 306, and the different tasks that are executing those blocks. The auto diagram builder 126 may be configured to use one or more graphical affordances to indicate the different tasks that are executing the blocks. For example, the auto diagram builder 126 may utilize a particular fill pattern, shading, border feature, or color within the task activation bars to indicate the particular task.

The fifth message sequence diagram 800 may include a legend block 802 that indicates the fill pattern or color used to illustrate the different tasks. The legend block 802 may include a first entry 804 that indicates that the 'Task_e3' task is represented with a forward hash pattern; a second entry 806 that indicates that the 'Task_e2' task is represented with a vertical hash pattern; and a third entry 808 that indicates that the 'Task_e1' task is represented with a backward hash pattern.

The various tasks may use the same computing resources, such as processing and/or memory resources, and the model compiler may assign different priorities among the tasks to control their execution order. For example, the task 'Task_e1' may be assigned a higher priority than the task 'Task_2', which in turn may be assigned a higher priority than the task 'Task_e3'. In addition, the user interface engine 128 may be configured to include one or more graphical affordances, e.g., in the legend block 802, to indicate the priorities of the tasks. For example, the user interface engine 128 may indicate the priorities of the tasks with numbers included in parentheses following the task names. Specifically, the task 'Task_e3' may have priority 1, the task 'Task_e2' may have priority 2, and task 'Task_e1' may have priority 3.

Alternatively, there may be concurrent resources available to the various tasks, which may not require preemption to support multitasking.

The auto diagram builder 126 may be configured to illustrate the execution of the sender, receiver and sink blocks 302, 304, 306 with task activation bars having the color or fill pattern of the respective task. More specifically, a first task activation bar 810 may represent execution of the receiver block 304 during the first epoch 502. Execution of the receiver block 304 includes the generation of a message that is received by the sink block 306, as indicated by a first arrow 812 have a data box 812a. Following the completion of the execution of the receiver block 304 by the 'Task_e1' task, the 'Task_e2' task executes the sender block 302, as indicated by a second task activation bar 814. Execution of the sender block 302 includes the generation of a message received by the receiver block 304, as indicated by a second arrow 816 with a data box 816a. Following the completion of the execution of the sender block 302 by the 'Task_e2' task, the 'Task_e3' task executes the sink block 306, as indicated by a third task activation bar 818.

In the second epoch 504, only the receiver block 304 executes, as indicated by a fourth task activation bar 820, which bears the fill pattern for the 'Task_e1' task. During execution of the receiver block 304 in the second epoch 504, the message generated by the sender block 302 in the first epoch 502 is received, as indicated by the head of the second arrow 816 terminating at the receiver's lifeline 404 in the second epoch 504. Execution of the receiver block 304 during the second epoch 504 includes the generation of a message, as indicated by a third arrow 822 with a data box 822a.

In the third epoch 506, the receiver and sender blocks 304, 302 execute, as indicated by fifth and sixth task activation bars 824, 826, which carry the fill patterns for the respective tasks. Execution of the receiver block 304 includes generation of a message, as indicated by a fourth arrow 828 with a data box 828a. Execution of the sender block 302 includes the generation of a message, as indicated by a fifth arrow 830 with a data box 830a.

In the fourth epoch 508, only the receiver block 304 executes as indicated by a seventh task activation bar 832. During execution of the receiver block 304, the message represented by the fifth arrow 830 is received, and a new message is generated, as indicated by a sixth arrow 834 with a data box 834a.

In the fifth epoch 510, the sender, receiver and sink blocks 302, 304, 306 all execute, as indicated by eighth, ninth and tenth task activation bars 836, 838, 840. Execution of the receiver block 804, which occurs first because of the priority assignments, includes the generation of a message, as indicated by a seventh arrow 842 with a data box 842a. Execution of the sender block 802 includes the generation of a message, as indicated by an eighth arrow 844 with a data box 844a.

As noted, one or more of the message sequence diagrams generated by the auto diagram builder 126 may be dynamic. That is, the diagrams may change as the interactions among selected elements are displayed. For example, one or more of the diagrams may scroll to show new interactions, while previous interactions may disappear from view within the diagrams.

The auto diagram builder 126 may use one or more graphical affordances to indicate a message that has been successfully queued at the receiver, but not yet consumed. For example, an arrow that represents a message may be provided with a first graphical affordance when the message is generated and a second graphical affordance when the message is received. Reference is made to the eighth arrow 844 of the fifth message sequence diagram 800. When the message represented by the eighth arrow 844 is generated by the sender block 302 and successfully received at the receiver block 304, but not yet consumed by the receiver block 304, the auto diagram builder 126 may be configured to provide the arrow with a first graphical affordance, such as a dashed line. When the message represented by the arrow 844 is finally consumed by the receiver block 304, the auto diagram builder 126 may change its appearance, e.g., from a dashed line to a solid line. In this way, the auto diagram builder 126 may represent messages that are received and sitting in a queue, such as the receiver block's input queue (qIn) 312, but have yet to be consumed.

Task-Centric Diagrams

Message sequence diagrams 400-800 illustrate the interaction among entities or elements of the model 300, including graphical objects, such as blocks, and other entities, such as queues. Instead of viewing the interaction among model entities or elements, a user may be interested in observing the interaction among tasks implemented by the model compiler 110 to execute the model 300.

In an embodiment, the diagramming tool 122 may receive a command to create one or more message sequence diagrams that illustrate the interaction among a plurality tasks selected, e.g., by the user. For example, the UI in which the message sequence diagrams 400-800 are displayed may include a mode command field (not shown). The user may switch the mode command field from 'block' to 'task', and this command may be received by the diagramming tool 120. The auto diagram builder 126 may be configured to generate one or more message sequence diagrams presenting a task-centric view, as opposed to a model entity or element-centric view as shown in the message sequence diagrams 400-800 of FIGS. 4-8.

Figure 9:
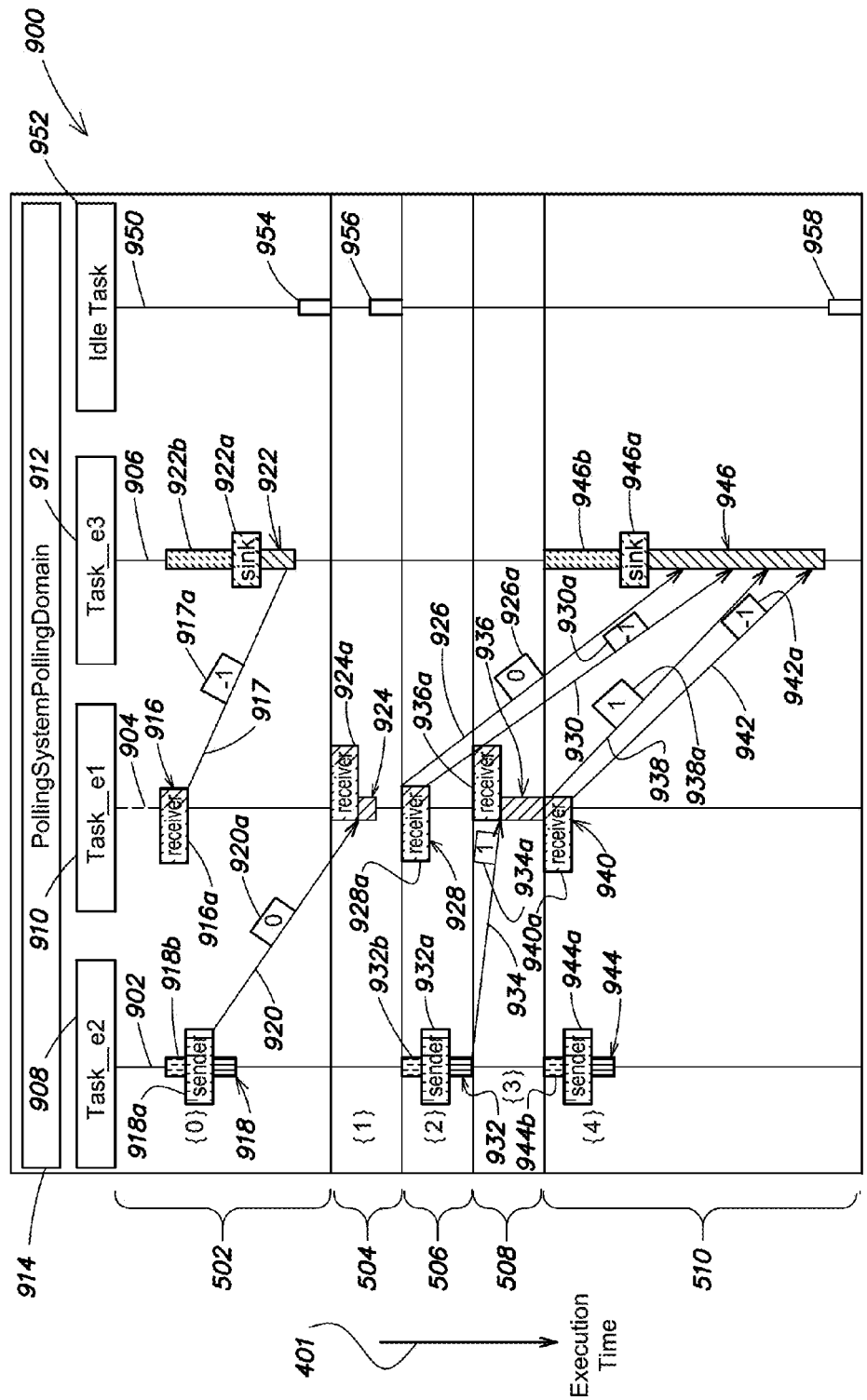
FIG. 9 is a highly schematic illustration of a task-centric message sequence diagram in accordance with an embodiment of the invention.

FIG. 9 is a schematic illustration of a first task-centric message sequence diagram 900 in accordance with an embodiment of the invention. The message sequence diagram 900 illustrates the interaction among tasks implemented by the model compiler 100 for executing the model 300. The interactions, moreover, may be shown in time-wise relationship, as illustrated by the execution time arrow 401. In an embodiment, the auto diagram builder 126 may scroll the diagram 900, e.g., upward, opposite the execution time arrow 401, to provide a new area at the bottom of the diagram 900 in which to show additional interactions. That is, the diagram 900 may be a dynamic diagram.

The auto diagram builder 126 may provide a lifeline for each of the tasks, such as a first lifeline 902 for the 'Task_e2' task, a second lifeline 904 for the 'Task_e1' task, and a third lifeline 906 for the 'Task_e3' task. Headers may be provided with the lifelines for presenting information about the respective tasks, such as their names. Specifically, the first lifeline 902 may include a first lifeline header 908, the second lifeline 904 may include a second lifeline header 910, and the third lifeline 906 may include a third lifeline header 912. In addition, an overall domain header, such as overall task domain header 914 may be included in the diagram 900 that provides information, such as the name, e.g., 'PollingSystemPollingDomain', of the domain of the tasks represented by the lifelines 902, 904, 906. In an embodiment, a fourth lifeline 950 with a fourth lifeline header 952 may be included to represent an idle task. The fourth lifeline 950 may be configured to indicate when a resource shared by the tasks, such as a processor or a core, is not being used during an epoch.

The auto diagram builder 126 may be configured to provide a graphical affordance that indicates the execution of a particular task. For example, the auto diagram builder 126 may include a task execution bar at the lifelines to represent the execution of the respective task. More specifically, during the first epoch 502, the 'Task_e1' task executes, as indicated by a first task execution bar 916. A task execution bar header portion may be provided that includes additional information regarding the respective task, such as the blocks or other model elements executed by the respective task. The first task execution bar 916 may include a first header portion 916a that specifies the one or more blocks or other model elements executed by that task, i.e., the receiver block 304. During execution of the 'Task_e1' task, a message is generated, as indicated by a first arrow 917 with a data box 917a. The message, moreover, is received by the 'Task_e3' task. The auto diagram builder 126 may place the tail of the arrow 917 at the lifeline of the task that generates the message, e.g., the second lifeline 904 for the 'Task_e1' task, and the head of the arrow 917 at the lifeline of the task receiving the message, e.g., the third lifeline 906 for the 'Task_e3' task.

Following execution of the 'Task_e1' task, the 'Task_e2' task executes, as indicated by a second task execution bar 918, which also includes a header portion 918 specifying the model elements executed by that task, i.e., the sender block 308. In an embodiment, the auto diagram builder 126 may be configured to use one or more graphical affordances to indicate when a task is ready to execute, and when that task is executing. For example, a portion of a task execution bar located below the header may represent the execution of the task, while a portion of the task execution bar above the header may represent a logical execution time when the task is ready to, but not yet, executing. The second task execution bar 918 may include a ready to execute portion 918b.

One or more graphical affordances may be used to distinguish the ready to execute portion of a task execution bar from the rest of the task execution bar. Exemplary graphical affordances include fill pattern, shading, coloring, etc. In an embodiment, the graphical affordance may be a variation of the fill pattern used for the task execution bar. In particular, when the fill pattern is vertical lines, as with the second task execution bar 918, the ready to execute portion 918b may have dashed vertical lines. Nonetheless, those skilled in the art will understand that other graphical affordances may be used.

As indicated by the ready to execute portion 918b of the second execution bar 918, the 'Task_e2' task was ready to execute at the same time as the 'Task_e1' task. However, because the 'Task_e1' task has a higher priority than the 'Task_e2' task, the 'Task_e2' task had to wait until the 'Task_e1' task completed before it could begin executing. In other words, the ready to execute portion 918b provides a visual indication of the execution of the 'Task_e2' task being preempted by the 'Task_e1' task, which has a higher priority. During execution of the 'Task_e2' task, a message is generated, as indicated by a second arrow 920 with a data box 920a.

Following execution of the 'Task_e2' task, the 'Task_e3' task executes, as indicated by a third task execution bar 922 of the diagram 900. The third task execution bar 922 also includes a header portion 922a that indicates the model elements executed by the task, i.e., the sink block 306, and a ready to execute portion 922b, indicating the logical execution time during which this task was ready to execute, but was not yet executing. As indicated by the ready to execute portion 922b, the 'Task_e3' task was also ready to execute at the same time as the 'Task_e1' and 'Task_e2' tasks. However, the 'Task_e3' task has a lower priority than these other two tasks, and thus the 'Task_e3' task had to wait unit the other two tasks completed before it could begin executing. At the completion of the 'Task_e3' task, the shared resource, e.g., the processor, falls idle before the end of the first epoch 502 and before the start of the second epoch 504, as indicated by a first idle bar 954 on the idle lifeline 950.

At the second epoch 504, only the 'Task_e1' task executes, as indicated by a fourth task execution bar 924. During execution of the 'Task_e1' task, in the second epoch 504, the message represented by the second arrow 920 is received, and a new message is generated, as indicated by a third arrow 926 having a data box 926a. At the completion of the 'Task_e1' task, the shared resource again falls idle before the end of the second epoch 504, as indicated by a second idle bar 956.

At the third epoch 506, the 'Task_e1' task executes, as indicated by a fifth task execution bar 928 having a header 928a. Execution of the 'Task_e1' task involves the generation of a message as indicated by a fourth arrow 930 with data box 930a. Next, the 'Task e_2' task executes as indicated by a sixth task execution bar 932 having a header 932a and a ready to execute portion 932b. Execution of the 'Task_e2' task includes the generation of a message as indicated by a fifth arrow 934 having a data box 934a.

At the fourth epoch 508, only the 'Task_e1' task executes, as indicated by a seventh task execution bar 936 with a header 936a. During execution of the 'Task_e1' task, the message represented by the fifth arrow 934 is received, and a new message is generated, as indcted by a sixth arrow 938 having a data box 938a. The shared resource, e.g., the processor, is in use during the entire third and fourth epochs 506 and 508. Accordingly, there are no idle bars on the idle lifeline 950 in the third or fourth epochs 506 and 508.

At the fifth epoch 510, the 'Task_e1' task executes, as indicated by an eighth task execution bar 940 having a header 940a. A message is generated during execution of the 'Task_e1' task, as indicated by a seventh arrow 942 having a data box 942a. Following the execution of the 'Task_e1' task, the 'Task_e2' task executes, as indicated by a ninth task execution bar 944 having a header portion 944a and a ready to execute portion 944b.

Because the fifth epoch 510 represents the last simulation step of the simulation time, there is no message generated by the sender block 302 during the fifth epoch, and thus no message arrow appears in the diagram 900.

Following the execution of the 'Task_e2' task, the 'Task_e3' task executes as indicated by a tenth task execution bar 946 having a header portion 946a and a ready to execute portion 946b. During execution of the 'Task_e3' task during the fifth epoch 510, the message represented by the arrows 926, 930, 938 and 942 are received and consumed. At the completion of the 'Task_e3' task, the shared resource again becomes idle before the end of the epoch 510, as indicated by a third idle bar 958 on the idle lifeline 950.

Triggering Execution

Referring to FIG. 3, as described above, the receiver block 304 was configured to execute at each simulation step where the sample time was a whole number, e.g., 0, 1, 2, 3, etc.

Suppose the receiver block 304 of the model 300 is modified so that it now executes when there is a message available on its input queue (qIn) 312. That is, suppose the receiver block 304 is re-configured as a message-triggered block. The model compiler 110 may generate execution instructions for the model 300, and the dynamic scheduler 118 may schedule the execution of the re-configured receiver block 304. Suppose the model compiler 110 implements two tasks for executing the sender, receiver, and sink blocks 302, 304, 306. Specifically, the model compiler 110 may implement an aperiodic task called 'Task_qIn' that executes the receiver block 304, and a periodic task called 'Task_e2' that executes the sender and sink blocks 302, 306. Suppose further that the model compiler 110 assigns a higher priority to the periodic 'Task_e2' task than to the aperiodic 'Task_qIn' task. The user may be interested in observing the interaction among the sender, receiver and sink blocks 302, 304, 306.

Figure 10:
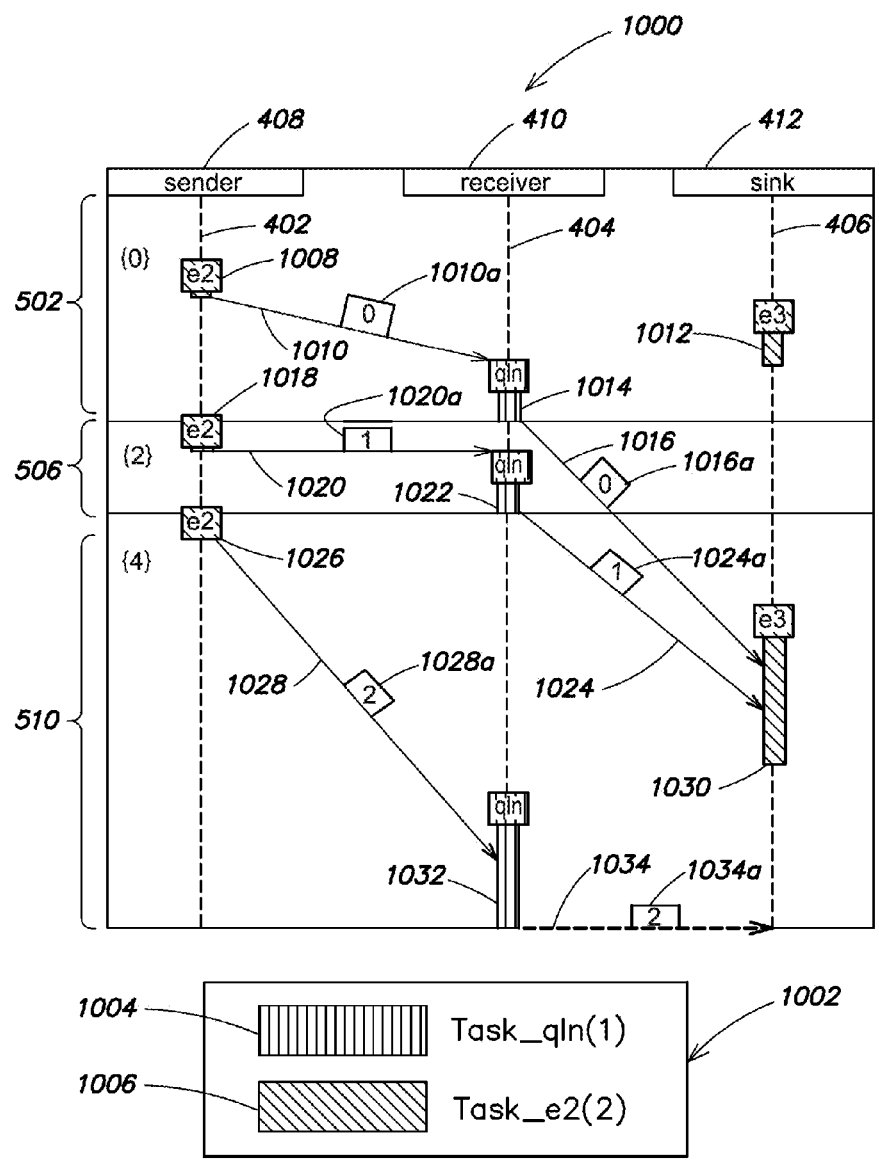
FIG. 10 is a highly schematic illustration of a message sequence diagram in accordance with an embodiment of the invention.

FIG. 10 is schematic illustration of a sixth message sequence diagram 1000 generated by the diagramming tool 120. The sixth message sequence diagram 1000 may include a legend block 1002 that indicates the fill pattern or color used to illustrate the different tasks. The legend block 1002 may include a first entry 1004 that indicates that the 'Task_qIn' task is represented with a vertical hash pattern, and a second entry 1006 that indicates that the 'Task_e2' task is represented with a backward hash pattern. Furthermore, the task 'Task_qIn' may have priority 1, and the task 'Task_e2' may have priority 2.

In the first epoch 502, the 'Task_e2' task first executes the sender block 302, as indicated by a first task activation bar 1008. During execution of the sender block 302, a message is generated, as indicated by a first arrow 1010 with a data box 1010a. The 'Task_e2' task next executes the sink block 306, as indicated by a second task activation bar 1012. The 'Task_qIn' task executes the receiver block 304, as indicated by a third task activation bar 1014. During execution of the receiver block 304, a message is generated, as indicated by a second arrow 1016 with a data box 1016a.

In this example, none of the sender, receiver, or sink blocks 302, 304, 306 execute during the second epoch when the simulation time corresponds to a sample time of 1, because the receiver block 304 is no longer configured to execute on simulation steps corresponding to whole number sample times. In an embodiment, the auto diagram builder 126 may be configured to omit from a message sequence diagram one or more epochs for a span of logical execution time during which no interaction among the selected model elements occurs. Thus, the second epoch 504 (FIG. 9) is not included in the sixth message sequence diagram 1000.

During the third epoch 506, the 'Task_e2' task executes the sender block 302, as indicated by a fourth task activation bar 1018. Execution of the sender block 302 includes the generation of a message, as indicated by a third arrow 1020 with a data box 1020a. The message represented by the third arrow 1020 is received at the input queue (qIn) 312 of the receiver block 304, which triggers the execution of the receiver block 304. Accordingly, the 'Task_qIn' task executes the receiver block 304 during the third epoch 506, as indicated by a fifth task activation bar 1022. Execution of the receiver block 304 includes the generation of a message, as indicated by a fourth arrow 1024 with a data box 1024a.

Once again, because no interactions and no execution of the sender, receiver, or sink blocks 302, 304, 306 occur during the fourth epoch 508 (FIG. 9), it is omitted from the sixth message sequence diagram by the auto diagram builder 126.

In the fifth epoch 510, the 'Task_e2' task first executes the sender block 302, as indicated by a sixth task activation bar 1026, and sends a message to the receiver block 304 as indicated by a fifth arrow 1028 with a data box 1028a. The 'Task_e2' task next executes the sink block 306, as indicated by a seventh task activation bar 1030. During execution of the sink block 306, the messages represented by arrows 1016 and 1024 are received and consumed by the sink block 306.

Because a message is available at the receiver block's input queue (qIn) 312, as indicated by the fifth arrow 1028, the 'Task_qIn' task executes the receiver block 304 during the fifth epoch 510, as indicated by an eighth task activation bar 1032. Execution of the receiver block 304 includes the generation of a message, as indicated by a sixth arrow 1034 having a data box 1034a. Because the message represented by the sixth arrow 1034 has been sent and received, but not yet consumed, the auto diagram builder 126 gives the sixth arrow 1034 an appearance that represents the message's status, e.g., a dashed as opposed to a solid line.

Suppose the priorities of the aperiodic 'Task_qIn' task and the periodic 'Task_e2 task, are switched so that the aperiodic 'Task_qIn' task has the higher priority. Suppose also that the user requests a task-centric message sequence diagram, rather than a model element centric diagram.

The model execution analyzer 122 may examine the execution instructions generated for the model 300, and the auto diagram builder 126 may create a task-centric message sequence diagram.

Figure 11:
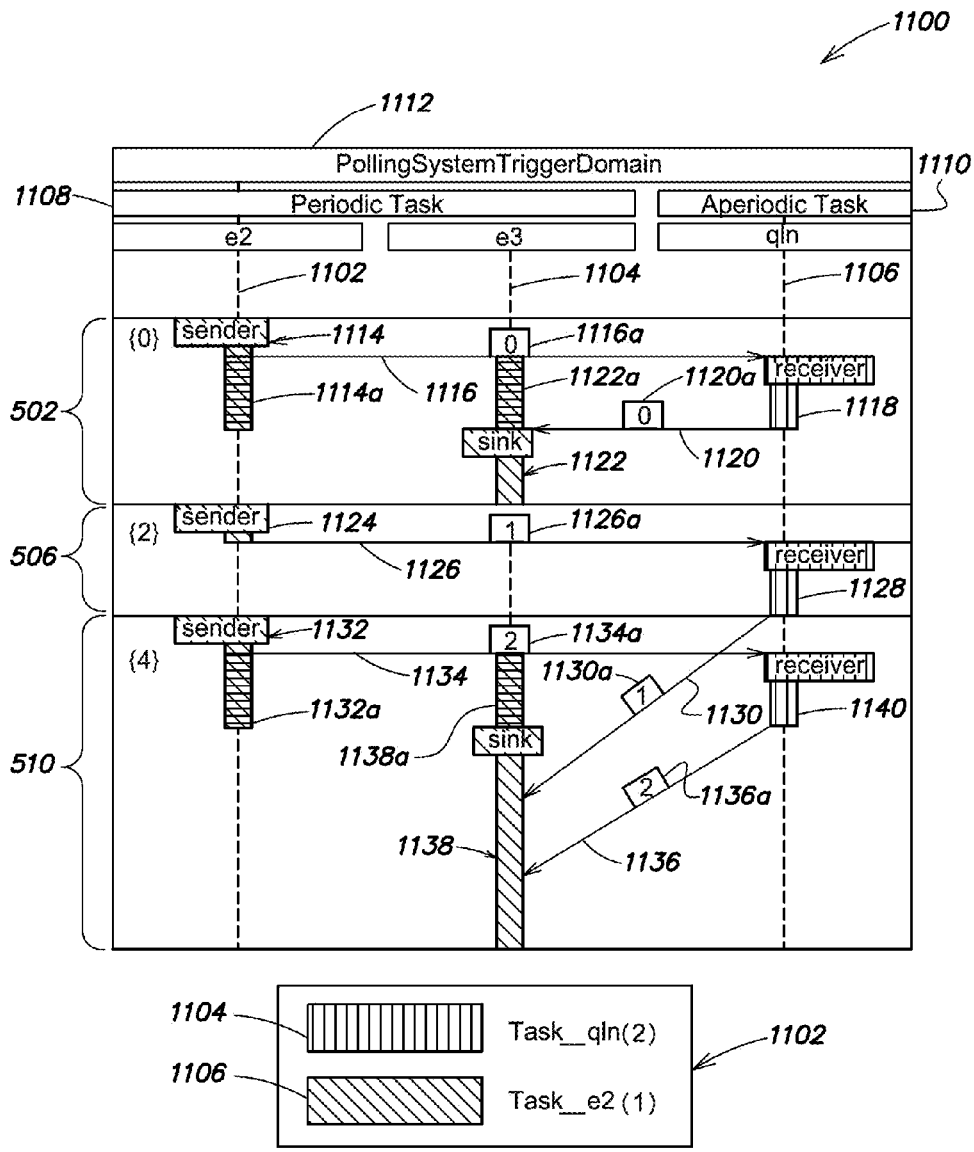
FIG. 11 is a highly schematic illustration of a task-centric message sequence diagram in accordance with an embodiment of the invention.

FIG. 11 is a schematic illustration of a second task-centric message sequence diagram 1100, which may include a legend block 1102 that indicates the fill pattern or color used to illustrate the different tasks. The legend block 1102 may include a first entry 1104 that indicates that the aperiodic 'Task_qIn' task is represented with a vertical hash pattern, and a second entry 1006 that indicates that the periodic 'Task_e2' task is represented with a backward hash pattern.

Here, the auto diagram builder 126 provides two lifelines for the periodic 'Task_e2' task. A first lifeline 1102 represents the periodic task's execution of the sender block 302, while a second lifeline 1104 represents the periodic task's execution of the sink block 306. A third lifeline 1106 represents the aperiodic 'Task_qIn' task. The first and second lifelines 1102, 1104 may share a header 1108, and the third lifeline 1106 may include a header 1110. In addition, an overall domain header 1112 may be included in the diagram 1100 that provides the name, e.g., 'PollingSystemTriggerDomain', of the domain of the tasks represented by the lifelines 1102, 1104, and 1106.

During the first epoch 502, the periodic 'Task_e2' task first executes the sender block 302, as indicated by a first task execution bar 1114. Even though the aperiodic task, 'Task_qIn', has a higher priority, it does not execute because the trigger, i.e., the availability of a message on the receiver block's input queue (qIn), is not satisfied. Execution of the sender block 302 includes the generation of a message, as indicated by a first arrow 1116 having a data box 1116a. The message is received at the receiver block's input queue (qIn) 312, which triggers the execution of the receiver block 304 by the 'Task_qIn' task, as indicated by a second task execution bar 1118. The execution of the receiver block 304 includes the generation of a message as indicated by a second arrow 1120 with a data box 1120a. The 'Task_e2' task then executes the sink block 306, as indicated by a third task execution bar 1122.

In an embodiment, the auto diagram builder 126 may be configured to use one or more graphical affordances to illustrate when a given task is blocked, e.g., by the execution of another task. Exemplary graphical affordances include color, shading, a fill pattern, etc. In an embodiment, the auto diagram builder uses a cross hatch fill pattern on the task execution bar to indicate a task that is currently blocked. The first task execution bar 1114, for example, may include a blocked portion 1114a. Similarly, the third execution bar 1122 may include a blocked portion 1122a. The blocked portions 1114a, 1122a illustrate that the 'Task_e2' task is blocked from executing by the execution of the higher priority task, the 'Task_qIn' task. The blocked portions end at the completion of the 'Task_qIn' task, at which logical execution time, the execution of the 'Task_e2' task resumes with the execution of the sink block 306. It should be understood that the diagram 1100 may include just a single blocked portion, i.e., 1114a or 1122a. A task may be blocked because data is not available or because another task has a lock on the location from where data is to be read or written. A task of lower priority may hold the lock but because it may be preempted by another, higher priority task (that does not hold the lock), the lower priority task can never complete and relinquish the lock.

In an embodiment, the auto diagram builder may be further configured to use one or more graphical affordances to indicate which task has a lock on a shared resource, such as a memory location, a queue, etc. For example, a color coding scheme where red represents a highest priority, blue represents a lowest priority, and other colors are used to represent other priorities may be used. In this way a message sequence diagram may indicate whether a task having a high priority fails to perform some operation, such as a write, because a low priority task with a lock on the target of the write is preempted from completing its operation by the high priority task.

At the third epoch 506 (again the second epoch 504 is omitted), the 'Task_e2' task executes the sender block 302 as indicated by a fourth task execution bar 1124. A message is generated by the 'Task_e2' task executing the sender block 302, as indicated by a third arrow 1126 with a data box 1126a. Receipt of the message triggers execution of the receiver block 304 by the 'Task_qIn' task, as represented by the fifth task execution bar 1128. Execution of the receiver block 304 includes the generation of a message as indicated by a fourth arrow 1130 with a data box 1130a. As shown, no blocking occurs during the third epoch 506.

During the fifth epoch 510 the 'Task_e2' task executes the sender block 302 as indicated by a sixth execution bar 1132. Execution of the sender block 302 includes the generation of a message that is received at the receiver block's input queue (qIn) 312 as indicated by a fourth arrow 1134 with a data box 1134a. The availability of the message at the receiver block 304 triggers its execution by the 'Task_qIn' task as indicated by a seventh task execution bar 1140. Execution of the receiver block 304 includes the generation of a message as indicated by a fifth arrow 1136 with a data box 1136a.

When the 'Task_qIn' task completes the execution of the receiver block 304, the 'Task_e2' task may resume with execution of the sink block 306 as indicated by an eighth task execution bar 1138. During execution of the sink block 306, the messages represented by the fourth and sixth arrows 1130, 1136 are received and processed. The sixth task execution bar 1132, which represents execution of the sender block 302, and the eighth task execution bar 1138 each include a blocking portion 1132a, 1138a, respectively. The blocking portions 1132a, 1138a indicate that execution of the 'Task_e2' task is blocked by the execution of the higher priority 'Task_qIn' task.

Function Calling

With reference to the model of FIG. 3, suppose the receiver block 304 is configured to issue a function call to the sender block 302, where the function call includes one or more input arguments. The sender block 302 performs the function and returns one or more output arguments to the receiver block 304. The receiver block 304 then generates a message with the one or more output arguments returned by the sender block 302. The message is received at the sink block 306 which displays the received value on a console. Suppose the receiver block 304 is configured to execute periodically, e.g., at each simulation step where the sample time is a whole number, e.g., 0, 2, 4, etc. Suppose further that the sink block 306 is also configured to execute periodically, e.g., at each simulation step where the sample time is a multiple of four, e.g., 0, 4, 8, etc.

The model compiler 110 may implement two periodic tasks for executing the receiver and sink blocks 304, 306, and a separate, event-driven task for executing the sender block 302.

The user may be interested in observing a visual of the interaction among the sender, receiver and sink blocks 302, 304, 306.

Figure 12:
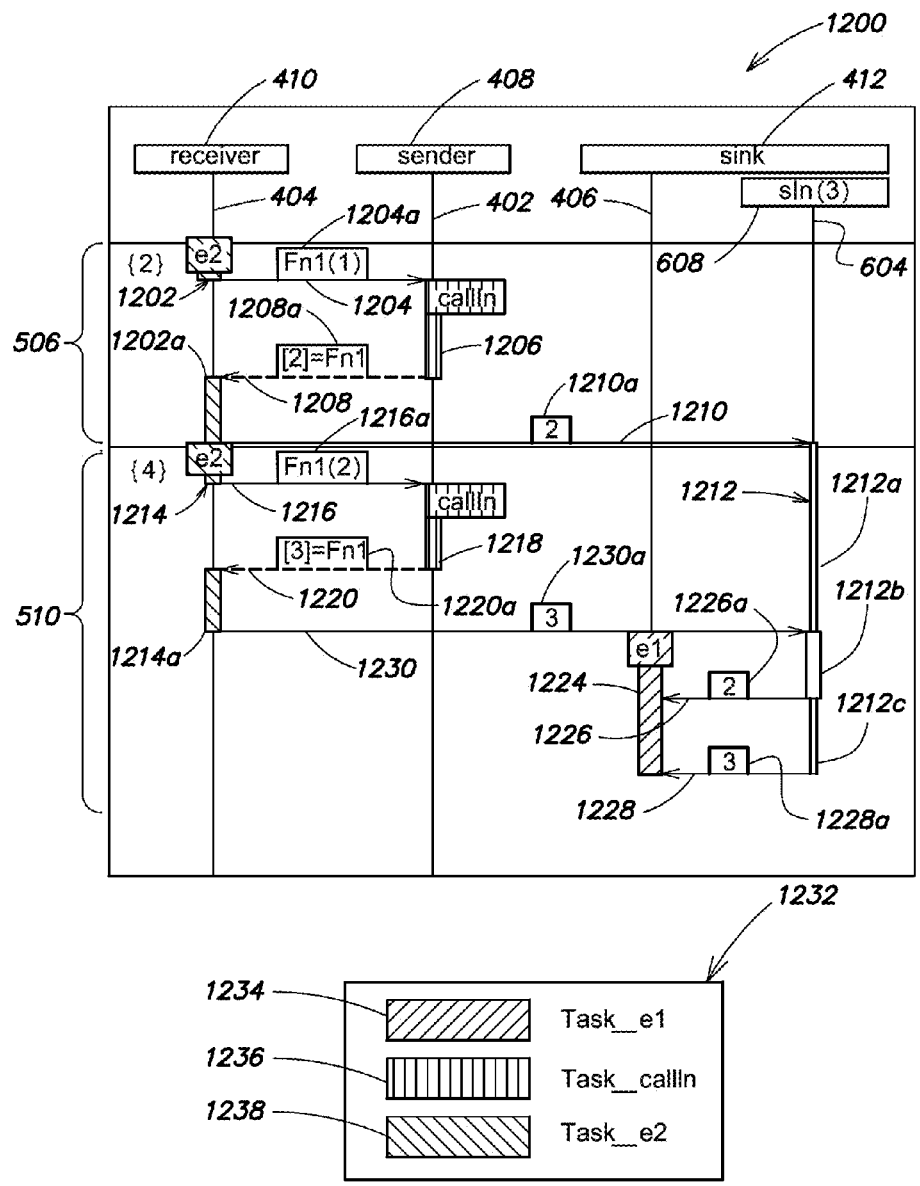
FIG. 12 is a highly schematic illustration of a message sequence diagram in accordance with an embodiment of the invention.

FIG. 12 is a schematic illustration of a seventh message sequence diagram 1200 in accordance with an embodiment of the invention. The seventh message sequence diagram 1200 may include a legend block 1232 that indicates the fill pattern or color used to illustrate the different tasks. The legend block 1232 may include a first entry 1234 that indicates that the 'Task_e1' task is represented with a forward hash pattern; a second entry 1236 that indicates that the 'Task_callIn' is represented with a vertical hash pattern; and a third entry 1238 that indicates that the 'Task_e2' is represented with a backward hash pattern. The diagram 1200 includes the three lifelines 402, 404, 406 for the sender, receiver and sink blocks 302, 304, 306, and the fourth lifeline 604 for the sink block's queue (sIn) 312.

During the third epoch 506, which corresponds to a simulation step where the sample time is 2, the 'Task_e2' task executes the receiver block 304 as indicated by a first task activation bar 1202. In this example, execution of the receiver block 304 involves issuing a function call to the sender block 302. The auto diagram builder 126 may use one or more graphical affordances to represent the function call. In an embodiment, the auto diagram builder 126 may represent a function call with a solid line arrow where the tail of the arrow is located at the lifeline of the block issuing the function call, and the head of the arrow is located at the lifeline of the block being called.

A first arrow 1204 represents the function call by the receiver block 304 to the sender block 302. The first arrow 1204 may include a data box 1204a that includes information about the function, such as the function's name, e.g., 'Fn1( )', and the one or more input arguments with which the function is being called, e.g., '1'.

Receipt of the function call by the sender block 302 triggers execution of the sender block, as indicated by a second task activation bar 1206. In this example, the sender block 302 is executed by the 'callIn' task, which is different from the 'e2' task that executes the receiver block 304. The 'callIn' task executes the sender block 302, which involves executing the called function, i.e., 'Fn1( )', with the input argument(s), i.e., 1. The auto diagram builder 126 may use one or more graphical affordances to illustrate the function reply from the called function to the caller function. In an embodiment, the auto diagram builder may use a dashed line arrow whose tail is located at the lifeline of the called function, and whose head is located at the caller function. A second arrow 1208 represents the function reply from the sender block 302 to the receiver block 304. The second arrow 1208 may include a data box 1208a that includes information about the called function, such as the function's name, e.g., 'Fn1( )', and the return or output argument, e.g., 2. By way of example, the notation of the MATLAB programming language is used, e.g., [2]=Fn1(1).

The 'Task_e2' task then resumes execution of the receiver block 304, as indicated by a resumed portion 1202a of the first task activation bar 1202. The gap appearing between the initial portion of the first task activation bar 1202 and the resumed portion 1202a indicates that the 'Task_e2' task was blocked by execution of the 'Task_callIn' task illustrated by the second task activation bar 1206. That is, the function call to the sender block 302 is a blocking function call. With the resumption of the execution of the receiver block 304, a message is generated, as indicated by a third arrow 1210 having a data box 1210a. The head of the third arrow 1210 joins the lifeline 604 for the sink's input queue (sIn) 316, and a first queue depth element 1212 at the lifeline 604 includes a first portion 1212a, which indicates that the sink's input queue (sIn) 316 now contains one message.

During the fifth epoch 510, the 'Task_e2' task commences execution of the receiver block 304 as indicated by a third task activation element 1214. A fourth arrow 1216 indicates a function call by the receiver block 304 to the sender block 302. The fourth arrow 1216 includes a data box 1216a that includes the name of the function and the input argument, i.e., 'Fn1(2)'. The receipt of the function call triggers the execution of the sender block 302. In particular, the 'Task_callIn' task executes the sender block 302, as indicated by a fourth task activation element 1218, which includes execution of the called function. This includes sending a function reply to the receiver block 304, as indicated by a fourth arrow 1220 with a data box 1220a that includes the output arguments, e.g., '[3]=Fn1'. Execution of the receiver block 304 is then resumed by the 'Task_e2' task, as indicated by the resumed portion 1214a of the third task activation bar 1214. Again, the gap appearing between the initial portion of the third task activation bar 1214 and the resumed portion 1214a indicates that the 'Task_e2' task was blocked during execution of the sender block 302 by the 'Task_callIn' task, which has a higher priority than the 'Task_e2' task. Resumed execution of the receiver block 304 includes the generation of a message, as indicated by sixth arrow 1230 with a data box 1230a. The head of the sixth arrow 1230 is located at the lifeline 604 for the sink's input queue (sIn) 316, and a second portion 1212b of the queue depth bar 1212, which is wider than the first portion 1212a, indicates that the queue now contains two messages.

The 'Task_e1' task executes the sink block 306 during the fifth epoch 510 as indicated by a fifth task activation element 1224. The sink block 306 consumes the messages in its input queue (sIn) 316, as indicated by seventh and eighth arrows 1226 and 1228 with data boxes 1226a and 1228a. After the first message is consumed, a third portion 1212c of the queue depth bar 1212, which is narrower than the second portion 1212b, indicates that the queue only contains a single message. After the last message in the input queue, sIn, 316 is consumed, as indicated by the eighth arrow 1228, the queue depth bar 1212 terminates.

Missed Deadline

Suppose that the sender block 302, in addition to being called by the receiver block 304 to perform the Fn1 function is configured to delay responding to the receiver block 304, e.g., by one second. The model compiler 110 may be configured to define two tasks for executing the sender, receiver, and sink blocks 302, 304, 306. The sender block 302 may be executed by an aperiodic task, while the receiver and sink blocks 304 may be executed by a periodic task. Again, the user may want to observe the interactions among the sender, receiver and sink blocks 302, 304, 306 in this scenario.

Figure 13:
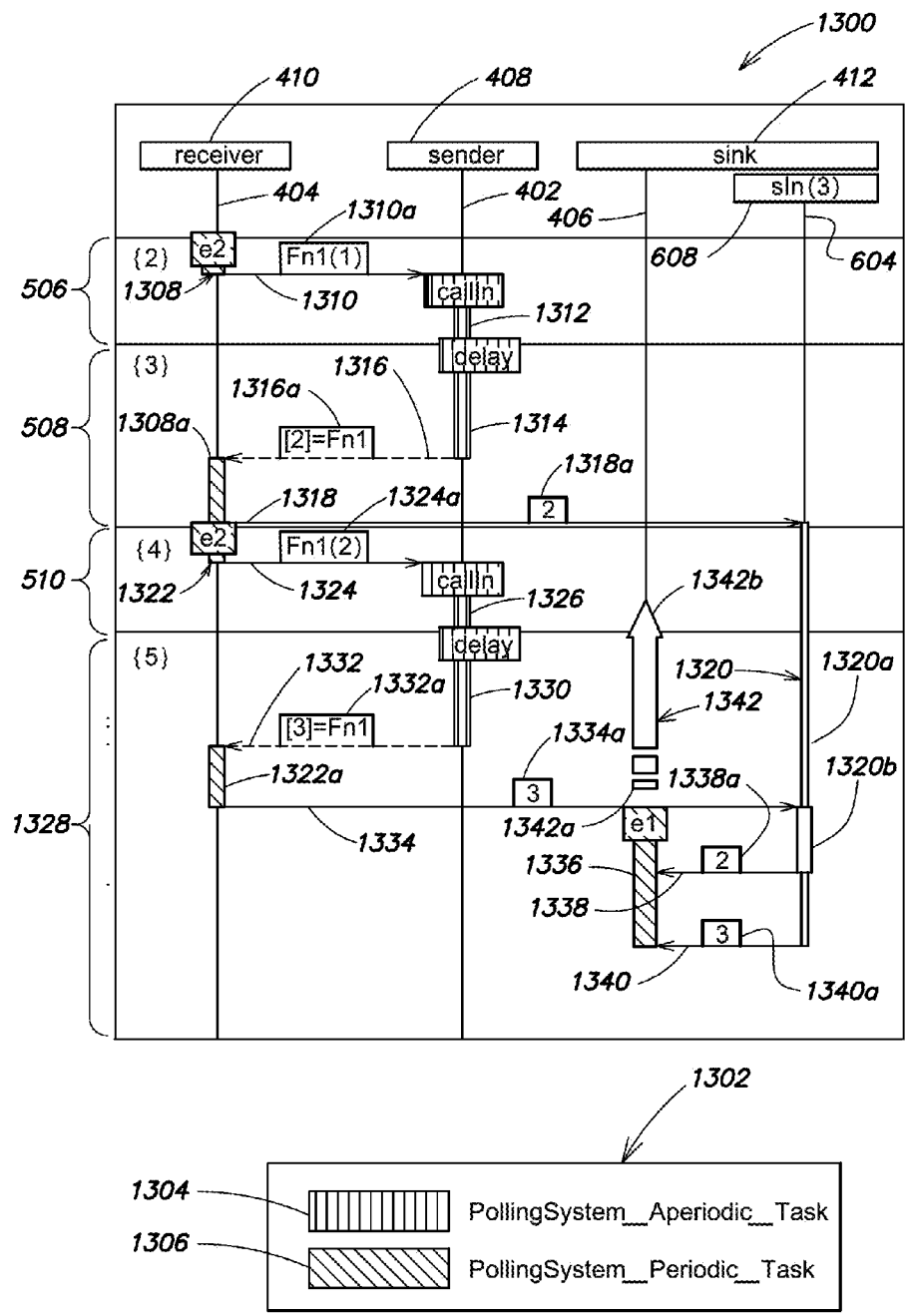
FIG. 13 is a highly schematic illustration of a message sequence diagram in accordance with an embodiment of the invention.

FIG. 13 is a schematic illustration of an eighth message sequence diagram 1300 in accordance with an embodiment of the invention. The eighth message sequence diagram 1300 may include a legend block 1302 that indicates the fill pattern or color used to illustrate the different tasks. The legend block 1302 may include a first entry 1304 that indicates that the 'PollingSystem_Aperiodic_Task' task is represented with a vertical hash pattern; and a second entry 1306 that indicates that the 'PollingSystem_Periodic_Task' task is represented with a backward hash pattern. The diagram 1200 includes the three lifelines 402, 404, 406 for the sender, receiver and sink blocks 302, 304, 306, and the fourth lifeline 604 for the sink block's queue (sIn) 316.

During the third epoch 506, which corresponds to a simulation step where the sample time is 2, the 'PollingSystem_Periodic_Task' task executes the receiver block 304 as indicated by a first task activation bar 1308. A first arrow 1310 with a data box 1310a indicates a function call by the receiver block 304 to the sender block 302. Receipt of the function call by the sender block 302 triggers execution of the sender block by the 'PollingSystem_Aperiodic_Task' task as indicated by a second task activation bar 1312, which represents execution of the function call. In this example, however, the function reply is not sent during the third epoch 506. Instead, the 'PollingSystem_Aperiodic_Task' task executes the delay portion of the sender block 302 during the fourth epoch 508 as indicated by a third task activation bar 1314. At the end of the delay, the function reply is issued, as indicated by a second arrow 1316 with a data box 1316a. The 'PollingSystem_Periodic_Task' task continues execution of the receiver block 304, during the fourth epoch 508, as indicated by a resumed portion 1308a of the first task activation bar 1308. The gap appearing between the initial portion of the first task activation bar 1308 and the resumed portion 1308a indicates that the 'PollingSystem_Periodic_Task' task was blocked due to the 'PollingSystem_Aperiodic_Task' task's execution of the sender block 302, as illustrated by the second and third activation bars 1312, 1314. That is, the function call to the sender block 302 is a synchronous function call. With the resumption of the execution of the receiver block 304, a message is generated, as indicated by a third arrow 1318 having a data box 1318a. The head of the third arrow 1210 joins the lifeline 604 for the sink's input queue (sIn) 316, and a queue depth element 1320 at the lifeline 604 includes a first portion 1320a, which indicates that the sink's input queue (sIn) 316 now contains one message.

During the fifth epoch 510, the 'PollingSystem_Periodic_Task' task commences execution of the receiver block 304 as indicated by a fifth task activation bar 1322. A fourth arrow 1324 having a data box 1324a represents a second function call by the receiver block 304 to the sender block 302. Once again, receipt of the function call triggers the execution of the sender block 302 by the 'PollingSystem_Aperiodic_Task' task during the fifth epoch 510, as indicated by a fifth task activation bar 1326. Nonetheless, the function reply is not sent during the fifth epoch 510. Instead, the reply is sent during a sixth epoch 1328, which corresponds to a simulation step where the sample time is 5. In particular, the 'PollingSystem_Aperiodic_Task' task performs the delay portion of the sender block 302, as indicated by a sixth task activation bar 1330, which occurs during the sixth epoch 1328.

The function reply is sent to the receiver block 304 during the sixth epoch 1328, as indicated by a fifth arrow 1332 with a data box 1332a. Execution of the receiver block 304 is then resumed by the 'PollingSystem_Periodic_Task' task, as indicated by the resumed portion 1322a of the third task activation bar 1322. Again, the gap appearing between the initial portion of the third task activation bar 1322 and the resumed portion 1322a indicates that the 'PollingSystem_Periodic_Task' task was blocked during execution of the sender block 302 by the 'PollingSystem_Aperiodic_Task' task, which has a higher priority. Resumed execution of the receiver block 304 includes the generation of a message during the sixth epoch 1328, as indicated by a sixth arrow 1334 with a data box 1334a. The head of the sixth arrow 1334 is located at the lifeline 604 for the sink's input queue (sIn) 316, and a second portion 1320b of the queue depth bar 1320, which is wider than the first portion 1320a, indicates that the queue now contains two messages.

The 'PollingSystem_Periodic_Task' task executes the sink block 306 during the sixth epoch 1328 as indicated by a seventh task activation bar 1336. The sink block 306 consumes the messages in its input queue (sIn) 316, as indicated by seventh and eighth arrows 1338 and 1340 with data boxes 1338a and 1340a. After the first message is consumed, a third portion 1320c of the queue depth element 1320, which is narrower than the second portion 1320b, indicates that the queue only contains a single message. After the last message in the input queue (sIn) 316 is consumed, as indicated by the eighth arrow 1340, the queue depth element 1320 terminates, thereby indicating there are no more messages in the sink block's input queue (sIn) 316.

As noted, the sink block 306 is configured so as to execute on a periodic basis. Specifically it should execute during the simulation steps when the sample time is a multiple of four, e.g., 0, 4, 8, 12, etc. Thus, the sink block 306 should have executed during the fifth epoch which corresponds to a sample time of 4. However, as shown in the eighth message sequence diagram 1300, the sink block 306 did not execute until the sixth epoch 1328, which corresponds to a sample time of 5. The execution of the sink block was thus late. The auto diagram builder 126 may be configured to represent the late execution of a selected model element using one or more graphical affordances. For example, the auto diagram builder 126 may use a striped block arrow that points to where the model element should have executed. Accordingly, the auto diagram builder may include a late execution arrow 1342 in the eighth message sequence diagram 1300. The late execution arrow 1342 may be disposed on or adjacent to the lifeline of the model element whose execution was delayed. In this case, the late execution arrow 1342 may be disposed on the sink's lifeline 408. In addition, the late execution arrow 1342 may have a tail 1342a that is positioned at the task activation bar 1336 whose execution ran late, and a head 1342b that points to the location at which the task should have occurred, e.g., during the fifth epoch 510.

Repeating Patterns

The model execution analyzer 122 may be configured to identify repeating patterns of interactions or executions of the selected elements during the execution of a model. In addition, the auto diagram builder 126 may be configured to represent these repeating patterns in a message sequence diagram.

For example, suppose the model 300 is configured to execute over a logical execution time of 1 to 40 seconds. Suppose further that the model execution analyzer 122 identifies one or more repeating patterns of interaction among the selected elements, e.g., the sender, receiver and sink blocks 302, 304, 306. The auto diagram builder 126 may present the one or more repeating patterns in a message sequence diagram.

Figure 14:
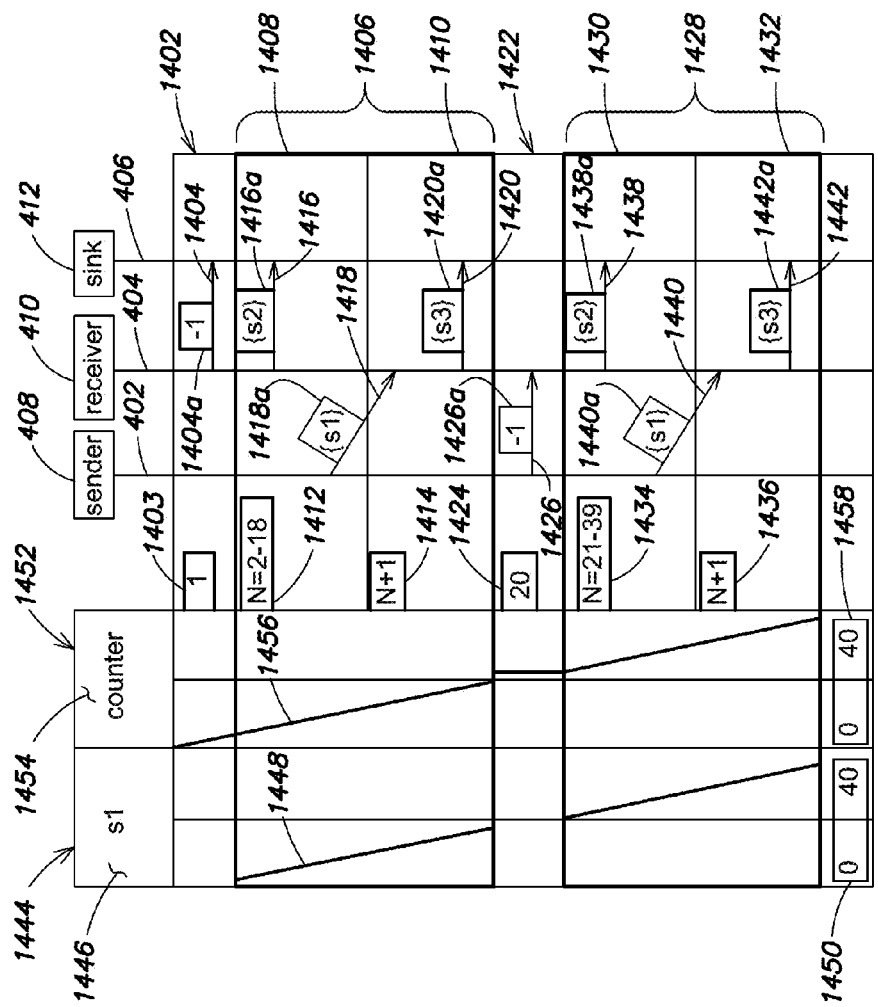
FIG. 14 is a highly schematic illustration of a message sequence diagram in accordance with an embodiment of the invention.

FIG. 14 is a schematic illustration of a ninth message sequence diagram 1400 according to an embodiment of the invention. The diagram 1400 may include the first, second and third lifelines 402, 404, 406 and the headers 408, 410, 412. The diagram 1400 may include a first epoch 1402 which corresponds to a logical execution time of 1 second, as indicated by a first label element 1403. During the first epoch 1402, the receiver block 304 sends a message with a payload of −1 to the sink block 306, as indicated by a first arrow 1404 with a data box 1404a. For the epochs that correspond to the logical execution times from 2 to 19 seconds, the auto diagram builder 126 may provide one or more graphical affordances that represent a repeating pattern detected by the model execution analyzer 122. In particular, the auto diagram builder 126 may include a first repeating pattern window 1406. The window 1406 includes a first section 1408 and a second section 1410. The first repeating pattern window 1406 corresponds to the logical execution time from 2 to 19 seconds. The first section 1408 corresponds to the logical execution times 2, 4, 6, 8, etc. up to 18, as indicated by a second label element 1412, and the second section 1410 corresponds to logical execution times 3, 5, 7, etc. up to 19, as indicated by a third label element 1414.

During each of the logical execution times represented by the first section 1408, the receiver block 304 sends a message to the sink block 306 with a payload and the message is received in the same logical execution time, as represented by a second arrow 1416 with a data box 1416a in the first section 1408. Because the value of the message payload changes, the auto diagram builder 126 may be configured to represent the payload of the message with a variable, such as 's2'. Also during each of the logical execution times represented by the first section 1408, the sender block 302 sends a message to the receiver block 304 with a payload and the message is received in the next logical execution time, as indicated by a third arrow 1418 with a data box 1418a where the payload of the message is represented by a variable 's1'. During each of the logical execution times represented by the second section 1410, the receiver block 304 receives the message generated by the sender block 302 in the previous logical execution time. The receiver block 304 also generates a message with a payload that is received by the sink block 306, as indicated by a fourth arrow 1420 with a data box 1420a where the payload of the message is represented by a variable 's3'.

The diagram 1400 may include a second epoch 1422 that corresponds to a logical execution time of 20 seconds, as indicated by a label 1424. During the second epoch 1422 the sender block 302 generates a message with a payload of −1, and the message is received by the receiver block 410, as indicated by a fifth arrow 1426 with a data box 1426a.

The auto diagram builder 126 may include a second repeating pattern window 1428. The second window 1428 includes a first section 1430 and a second section 1432. The second repeating pattern window 1428 corresponds to the logical execution times from 21 to 40 seconds. The first section 1430 corresponds to the logical execution times 21, 23, 25, 27, etc. up to 39, as indicated by a label element 1434, and the second section 1432 corresponds to the logical execution times 22, 24, 26, etc. up to 40, as indicated by a label element 1436.

During each of the logical execution times represented by the first section 1430 of the second repeating pattern window 1428, the receiver block 304 sends a message to the sink block 306 with a payload and the message is received in the same logical execution time, as represented by a sixth arrow 1438 with a data box 1438a in the first section 1430. Also during each of the logical execution times represented by the first section 1430, the sender block 302 sends a message to the receiver block 304 with a payload and the message is received in the next logical execution time, as indicated by a seventh arrow 1440 with a data box 1440a. During each of the logical execution times represented by the second section 1432, the receiver block 304 receives the message generated by the sender block 302 in the previous logical execution time. The receiver block 304 also generates a message with a payload that is received by the sink block 306, as indicated by an eighth arrow 1442 with a data box 1442a.

The auto diagram builder 126 may be configured to provide one or more graphical affordances that indicate the values of the variables used in the message sequence diagram 1400. For example, the auto diagram builder 126 may include a variable element 1444 in the diagram 1400. The variable element 1444 may include a header 1446 that contains information about the variable, such as its name, i.e., 's1', a trace 1448 that indicates the value of the variable over the execution time, and a scale 1450 for the trace 1448. The trace 1448 may be vertically arranged and may be aligned with the epochs 1402, 1422, and the repeating pattern windows 1406, 1428 of the diagram to provide an indication of the value of the variable at the logical execution times represented by the epochs 1402, 1422, and the repeating pattern windows 1406, 1428. For example, the variable element 1444 indicates that the value of the s1 variable during the first epoch 1402 is zero. During the first repeating pattern window 1406, when the logical execution times goes from 2 to 19, the value of s1 increases from zero to 18. During the second epoch 1422, s1 has no value because the set s1 does not exist in the second epoch 1422. During the second repeating pattern window 1428, the value of s1 increases from 21 to 39. In an embodiment, the values of the variable s1 as presented in the trace 1448 may not be discretized across the repeating pattern windows 1406 and 1428. Instead, the trace 1448 may indicate a change in value of the variable s1 from a beginning value, e.g., 0, to an ending value, e.g., 19, as illustrated with reference to the first repeating pattern window 1406. The user interface engine 128 may be configured to illustrate the change in value of the variable s1 in the trace 1448 in a linear manner or, alternatively, in other ways, e.g., as one or more steps.

The auto diagram builder 126 also may include a signal trace element 1452 that represents the value of the counter signal of the counter block 308 in the diagram 1400. The signal trace element 1452 may include a header 1454 with information about the counter signal, such as its name, i.e., 'counter', a trace 1456 of the value of the counter signal, and a scale 1458.

In an embodiment, repeating patterns may be identified by a user to the diagramming tool 120 using a language that contains constructs for defining sequence, choice, iteration, etc. For example, the patterns of FIG. 14 may be described as:

[s1,s2,s3]=
{itr(*)
{seq
{receiver→sink {s2},sender→receiver {s1}, receiver→sink {s3} }
}
}

In natural language, this code snippet may mean: 'match any number of a sequence of messages containing first a message from receiver to sink, then a message from sender to receiver, and finally a message from receiver to sink'. The respective payloads are returned in collections s1, s2 and s3. These patterns may be entered by the user before any given simulation of the model. The diagramming tool 120 may also have a default set of patterns that it matches. The extent of the semantics of the language, and particularly the extent to which it can be parameterized may govern the patterns that can be described by the user.

By examining the diagram 1400, a user may identify anomalies in the execution of the program 300. For example, the user may expect to see a single repeating patter window for the entire logical execution time. Accordingly, when the user observes the presence of two repeating pattern windows 1408, 1428, and two individual epochs 1402, 1422, the user may realize that the program is not executing as intended, and may make edits or changes to the program.

Method Execution During Epochs

In an embodiment, the model execution analyzer 122 may be configured to determine from a model's execution schedule when particular methods or functions execute during one or more epochs. In addition, the diagramming tool 120 may be configured to use one or more graphical affordances in a message sequence diagram to indicate when the methods execute during the one or more epochs. Suppose, for example, that a model includes a sender block that is connected to a receiver block, which in turn is connected to a sink block. Suppose further that the receiver block executes at a higher rate than the sender and the sink blocks. In this case, rate transition blocks may be added between the sender and receiver blocks, and between the receiver and sink blocks to manage these different execute rates of the blocks. Suppose further that at least some blocks of a model have a plurality of methods that are executed during execution of the model. In the Simulink modeling environment from The MathWorks, Inc., there are block output methods and block update methods that are evaluated, e.g., executed, during the execution of the model. The output method for a given block computes the block's outputs based upon the block's inputs at the current time step and the block's states as determined at the previous time step. The update method for a given block computes the values of the block's states (e.g., discrete states) at the current time step based on the block's inputs and current time step and the block's states (e.g., discrete states) at the previous time step. It should be understood that additional and/or other methods may be defined, such as a derivatives method which computes the derivatives of the block's continuous states at the current time step based on the block's inputs and the values of the block's states at the previous time step.

In some embodiments, a block or other graphical object of a model may have multiple outputs. For example, there may be one output method per output port of a block, one output method per output port that has a direct relation with an input port, etc. The different output methods may be determined based on the block's context within the model in which the block is used, e.g., how the block's input and output ports are connected to other blocks/ports of the model.

Figure 16:
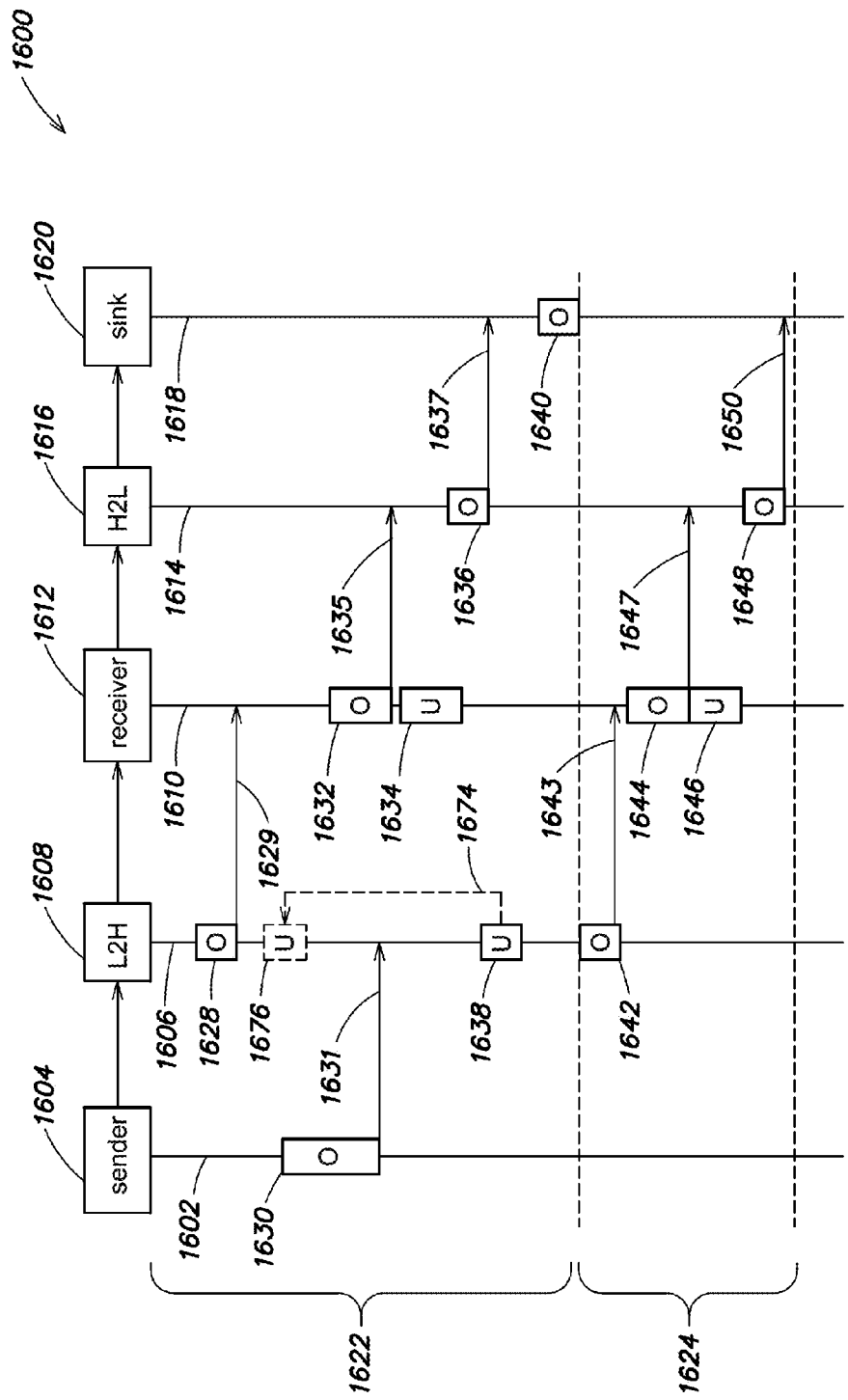
FIG. 16 is a highly schematic illustration of a message sequence diagram in accordance with an embodiment of the invention.

FIG. 16 is a schematic illustration of a message sequence diagram 1600 automatically generated by the diagramming tool 120 and presented to a user, e.g., on a display. The message sequence diagram 1600 may include a first lifeline 1602 and a first header 1604 for the model's sender block, a second lifeline 1606 and a second header 1608 for the first rate transition block, which may perform a low-to-high (L2H) rate transition, a third lifeline 1610 and a third header 1612 for the receiver block, a fourth lifeline 1614 and a fourth header 1616 for the second rate transition block, which may perform a high-to-low (H2L) rate transition, and a fifth lifeline 1618 and a fifth header 1620 for the sink block. Arrows between the headers 1604, 1608, 1612, 1616, and 1620 may indicate the relationship among the corresponding blocks in the model. The message sequence diagram 1600 further includes graphical affordance, e.g., dashed horizontal lines, that identify different epochs, such as a first epoch 1622 and a second epoch 1624. Within the first epoch 1622, the first rate transition block executes its output method, as indicated by the bar element 1628 labeled 'O' for output on the second lifeline 1606. Execution of the first rate transition block's output method involves sending a message from the first rate transition block to the receiver block as indicated by the arrow 1629 extending between the second and third lifelines 1606 and 1610. The sender block then executes its output method, as indicated by the bar element 1630 also labeled 'O' for output on the first lifeline 1602. Execution of the sender block's output method involves sending a message from the sender block to the first rate transition block, as indicated by the arrow 1631. The receiver block then executes its output and update methods labeled 'O' for output and 'U' for update as indicated by bar elements 1632 and 1634 on the third lifeline 1610. Execution of the receiver block's output method involves sending a message from the receiver block to the second rate transition block, as indicated by the arrow 1635. The second rate transition block executes its output method as indicated by the bar element 1636 on the fourth lifeline 1614, which involves sending a message from the second rate transition block to the sink block as indicated by the arrow 1637. This is followed by the execution of the first rate transition block's update method as indicated by bar element 1638. Finally, the sink block executes its output method as indicated by the bar element 1640 on the fifth lifeline 1618.

During the second epoch 1624, the first rate transition block executes its output method as indicated by bar element 1642 on the second lifeline 1606. Execution of the first rate transition block's output method involves sending a message from the first rate transition block to the receiver block as indicated by the arrow 1643. The output and update methods of the receiver block then execute as indicted by the bar elements 1644 and 1646. Execution of the receiver block's output method involves sending a message to the second rate transition block as indicated by the arrow 1647. Execution of the receiver block's output and update methods is followed by the execution of the second rate transition block's output method as indicated by the bar element 1648 on the fourth lifeline 1614. Execution of the second rate transition block's output method involves sending a message to the sink block as indicated by the arrow 1650.

Editing Message Sequence Diagrams to Change Model Execution

In an embodiment, the message sequence diagram 1600 may be user-editable and/or support user interaction. Suppose, for example, that upon reviewing the message sequence diagram 1600, the user would like to change the order of occurrence of one or more of the methods within a given epoch or even from one epoch to another. The user may select the one or more methods and move it along its lifeline to a desired location, such as with a drag and drop or other GUI-based operation. The desired location may be in relation to the occurrence of other methods by the same or by different blocks, e.g., before or after a particular method executes. For example, suppose that the user decides that the update method of the first rate transition block during the first epoch 1622, as indicated by the bar element 1638, should occur immediately after the first rate transition block's output method, as indicated by the bar element 1628. The user may manipulate the message sequence diagram 1600 to move the bar element 1638 along the second lifeline 1606 to the desired location, as indicated by dashed arrow 1674 and dashed bar element 1676. A user may similarly move a bar element representing the execution of a particular method from one epoch to another epoch.

The user interface engine 128 may be configured to detect such edits to the message sequence diagram 1600. The diagramming tool 120 may be configured to instruct the simulation engine 106 to modify the model's execution schedule to reflect the new schedule as presented on the revised version of the message sequence diagram 1600. The model execution analyzer 122 may be configured to determine whether such a change to the model's execution schedule may affect the results computed by the model during execution. For example, the model execution analyzer 122 may be configured to permit a user to move update methods anywhere within a message sequence diagram but before the output method of the same block. The user interface engine 128 may be configured to disallow such actions by for example 'snapping back' the bar element to a permitted location or position in the message sequence diagram. The model execution analyzer 122 may further be configured to disallow moving a method before an arrow that indicates a write to the method. For example, arrow 1631 may communicate data to update method represented by bar element 1638, and so moving the bar element 1638 before the arrow 1361 on the life line 1606 may be disallowed by the model execution analyzer 122. If the user tries to perform such a move, the user interface engine 128 may be configured to present a warning or an indication that such a move may change the execution results of the model. Similarly, moving output methods may be permitted provided that the output methods are not moved to a new location that is before an arrow that writes data that the output method uses as input. For example, while it may be permitted to move bar element 1630 after execution of bar element 1634, but still before execution of bar element 1638, if the execution of bar element 1636 is moved to a position or location before the execution of bar element 1632, the model execution analyzer 122 may determine that such a change may cause the model to compute a different result, and the change may be disallowed and/or a warning presented.

In an embodiment, the model execution analyzer 122 may be configured to evaluate a dependency graph, which may be created by the IR builder 114 from the model. The dependency graph may represent a partial execution order of the blocks and thus of the blocks' methods. If an attempt is made to move the execution of an output method such that the resulting overall list of methods remains consistent with the partial execution order, the results computed by the model may not change, and such an interaction may be permitted by the model execution analyzer 122.

It should be understood that the message sequence diagram 1600 of FIG. 16 is meant for illustrative purposes, and the invention may be used in other environments. For example, one or more blocks may have multiple output and/or update methods in a given epoch.

Suppose that the model illustrated in the message sequence diagram 1600 of FIG. 16 is executed on one or more multi-core processing units, and the block methods are assigned for execution on the different cores, e.g., by the simulation engine 106. The model execution analyzer 122 may be configured to determine from a model's execution schedule the particular processing cores on which the methods or functions associated with the blocks execute during one or more epochs. In addition, the diagramming tool 120 may be configured to use one or more graphical affordances in a message sequence diagram to indicate which core executes the methods or functions during the one or more epochs.

Figure 17:
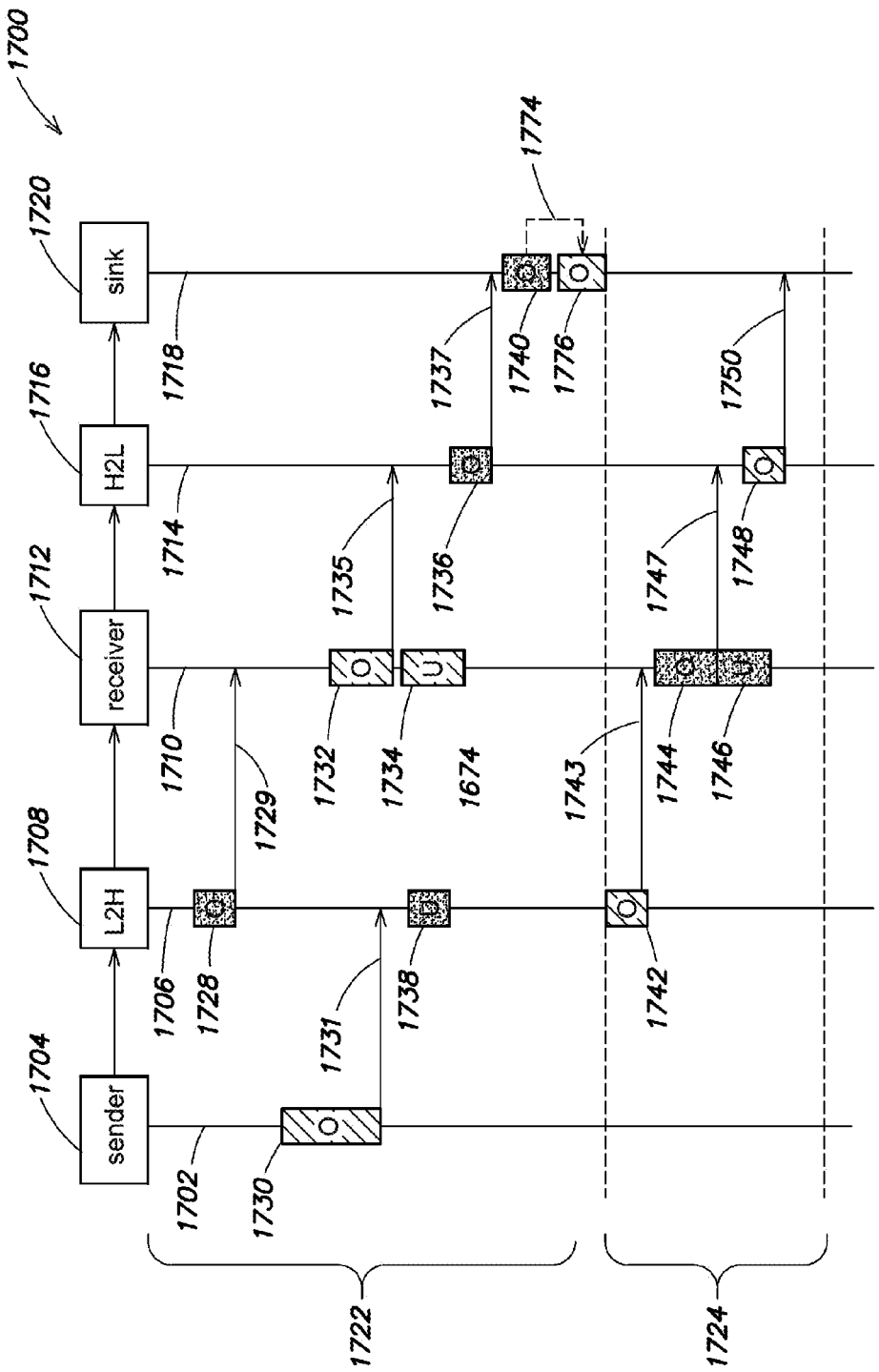
FIG. 17 is a highly schematic illustration of a message sequence diagram in accordance with an embodiment of the invention.

FIG. 17 is a schematic illustration of a message sequence diagram 1700 automatically generated by the diagramming tool 120 and presented to a user, e.g., on a display. Like the message sequence diagram 1600 (FIG. 16), the message sequence diagram 1700 may include a first lifeline 1702 and a first header 1704 for the model's sender block, a second lifeline 1706 and a second header 1708 for the first rate transition (L2H) block, a third lifeline 1710 and a third header 1712 for the receiver block, a fourth lifeline 1714 and a fourth header 1716 for the second rate transition (H2L) block, and a fifth lifeline 1718 and a fifth header 1720 for the sink block. Again, arrows between the headers 1704, 1708, 1712, 1716, and 1720 may indicate the relationship among the corresponding blocks in the model. The message sequence diagram 1700 further includes a first epoch 1722 and a second epoch 1724. Within the first epoch 1722, the first rate transition block executes its output method, as indicated by the bar element 1728, and execution of the first rate transition block's output method involves sending a message, as indicated by arrow 1729, from the first rate transition block to the receiver block. The sender block executes its output method starting at the same time as the bar element 1728, although completing after the bar element 1728, as indicated by the bar element 1730, and execution of the sender block's output method involves sending a message, as indicated by arrow 1731, from the sender block to the first rate transition block. The receiver block then executes its output and update methods as indicated by bar elements 1732 and 1734. Execution of the receiver block's output method involves sending a message, as indicated by arrow 1735, from the receiver block to the second rate transition block. The second rate transition block executes its output method as indicated by the bar element 1736, which involves sending a message, as indicated by arrow 1737, from the second rate transition block to the sink block. The first rate transition block executes its update method, as indicated by bar element 1738, and the sink block executes its output method, as indicated by the bar element 1740.

During the second epoch 1724, the first rate transition block executes its output method as indicated by bar element 1742, which involves sending a message, as indicated by arrow 1743, from the first rate transition block to the receiver block. The output and update methods of the receiver block then execute as indicted by the bar elements 1744 and 1746, and execution of the receiver block's output method involves sending a message, as indicated by arrow 1747, to the second rate transition block. Execution of the receiver block's output method occurs during the execution of the second rate transition block's output method, as indicated by the bar element 1748, and execution of the second rate transition block's output method involves sending a message, as indicated by the arrow 1750, to the sink block.

The user interface 128 may be configured to use one or more graphical affordances in the message sequence diagram 1700 to indicate which processing core executes the respective method. In an embodiment, the graphical affordance may be a fill effect on the bar elements. For example, a first fill effect, such as a shaded fill, may represent a first processing core, while a second fill effect, such as be dashed lines, may represent a second processing core.

In the first epoch 1722, the output method of the sender block, and the output and update methods of the receiver block are executed on a first processing core as indicated by the dashed fill pattern in bar elements 1730, 1732, and 1734. The output and update methods of the first rate transition block, the output method of the second rate transition block, and the output method of the sink block are executed on a second processing core as indicated by the solid fill pattern in bar elements 1728, 1738, 1736, and 1740. In the second epoch 1724 the output methods of the first and second rate transition blocks are executed on the first processing core as indicated by the dashed fill pattern of bar elements 1742 and 1748. The output and update methods of the receiver block are executed on the second processing core as indicated by the solid fill pattern of bar elements 1744 and 1746.

In an embodiment, the message sequence diagram 1700 may be user-editable. Suppose, for example, that upon reviewing the message sequence diagram 1700, the user would like to change the processing core one which one or more of the methods executes. The user may select the one or more methods and change its graphical affordance, e.g., the fill pattern of its respective bar element, to the graphical affordance corresponding to the desired processing core. One or more edit or other GUI-based operations may be used to change the graphical affordance. For example, suppose that the user decides that the output method of the sink block during the first epoch 1722, as indicated by the bar element 1740, should be executed on the first processing core, rather than on the second processing core as determined by the simulation engine 106, and as reflected in the message sequence diagram 1700. The user may manipulate the message sequence diagram 1700 to alter the graphical affordance associated with the bar element 1740. For example, the user may change the fill pattern for the bar element 1740 from a solid fill pattern to a dashed fill pattern as indicated by dashed arrow 1774 and dashed bar element 1776.

In an embodiment, the model execution analyzer 122 may be configured to perform a check to determine whether all methods that are assigned to a given core are mutually exclusive in that the user is not attempting to assign two methods that execute at the same time to the same core. If the model execution analyzer 122 detects such a condition, it may be reported to the user, e.g., by the user interface engine 128, and an error may occur. Alternatively, the user assignment may be changed to an assignment in which all methods executing on one core are mutually exclusive in their execution time. In an embodiment, the model execution analyzer 122 may be configured to use the dependency graph created by the IR builder 114 to search for and find an order of execution that would be mutually exclusive based on the user assignment, but where the order of the methods executing may change from the original message sequence diagram. The user interface engine 128 may be configured to detect such edits to the message sequence diagram 1700. The diagramming tool 120 may be configured to instruct the simulation engine 106 to modify the model's execution schedule to reflect the new assignment of block methods to processing cores as presented on the revised version of the message sequence diagram 1700.

In an embodiment, one or more task-centric message sequence diagrams may be edited, e.g., by a user, to alter the execution schedule of the model. Referring to the message sequence diagram 800 (FIG. 8), the sender and receiver and blocks 408, 410 execute during the third epoch 506, as indicated by the fifth and sixth task activation bars 824, 826. Execution of the receiver block 410 includes generation of a message, as indicated by a fourth arrow 828 with a data box 828*a* indicating that the message carries a value of '−1', because the receiver block has not received a new value from the sender block since the second epoch 504. Suppose the user would like to have the receiver block issue an updated value during the third epoch 506. In this case, the user may select the sixth task activation bar 826 for the sender block and drag it into the second epoch 504, and the message represented by the arrow 830 with the new value, '1' would be received by the receiver block in the third epoch 506. As a result, the receiver block would send a message with a value of '1' during the third epoch 506, instead of a value of '−1'. The diagramming tool 120 may notify the simulation engine 106 of the change made to the message sequence diagram 800, and the simulation engine 106 may modify the model's execution schedule to conform to the revised message sequence diagram. For example the simulation engine 106 may change the rate of execution of the task executing the sender block, 'Task_e2'. Alternatively, the simulation engine 106 may change the event offset, e.g., the offset for event e2 which triggers task 'Task_e2', or task priority to achieve the desired effect of the revised message sequence diagram.

Figure 19:
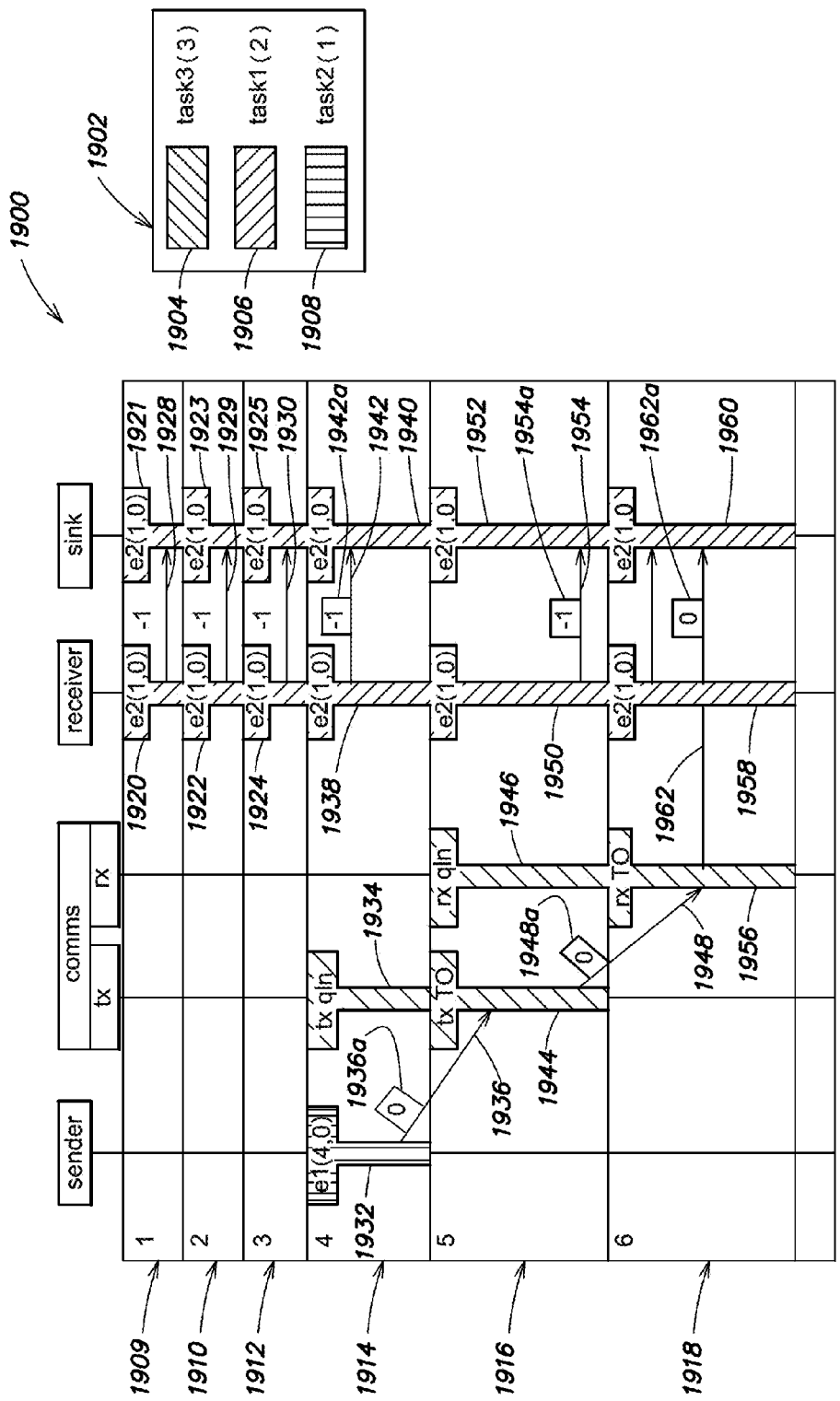
FIG. 19 is a highly schematic illustration of a message sequence diagram in accordance with an embodiment of the invention.

FIG. 19 is a schematic illustration of a message sequence diagram 1900 that may be created by the diagramming tool 120 to illustrate the interaction among the previously described sender, receiver, and sink blocks 302, 304, 306, as wells as communications (comms) functions for the sender and receiver blocks, including a transmit (tx) function of the sender block and a receive (rx) function of the receiver block. The diagram 1900 may also illustrate the different tasks that are executing those blocks and functions. The message sequence diagram 1900 may include a legend block 1902 that indicates the fill pattern or color used to illustrate the different tasks. The legend block 1902 may include a first entry 1904 that indicates that the 'Task3' task is represented with a forward hash pattern; a second entry 1906 that indicates that the 'Task1' task is represented with a backward hash pattern; and a third entry 1908 that indicates that the 'Task2' task is represented with a vertical hash pattern.

The message sequence diagram 1900 may extend across a plurality, e.g., six, epochs 1909, 1910, 1912, 1914, 1916, and 1918. During each of the first to third epochs 1909-1912, the receiver and sink blocks execute as indicated by respective bar elements 1920-1925. Execution of the receiver block 304 includes the generation of a message that is received by the sink block 306, as indicated by arrows 1928-1930 having respective data boxes. As indicated by the values in the data boxes, the receiver block sends a value of −1.

During the fourth epoch 1914, the sender block and its transmit function execute as indicated by bar elements 1932 and 1934. Execution of the sender block 302 includes the generation of a message received by the sender's transmit block during the fifth epoch 1916, as indicated by arrow 1936 with a data value of 0 as indicated by data box 1936a. The receiver and sink blocks also execute, as indicated by bar elements 1938 and 1940, and the receiver block transmits a message with a value of −1 to the sink block as indicated by arrow 1942 with data box 1942a. During the fifth epoch 1916, the transmit function of the sender block and the receive function of the receive block execute, as indicated by bar elements 1944 and 1946. The transmit functions sends a message that is received by the receive function of the receiver block, as indicated by arrow 1948 with data box 1948a. The message is received by the receive function during the six epoch 1918. The receiver and sink blocks also execute, as indicated by bar elements 1950 and 1952 and arrow 1954 with data box 1954a. As the message from the sender block is not received by the receiver block until the sixth epoch 1918, however, as indicated by arrow 1948, during the fifth epoch 1916, the receiver block sends a value of −1 to the sink block as indicated by arrow 1954 and data box 1954a.

During the sixth epoch 1918, the receiver's block receive function executes as indicated by bar element 1956. The receiver and sink blocks also execute as indicated by bar elements 1958 and 1960. Execution of the receiver block includes sending a message to the sink block with a value of 0, as indicated by arrow 1962 and data box 1962a.

A user, upon evaluating the automatically generated, dynamic message sequence diagram 1900 may realize that the message sent by sender block including its transmit function, although begun during the fourth epoch 1914, does not reach the receiver block until the sixth epoch 1918, as indicated by arrows 1936 and 1948. Accordingly, during the fourth epoch 1914, the receiver block sends a value of −1 to the sink block as indicated by the arrow 1942. The user may have intended that the value of 0 be sent to the sink block during the fourth epoch 1914.

In an embodiment, the user may interact with the message sequence diagram 1900 to alter the execution of the model and achieve the desired operation, i.e., the transmission of the value 0 from the receiver block to the sink block during the fourth epoch 1914. The user may interact with the message sequence diagram 1900 to advance the execution of the sender block and its transmit function to an earlier epoch to achieve the desired operation.

Figure 20:
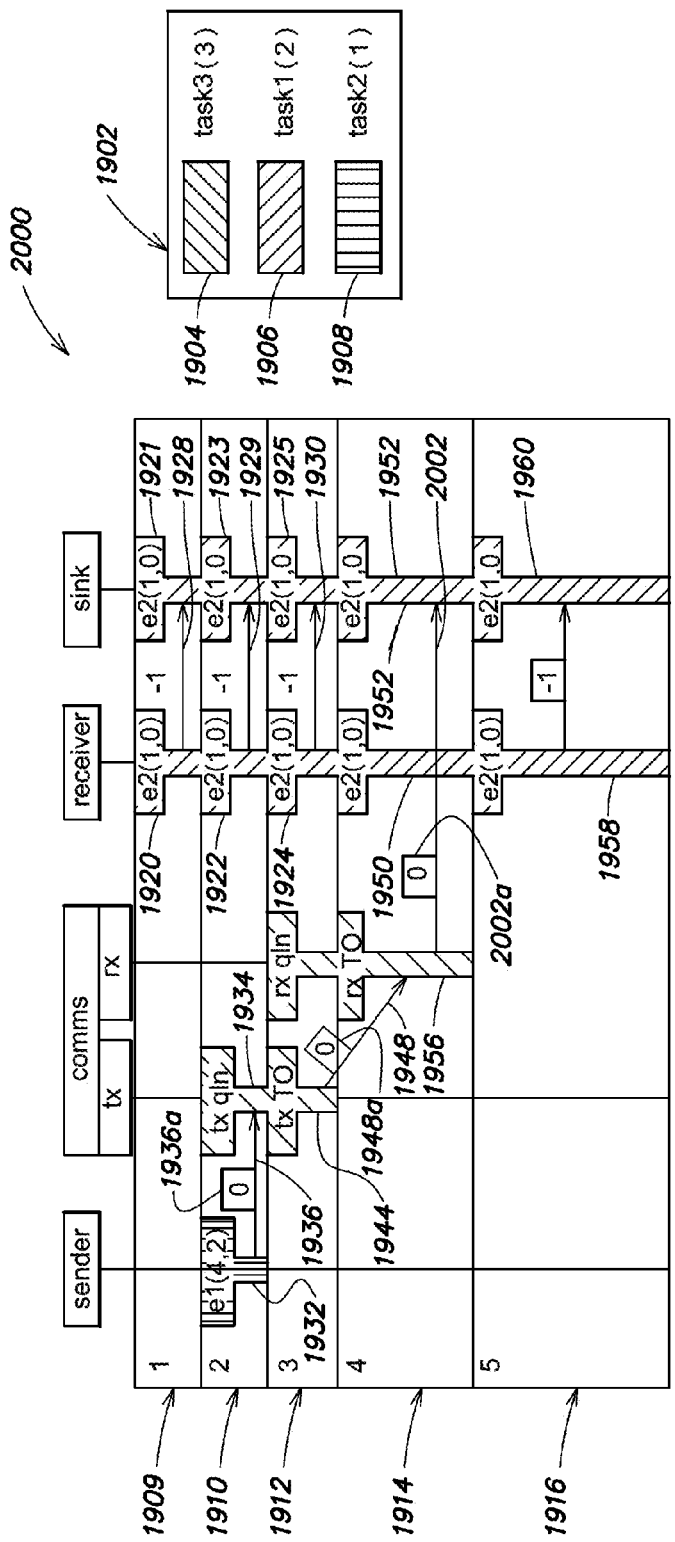
FIG. 20 is a highly schematic illustration of the message sequence diagram of FIG. 19 following user interaction in accordance with an embodiment of the invention.

FIG. 20 is a schematic illustration of a message sequence diagram 2000 following the user's interaction with the message sequence diagram 1900 of FIG. 19. The user may move the bar element 1932 representing 'task2' from the fourth epoch 1914 to the second epoch 1910. For example, the user may select and slide or drag the bar element 1932 along the lifeline for the sender block to the desired epoch, i.e., the second epoch 1910.

As a result of this user-initiated change to the message sequence diagram 1900, the simulation engine 106 may determine a new execution schedule for the model. The diagramming tool 120 may present this new execution schedule in the message sequence diagram 2000. Specifically, with the 'task2' that executes the sender block modified to begin execution during the second epoch 1910, the sender block's transmit function begins execution during the second epoch 1910, and the receiver block's receive function begins its execution during the third epoch 1912. As a result, the receiver block receives a message with a value of 0 during the fourth epoch 1914, rather than during the sixth epoch 1918 as indicated in FIG. 19. Additionally, the receiver block sends a message with a value of 0 to the sink block during the fourth epoch 1914, as indicated by arrow 2002 and data box 2002a. As noted, this is the behavior that the user desired for the model.

Illustration of Logical and/or Physical Time

In an embodiment, the diagramming tool 120 may be configured to include one or more graphical affordances on a message sequence diagram to indicate logical and/or physical execution time.

Figure 18:
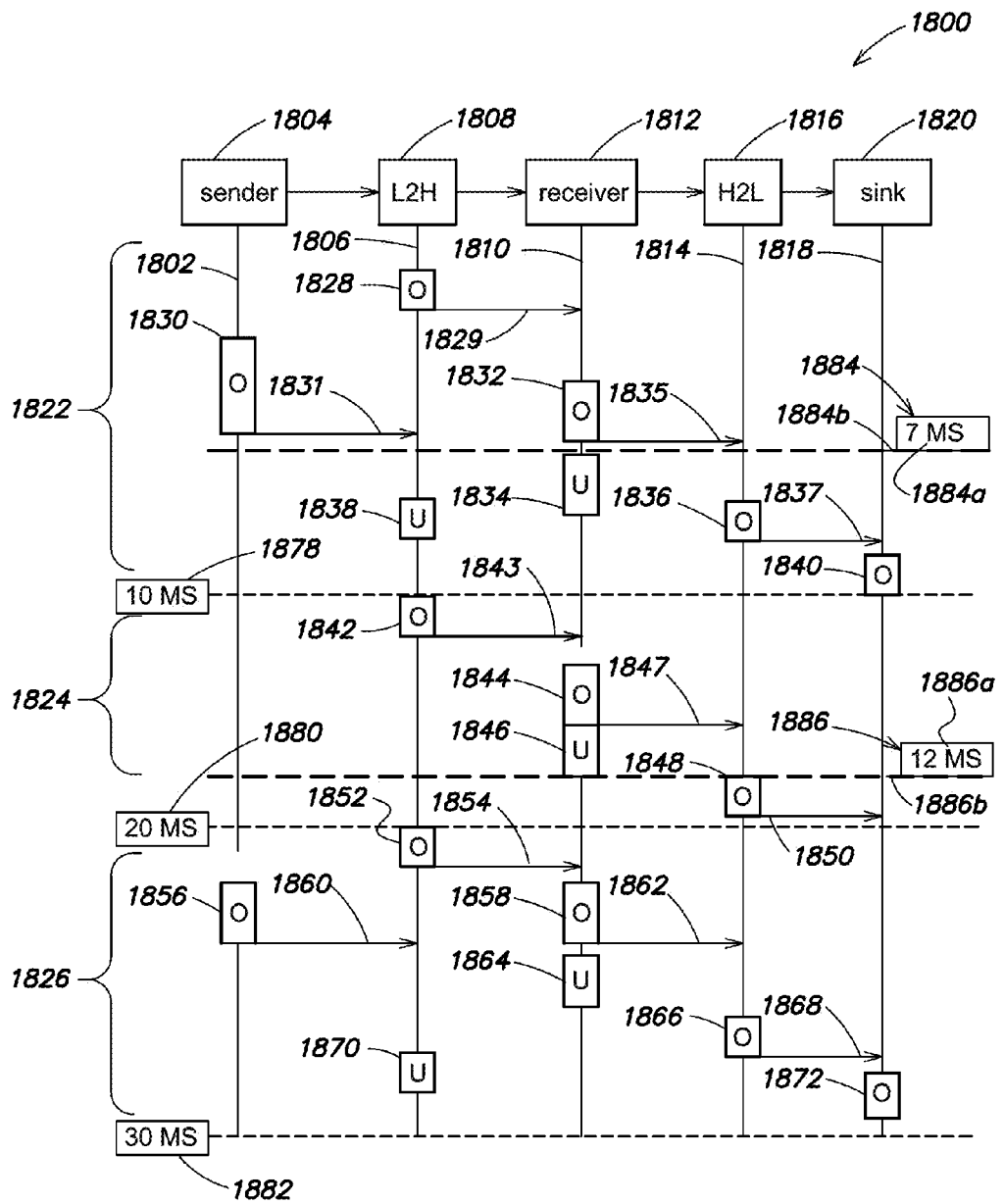
FIG. 18 is a highly schematic illustration of a message sequence diagram in accordance with an embodiment of the invention.

FIG. 18 is a schematic illustration of a message sequence diagram 1800 automatically generated by the diagramming tool 120 and presented to a user, e.g., on a display. Like the message sequence diagrams 1600 and 1700 (FIGS. 16 and 17), the message sequence diagram 1800 may include a first lifeline 1802 and a first header 1804 for the model's sender block, a second lifeline 1806 and a second header 1808 for the first rate transition (L2H) block, a third lifeline 1810 and a third header 1812 for the receiver block, a fourth lifeline 1814 and a fourth header 1816 for the second rate transition (H2L) block, and a fifth lifeline 1818 and a fifth header 1820 for the sink block. Again, arrows between the headers 1804, 1808, 1812, 1816, and 1820 may indicate the relationship among the corresponding blocks in the model. The message sequence diagram 1800 further includes a first epoch 1822, a second epoch 1824, and a third epoch 1826. Within the first epoch 1822, the first rate transition block executes its output method, as indicated by the bar element 1828, and execution of the first rate transition block's output method involves sending a message, as indicated by arrow 1829, from the first rate transition block to the receiver block. The sender block then executes its output method, as indicated by the bar element 1830, and execution of the sender block's output method involves sending a message, as indicated by arrow 1831, from the sender block to the first rate transition block. The receiver block executes its output and update methods, as indicated by bar elements 1832 and 1834. Execution of the receiver block's output method starts during execution of the sender block's output method. Execution of the receiver block's output method involves sending a message, as indicated by arrow 1835, from the receiver block to the second rate transition block. The second rate transition block executes its output method as indicated by the bar element 1836, which involves sending a message, as indicated by arrow 1837, from the second rate transition block to the sink block. This is followed by the execution of the first rate transition block's update method as indicated by bar element 1838. Finally, the sink block executes its output method as indicated by the bar element 1840.

During the second epoch 1824, the first rate transition block executes its output method as indicated by bar element 1842, which involves sending a message, as indicated by arrow 1843, from the first rate transition block to the receiver block. The output and update methods of the receiver block then execute as indicted by the bar elements 1844 and 1846, and execution of the receiver block's output method involves sending a message, as indicated by arrow 1847, to the second rate transition block. Execution of the receiver block's output and update methods is followed by the execution of the second rate transition block's output method as indicated by the bar element 1848, and execution of the second rate transition block's output method involves sending a message, as indicated by the arrow 1850, to the sink block.

During the third epoch 1826, the first rate transition block executes its output method as indicated by bar element 1852, which involves sending a message, as indicated by arrow 1854. The output methods of the sender and receiver blocks then execute as indicated by bar elements 1856 and 1858, which involve sending messages, as indicated by arrows 1860 and 1862. The update of the receiver block then executes as indicated by bar element 1864. Next, the output method of the second rate transition block executes as indicated by bar element 1866, which involves sending a message, as indicated by arrow 1868. Then, the update and output methods of the first rate transition block and the sink block execute as indicated by bar elements 1870 and 1872.

The diagramming tool 120 may be configured to determine when epochs occur in terms of logical execution time, and to present this information in a message sequence diagram. In an embodiment, the diagramming tool 120 may include a logical execution time element for each epoch, for example at the end of each epoch and/or at the boundary between adjacent epochs. The logical execution time elements may be configured with the logical execution time, e.g., in milliseconds (ms), for the respective epoch. The logical execution time elements may be located at the graphical affordances that separate adjacent epochs, e.g., the horizontally arranged dashed lines. With reference to FIG. 18, a first logical execution time element 1878 indicates that the first epoch 1822 ends after 10 ms logical execution time. A second logical execution time element 1880 indicates that the second epoch 1824 ends after 20 ms logical execution time, and a third logical execution time element 1882 indicates that the third epoch 1826 ends after 30 ms logical execution time. That is, each epoch 1822, 1824, and 1826 takes 10 ms to complete.

By examining the bar elements within the epochs 1822, 1824, and 1826, a user may better understand how often or frequent different blocks execute. In particular, the receiver's output and update methods run every epoch 1822, 1824, and 1826, while the sender's and sink's methods run every other epoch, e.g., the first and third epochs 1822 and 1826. Accordingly, the message sequence diagram 1800 shows that the sender and receiver blocks execute every 20 ms, while the receive block executes every 10 ms.

In addition (or alternatively) to providing an indication of logical execution time, the diagramming tool 120 may be configured to determine when blocks and/or methods execute in terms of physical time, and present this information in a message sequence diagram. For example, the modeling environment 100 may include a hardware simulation tool that may simulate execution of a model on target hardware. The hardware simulation tool may, as part of the simulation process, determine the time it takes to execute the model on the target hardware. The diagramming tool 120 may obtain this information and include it on a message sequence diagram.

With reference to FIG. 18, the user interface engine 128 may add one or more graphical affordances to the message sequence diagram 1800 that represent the passage of physical execution time for the model. Specifically, the user interface engine 128 may include one or more physical time markers, such as first and second markers 1884 and 1886, placed on the message sequence diagram 1800 in locations that correspond to the respective physical execution times. Each marker 1884 and 1886 may include a timestamp box 1884a and 1886b and a line element 1884b and 1886b. Presented in the timestamp boxes 1884a and 1886a may be a numeric value of the respective physical execution time, e.g., 7 ms and 12 ms. The line elements 1884b and 1886b may extend horizontally across the message sequence diagram 1800 to help the user visually align the occurrence of block and/or method executions with respect to physical execution time. As illustrated, after 7 ms of physical execution time, about half of the methods of the first epoch 1822 are run. After 12 ms of physical execution time, the second epoch 1824 is nearly complete. In an embodiment, the markers 1884b and 1886b may be interactive such that a user may slide the markers 1884b and 1886b up and down along the diagram 1800, and the corresponding physical execution time may be shown.

Illustrative Data Processing System

Figure 15:
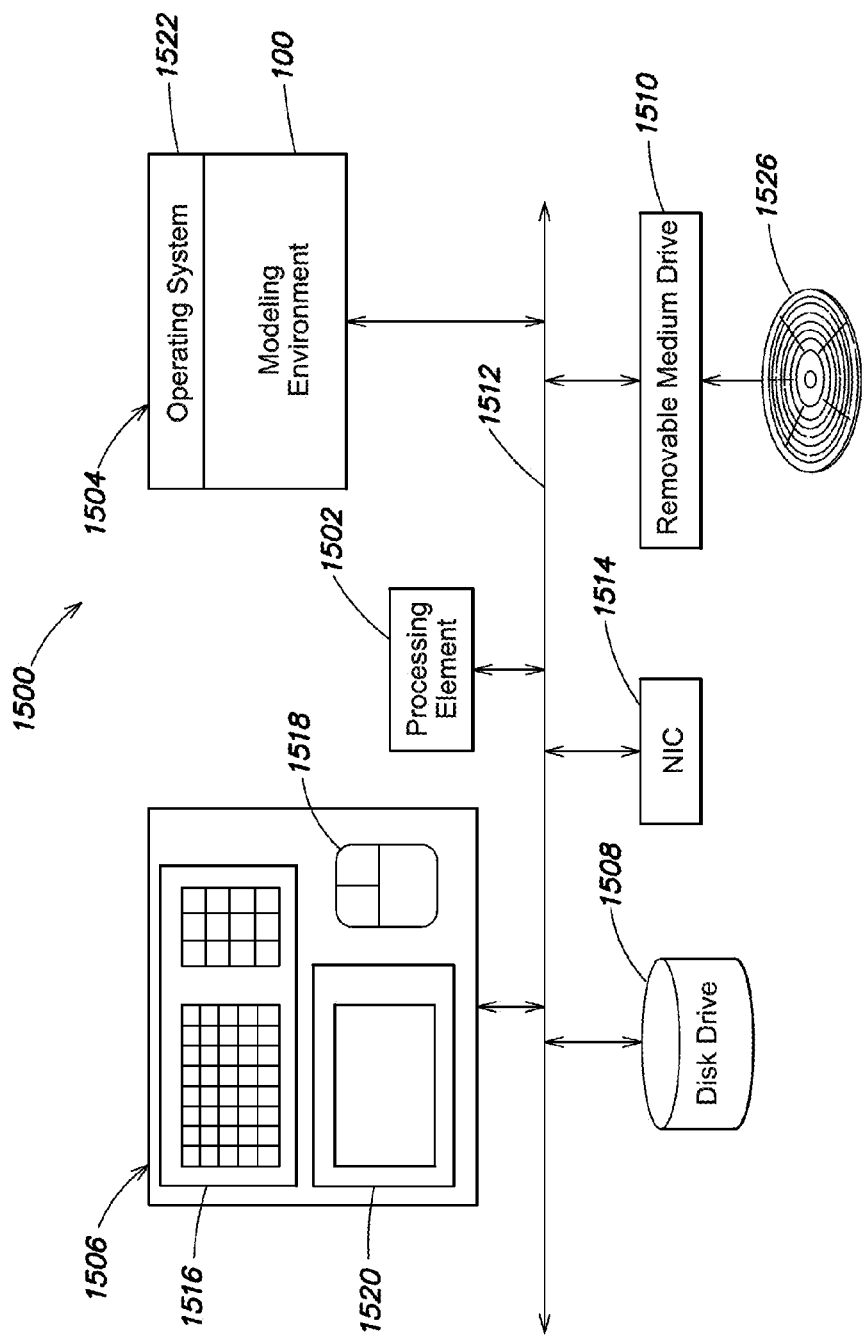
FIG. 15 is a schematic illustration of a data processing system in accordance with an embodiment of the invention.

FIG. 15 is a schematic illustration of a computer or data processing system 1500 for implementing an embodiment of the invention. The computer system 1500 may include one or more processing elements, such as a processing element 1502, a main memory 1504, user input/output (I/O) 1506, a persistent data storage unit, such as a disk drive 1508, and a removable medium drive 1510 that are interconnected by a system bus 1512. The computer system 1500 may also include a communication unit, such as a network interface card (NIC) 1514. The user I/O 1506 may include a keyboard 1516, a pointing device, such as a mouse 1518, and a display 1520. Other user I/O 1506 components include voice or speech command systems, other pointing devices include touchpads and touchscreens, and other output devices besides a display, include a printer, a projector, a touchscreen, etc. Exemplary processing elements include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 1504, which may be a Random Access Memory (RAM), may store a plurality of program libraries or modules, such as an operating system 1522, and one or more application programs that interface to the operating system 1522, such as the modeling environment 100.

The removable medium drive 1510 may accept and read a computer readable medium 1526, such as a CD, DVD, floppy disk, solid state drive, tape, flash memory or other non-transitory medium. The removable medium drive 1510 may also write to the computer readable medium 1526.

Suitable computer systems include personal computers (PCs), workstations, servers, laptops, tablets, palm computers, smart phones, electronic readers, and other portable computing devices, etc. Nonetheless, those skilled in the art will understand that the computer system 1500 of FIG. 15 is intended for illustrative purposes only, and that the present invention may be used with other computer systems, data processing systems, or computational devices. The present invention may also be used in a networked, e.g., client-server, computer architecture, or a public and/or private cloud computing arrangement. For example, the modeling environment application 102 may be hosted on a server, and accessed by a remote client through an application hosting system, such as the Remote Desktop Connection tool from Microsoft Corp.

Suitable operating systems 1522 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 1522 may provide services or functions for other modules, such as allocating memory, organizing data according to a file system, prioritizing requests, etc. The operating system 1522 may run on a virtual machine, which may be provided by the data processing system 1500.

As indicated above, a user or developer, such as an engineer, scientist, programmer, etc., may utilize one or more input devices, such as the keyboard 1516, the mouse 1518, and the display 1520 to operate the modeling environment 200, and construct one or more graphical skeleton components and/or one or more models that include one or more graphical skeleton components. As discussed, the graphical models may be computational and may have executable semantics. In particular, the models may be executable. In particular, the model may provide one or more of time-based, event-based, state-based, frequency-based, control-flow based, and dataflow-based execution semantics. The execution of a model may simulate operation of the system that is being designed or evaluated. The term graphical model, moreover, is intended to include graphical program.

The foregoing description of embodiments is intended to provide illustration and description, but is not intended to be exhaustive or to limit the invention to the precise form disclosed. Modifications and variations are possible in light of the above teachings or may be acquired from practice of the invention. For example, while a series of acts has been described above with respect to FIG. 2, the order of the acts may be modified in other implementations. Further, non-dependent acts may be performed in parallel.

In addition, while particular examples of graphical affordances have been described and shown, it should be understood that other graphical affordances may be used. For example, other connectors, such as lines, boxes, bars, etc., may be used instead of or in addition to the arrows. Similarly, other icons or widgets may be used. In addition, various combinations of features may be combined in one or more of the message sequence diagrams of the invention.

Also, the term "user", as used herein, is intended to be broadly interpreted to include, for example, a computing device (e.g., a workstation) or a user of a computing device, unless otherwise stated.

It will be apparent that one or more embodiments, described herein, may be implemented in many different forms of software and hardware. Software code and/or specialized hardware used to implement embodiments described herein is not limiting of the invention. Thus, the operation and behavior of embodiments were described without reference to the specific software code and/or specialized hardware—it being understood that one would be able to design software and/or hardware to implement the embodiments based on the description herein.

Further, certain embodiments of the invention may be implemented as "logic" that performs one or more functions. This logic may be hardware-based, software-based, or a combination of hardware-based and software-based. The logic may be stored in one or more tangible computer-readable storage media and may include computer-executable instructions that may be executed by processing logic, such as processing logic 120. The computer-executable instructions may include instructions that implement one or more embodiments of the invention. The tangible computer-readable storage media may be volatile or non-volatile and may include, for example, flash memories, dynamic memories, removable disks, and non-removable disks.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A method comprising:
   storing in a memory an executable model having first and second message-based blocks, the model configured to execute over a simulation time having a plurality of simulation time steps, the first and second message-based blocks configured to send and receive messages that
      persist for determined time intervals during the simulation time, and
      have payloads that remain fixed for a given send-receive interaction;
   analyzing, by a processor coupled to the memory, execution instructions generated for the model to determine one or more of the plurality of simulation time steps when at least one of the messages occurs;
   automatically generating a message sequence diagram for the model, the message sequence diagram having:
      regions that represent respective ones of the plurality of simulation time steps of the simulation time of the model,
      first and second lifelines extending across the regions, the first and second lifelines representing the first and second message-based blocks of the model, and
      a first graphical affordance representing the at least one message, the first graphical affordance
         identifying the first and second lifelines, and
         located in one or more of the regions, where the one or more of the regions in which the first graphical affordance is located correspond to the one or more of the plurality of simulation time steps of the model when the at least one messages occurs; and
   providing, by the processor, the message sequence diagram to an output device coupled to the processor.

2. The method of claim 1 wherein
   the regions are arranged in a first orientation on the message sequence diagram, and
   the first and second lifelines are arranged in a second orientation that is perpendicular to the first orientation.

3. The method of claim 2 wherein
the regions are arranged horizontally on the message sequence diagram, and the first and second lifelines are oriented vertically on the message sequence diagram.

4. The method of claim 1 further comprising:
receiving a selection to include the first and second lifelines for the first and second message-based blocks in the message sequence diagram.

5. The method of claim 4 wherein the selection is from a user.

6. The method of claim 1 wherein
the model further includes a signal defining a time varying quantity having one or more values that exist for at least a portion of the simulation time,
the message sequence diagram further includes a signal trace element, the signal trace element
extending across the regions,
including a trace representing the one or more values of the signal.

7. The method of claim 6 wherein
the model includes a time-based block configured to generate the signal.

8. The method of claim 1 wherein the message sequence diagram further includes:
a single repeating pattern that represents a message exchange that occurs repeatedly without interruption over a group of simulation time steps.

9. The method of claim 1 further comprising:
specifying an execution task to execute the first message-based block during execution of the model, the task executing during at least one simulation time step,
where the message sequence diagram further includes a task activation element at the first lifeline, the task activation element extending through the region that corresponds to the at least one simulation time step during which the task executes the first message-based block.

10. The method of claim 9 wherein the task activation element includes a header that includes an indication of a name of the execution task, and an execution bar configured to indicate a duration of the execution task.

11. An apparatus comprising:
a memory storing an executable model having message-based blocks, the model configured to execute over a simulation time having a plurality of time steps, the message-based blocks configured to send and receive messages that
persist for determined time intervals during the simulation time, and
have payloads that remain fixed for a given send-receive interaction; and
a processor coupled to the memory, the processor configured to analyze the model to determine one or more of the plurality of time steps when at least a portion of the messages occurs;
automatically generate a message sequence diagram for the model, the message sequence diagram having:
time step regions that represent respective ones of the time steps of the simulation time of the model,
first and second lifelines extending across the time step regions, the first lifeline representing a first message-based block of the model that sends a particular message, and the second lifeline representing a second message-based block of the model that receives the particular message, the particular message persisting for one or more time steps of the model, and
an icon representing the particular message, the icon linking the first lifeline and the second lifeline, and located in one or more of the time step regions, where the one or more of the time step regions in which the icon is located correspond to the one or more time steps during which the particular message persists,
receive a change to the message sequence diagram, and
modify an execution schedule of the model so that model execution conforms to the change to the message sequence diagram.

12. The apparatus of claim 11 wherein the change includes moving the icon in the message sequence diagram.

13. The apparatus of claim 11 wherein the change is user initiated.

14. A non-transitory computer-readable medium comprising a plurality of instructions stored thereon which, when executed by a processor, cause the processor to:
store in a memory an executable model having message-based blocks, the model configured to execute over a simulation time having a plurality of time steps, the message-based blocks configured to send and receive messages that
persist for determined time intervals during execution of the model, and
have payloads that remain fixed for a given send-receive interaction;
analyze, by the processor coupled to the memory, the model to identify a send queue allocated to store a given message to be sent, a receive queue allocated to receive the given message, and
one or more of the plurality of time steps when the given message is sent and received;
automatically generate a message sequence diagram for the model, the message sequence diagram having:
time step regions that represent respective ones of the time steps of the simulation time of the model,
first and second queue lifelines extending across the time step regions, the first and second queue lifelines representing the send and receive queues, and
a connector representing the given message, the connector extending from the first queue lifeline to the second queue lifeline, and
located in one or more time step regions, where the one or more time step regions in which the connector is located correspond to the one or more of the plurality of time steps when the given message is sent and received; and
provide, by the processor, the message sequence diagram to an output device coupled to the processor.

15. The non-transitory computer-readable medium of claim 14 wherein
a plurality of the messages are sent from the send queue to the receive queue, the instructions further comprising instructions that cause the processor to:
include a queue depth element at the second queue lifeline, the queue depth element providing a visual indication of a number of messages in the receive queue.

16. The non-transitory computer-readable medium of claim 15 wherein the queue depth element has a size, the instructions further comprising instructions that cause the processor to:
increase the size of the queue depth element in response to a message being added to the receive queue; and
decrease the size of the queue depth element in response to the message being removed from the receive queue.

17. The non-transitory computer-readable medium of claim 16 wherein the size corresponds to a width of the queue depth element.

18. A method comprising:
  storing in a memory an executable block diagram having first and second message-based blocks, the executable block diagram configured to execute over an execution time having a plurality of execution time steps, the first message-based block configured to send a plurality of messages and the second message-based block configured to receive the plurality of messages, where the plurality of messages
    persist for determined time intervals during the execution time, and
    have payloads that remain fixed for a given send-receive interaction;
  analyzing, by a processor coupled to the memory, execution instructions generated for the block diagram to determine one or more of the plurality of execution time steps when the plurality of messages are sent and received;
  automatically generating a message sequence diagram for the block diagram, the message sequence diagram having:
    regions that represent respective ones of the plurality of execution time steps of the execution time of the block diagram,
    first and second lifelines representing the first and second message-based blocks, and
    at least one symbol for a given message of the plurality of messages; and
  providing, by the processor, the message sequence diagram to an output device coupled to the processor, wherein
    for the given message, the at least one symbol is arranged on the message sequence diagram so as to indicate a first point in the execution time when the given message was sent by the first message-based block and a second point in the execution time when the given message was received by the second message-based block.

19. The method of claim 18 where the execution time is either a logical execution time or a physical execution time.

20. The method of claim 18 where the at least one symbol is an arrow.

21. A method comprising:
  accessing from a memory an executable model having message-based blocks, the model configured to execute over a simulation time having a plurality of time steps, the message-based blocks configured to send and receive messages that
    persist for determined time intervals during the simulation time, and
    have payloads that remain fixed for a given send-receive interaction;
  analyzing, by a processor coupled to the memory, the model to determine one or more of the plurality of time steps when at least a portion of the messages occurs;
  generating, by the processor, a message sequence diagram for the model, the message sequence diagram having:
    time step regions that represent respective ones of the time steps of the simulation time of the model,
    first and second lifelines extending across the time step regions, the first lifeline representing a first message-based block of the model that sends a particular message, and the second lifeline representing a second message-based block of the model that receives the particular message, the particular message persisting for one or more time steps of the model, and
    an icon representing the particular message, the icon linking the first lifeline and the second lifeline, and located in one or more of the time step regions, where the one or more of the time step regions in which the icon is located correspond to the one or more of the plurality of time steps during which the particular message persists,
  receiving a change to the message sequence diagram, and modifying an execution schedule of the model so that model execution conforms to the change to the message sequence diagram.

22. The method of claim 21 wherein the change includes moving the icon in the message sequence diagram.

23. The method of claim 21 wherein the change is user initiated.

24. A non-transitory computer readable medium comprising a plurality of instructions stored thereon which, when executed by a processor, cause the processor to:
  access, from a memory, an executable block diagram having first and second message-based blocks, the executable block diagram configured to execute over an execution time having a plurality of execution time steps, the first message-based block configured to send a plurality of messages and the second message-based block configured to receive the plurality of messages, where the plurality of messages persist for determined time intervals during the execution time, and
    have payloads that remain fixed for a given send-receive interaction;
  analyze execution instructions generated for the block diagram to determine one or more of the plurality of execution time steps when the plurality of messages are sent and received;
  automatically generate a message sequence diagram for the block diagram, the message sequence diagram having:
    regions that represent respective ones of the plurality of execution time steps of the execution time of the block diagram,
    first and second lifelines representing the first and second message-based blocks, and
    at least one symbol for a given message of the plurality of messages; and
  provide, to an output device, the message sequence diagram, wherein for the given message, the at least one symbol is arranged on the message sequence diagram so as to indicate a first point in the execution time when the given message was sent by the first message-based block and a second point in the execution time when the given message was received by the second message-based block.

25. The non-transitory computer-readable medium of claim 24 where the execution time is either a logical execution time or a physical execution time.

26. The non-transitory computer-readable medium of claim 24 where the at least one symbol is an arrow.

27. A method comprising:
  accessing from a memory an executable model having message-based blocks, the model configured to execute over a simulation time having a plurality of time steps, the message-based blocks configured to send and receive messages that
    persist for determined time intervals during execution of the model, and have payloads that remain fixed for a given send-receive interaction;

analyzing, by a processor coupled to the memory, the model to identify a send queue allocated to store a given message to be sent, a receive queue allocated to receive the given message, and
one or more of the plurality of time steps when the given message is sent and received;
automatically generating, by the processor, a message sequence diagram for the model, the message sequence diagram having:
time step regions that represent respective ones of the time steps of the simulation time of the model,
first and second queue lifelines extending across the time step regions, the first and second queue lifelines representing the send and receive queues, and
a connector representing the given message, the connector extending from the first queue lifeline to the second queue lifeline, and
located in one or more time step regions, where the one or more time step regions in which the connector is located correspond to the one or more of the plurality of time steps when the given message is sent and received; and
providing, by the processor, the message sequence diagram to an output device coupled to the processor.

28. The method of claim 27 wherein
a plurality of the messages are sent from the send queue to the receive queue, the method further comprising:
including a queue depth element at the second queue lifeline, the queue depth element providing a visual indication of a number of messages in the receive queue.

29. The method of claim 28 wherein the queue depth element has a size, the method further comprising:
increasing the size of the queue depth element in response to a message being added to the receive queue; and
decreasing the size of the queue depth element in response to the message being removed from the receive queue.

30. The method of claim 29 wherein the size corresponds to a width of the queue depth element.

* * * * *